US012807867B2

(12) United States Patent
Fukagawa et al.

(10) Patent No.: US 12,807,867 B2
(45) **Date of Patent: *Nov. 24, 2026**

(54) ORGANIC THIN FILM, METHOD FOR PRODUCING ORGANIC THIN FILM, ORGANIC ELECTROLUMINESCENT ELEMENT, DISPLAY DEVICE, LIGHTING DEVICE, ORGANIC THIN FILM SOLAR CELL, THIN FILM TRANSISTOR, PHOTOELECTRIC CONVERSION ELEMENT, COATING COMPOSITION AND MATERIAL FOR ORGANIC ELECTROLUMINESCENT ELEMENTS

(71) Applicants: NIPPON HOSO KYOKAI, Tokyo (JP); NIPPON SHOKUBAI CO., LTD., Osaka (JP)

(72) Inventors: Hirohiko Fukagawa, Tokyo (JP); Takahisa Shimizu, Tokyo (JP); Tsubasa Sasaki, Tokyo (JP); Munehiro Hasegawa, Osaka (JP); Katsuyuki Morii, Osaka (JP); Hiroki Fukudome, Osaka (JP)

(73) Assignees: Nippon Hoso Kyokai, Tokyo (JP); Nippon Shokubai Co., Ltd., Osaka (JP)

( * ) Notice: Subject to any disclaimer, the term of this patent is extended or adjusted under 35 U.S.C. 154(b) by 1161 days.

This patent is subject to a terminal disclaimer.

(21) Appl. No.: 17/640,260

(22) PCT Filed: Sep. 4, 2020

(86) PCT No.: PCT/JP2020/033545
§ 371 (c)(1),
(2) Date: Mar. 3, 2022

(87) PCT Pub. No.: WO2021/045179
PCT Pub. Date: Mar. 11, 2021

(65) Prior Publication Data
US 2023/0006159 A1 Jan. 5, 2023

(30) Foreign Application Priority Data

Sep. 6, 2019 (JP) ................................ 2019-163315
Apr. 3, 2020 (JP) ................................ 2020-067667

(51) Int. Cl.
*C09K 11/06* (2006.01)
*H10K 50/11* (2023.01)
(Continued)

(52) U.S. Cl.
CPC .............. *C09K 11/06* (2013.01); *H10K 50/11* (2023.02); *H10K 50/16* (2023.02);
(Continued)

(58) Field of Classification Search
CPC ........ C09K 11/06; H10K 50/11; H10K 50/16; H10K 85/6572; H10K 50/171;
(Continued)

(56) References Cited

U.S. PATENT DOCUMENTS 6,639,357 B1 10/2003 Parthasarathy et al.
2003/0116775 A1 6/2003 Matsuo et al.
(Continued)

FOREIGN PATENT DOCUMENTS

BE 868249 A * 12/1978 ............ A01N 59/20
CN 102947415 2/2013
(Continued)

OTHER PUBLICATIONS

Schmittel, et al., "Tris(1,10-phenanthroline)iron(II) Complexes—Broad Variation of the Redox Potential by 4,7-Substitution at the Phenanthroline Ligands", Chem. Ber. 1995, 128, 845-850.
(Continued)

*Primary Examiner* — Michael M Dollinger
(74) *Attorney, Agent, or Firm* — HSML P.C.

(57) ABSTRACT

The present invention provides an organic thin film that imparts an excellent electron injection property and an excellent electron transport property when it is used as an electron injection layer of an organic EL device, a coating
(Continued)

| Phenanthroline | 1 | 2 | 3 | 4 | 5 | 6 |
| --- | --- | --- | --- | --- | --- | --- |
|  |  |  |  |  |  |  |
| −0.074 | −0.091 | −0.083 | −0.082 | −0.078 | −0.076 | −0.067 |
| 7 | 8 | 9 | 10 | 11 | 12 | 13 |
|  |  |  |  |  |  |  |
| −0.074 | −0.097 | −0.096 | −0.062 | −0.070 | −0.085 | −0.069 | composition suitable for producing the organic thin film, and an organic EL device material for the organic thin film and the coating composition. The present invention provides an organic thin film, which is a single film containing a first material which is a compound having a structure of the following formula (1) and a second material which transports electrons or a laminate film including a film containing the first material and a film containing the second material,

[Chem. 1]

(1)

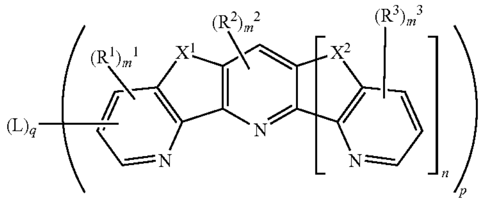

wherein $X^1$ and $X^2$ are the same as or different from each other and are each a nitrogen atom optionally having a substituent group, an oxygen atom optionally having a substituent group, a sulfur atom optionally having a substituent group, or a divalent linking group optionally having a substituent group; L is a direct bond or a linking group having a valence of p; n is a number of 0 or 1; p is a number of 1 to 4; q is a number of 0 or 1, with q being 0 when p is 1; $R^1$ to $R^3$ are the same as or different from each other and are each a monovalent substituent; and $m^1$ to $m^3$ are the same as or different from each other and are each a number of 0 to 3.

14 Claims, 20 Drawing Sheets

(51) Int. Cl.

| | |
|---|---|
| ***H10K 50/16*** | (2023.01) |
| ***H10K 85/60*** | (2023.01) |
| *H10K 50/17* | (2023.01) |
| *H10K 85/30* | (2023.01) |
| *H10K 101/40* | (2023.01) |
| *H10K 102/00* | (2023.01) |

(52) U.S. Cl.
CPC ....... *H10K 85/6572* (2023.02); *H10K 50/171* (2023.02); *H10K 85/322* (2023.02); *H10K 2101/40* (2023.02); *H10K 2102/00* (2023.02)

(58) Field of Classification Search
CPC ............. H10K 85/322; H10K 2101/40; H10K 2102/00; H10K 10/46; H10K 50/165; H10K 85/657; Y02P 70/50; Y02E 10/549; C07D 471/04; H05B 33/10
See application file for complete search history.

(56) References Cited

U.S. PATENT DOCUMENTS

| | | | | |
|---|---|---|---|---|
| 2004/0013905 | A1 | 1/2004 | Tsuboyama et al. | |
| 2004/0068115 | A1* | 4/2004 | Lecloux ................. | C09K 11/06 546/88 |
| 2004/0085016 | A1 | 5/2004 | Parthasarathy et al. | |
| 2005/0064239 | A1 | 3/2005 | Takei | |
| 2005/0236980 | A1* | 10/2005 | Lecloux ............... | H10K 85/654 546/88 |
| 2006/0097227 | A1* | 5/2006 | Okajima .............. | C07D 471/04 252/301.16 |
| 2006/0111335 | A1 | 5/2006 | Morrison et al. | |
| 2007/0252521 | A1* | 11/2007 | Kondakov ............. | C09K 11/06 428/917 |
| 2007/0252522 | A1 | 11/2007 | Kondakov et al. | |
| 2009/0218940 | A1* | 9/2009 | Okajima ................ | C09K 11/06 313/504 |
| 2009/0230857 | A1 | 9/2009 | Choi et al. | |
| 2010/0060153 | A1 | 3/2010 | Uchida et al. | |
| 2011/0092701 | A1 | 4/2011 | Pflumm et al. | |
| 2011/0260138 | A1* | 10/2011 | Xia .................... | H10K 85/6572 548/440 |
| 2012/0007056 | A1 | 1/2012 | Modeeparampil et al. | |
| 2013/0193419 | A1* | 8/2013 | Mizuno ................ | H10K 50/852 257/40 |
| 2014/0103310 | A1 | 4/2014 | Krestel et al. | |
| 2016/0308159 | A1* | 10/2016 | Yen .................... | H10K 85/6572 |
| 2019/0074458 | A1 | 3/2019 | Lee et al. | |
| 2019/0081239 | A1 | 3/2019 | Fukagawa et al. | |
| 2019/0280206 | A1 | 9/2019 | Lee et al. | |
| 2020/0013958 | A1 | 1/2020 | Suruga et al. | |
| 2020/0020858 | A1 | 1/2020 | Lee et al. | |
| 2020/0020873 | A1 | 1/2020 | Lee et al. | |
| 2020/0203626 | A1 | 6/2020 | Zhang et al. | |
| 2020/0227645 | A1 | 7/2020 | Lee et al. | |

FOREIGN PATENT DOCUMENTS

| | | | | | |
|---|---|---|---|---|---|
| CN | 109608452 | | | 4/2019 | |
| CN | 109721598 | | | 5/2019 | |
| CN | 110326123 | | | 10/2019 | |
| CN | 111943949 | | | 11/2020 | |
| CN | 113651836 | A | * | 11/2021 | ............. C09K 11/06 |
| EP | 3 534 424 | | | 9/2019 | |
| JP | 2001-267082 | | | 9/2001 | |
| JP | 2002-184583 | | | 6/2002 | |
| JP | 2004107263 | A | * | 4/2004 | ............. C09K 11/06 |
| JP | 2005-093418 | | | 4/2005 | |
| JP | 2007-265637 | | | 10/2007 | |
| JP | 2008-127314 | | | 6/2008 | |
| JP | 2009-070954 | | | 4/2009 | |
| JP | 2010-067718 | | | 3/2010 | |
| JP | 2014-099538 | | | 5/2014 | |
| JP | 2016-053005 | | | 4/2016 | |
| JP | 2017-157743 | | | 9/2017 | |
| JP | 2018-113149 | | | 4/2018 | |
| JP | 2019-080078 | | | 5/2019 | |
| JP | 2019-176093 | | | 10/2019 | |
| JP | 2019-179863 | | | 10/2019 | |
| KR | 10-2009-0120381 | | | 11/2009 | |
| KR | 10-2014-0117722 | | | 10/2014 | |
| KR | 20140117722 | A | * | 10/2014 | ........... H10K 59/122 |
| TW | 200803616 | | | 1/2008 | |
| TW | 1231151 | | | 2/2013 | |
| TW | 201829429 | | | 8/2018 | |
| WO | 2004/012667 | | | 2/2004 | |
| WO | 2011/157779 | | | 12/2011 | |
| WO | 2016/181705 | | | 11/2016 | |
| WO | 2017/211100 | | | 12/2017 | |

OTHER PUBLICATIONS

Engel-Andreasen, et al., “Selective copper catalysed aromatic N-arylation in water”, Green Chem., 2013, (accepted Nov. 11, 2012) 15, 336-340.

Levis, et al., “Tris(1,10-phenanthroline)iron(II) Complexes. Influence of 4,7-Donor Substitution on the Redox Potential [1]” Zeitschrift für Naturforschung B, A Journal of Chemical Sciences, vol. 49, No. 5, 1994, pp. 675-682.

CAS Registry, Registry No. 2089320-28-3, Apr. 11, 2017, 2 pages.

Walzer, et al., “Highly Efficient Organic Devices Based on Electrically Doped Transport Layers”, Chemical Reviews, vol. 107, No. 4, 2007, pp. 1233-1271.

Wei, et al., “Use of 1H-Benzoimidazole Derivative as an n-Type Dopant and to Enable Air-Stable Solution-Processed n-Chennel

(56) References Cited

OTHER PUBLICATIONS

Organic Thin Film Transistors", J. Am. Chem. Soc., vol. 132, No. 26, 2010, pp. 8852-8853.
Chen, et al., "Solution-processable small molecules as efficient universal bipolar host for blue, green and red phosphorescent inverted OLEDs", Journal of Materials Chemistry, vol. 22, 2012, pp. 5164-5170.
Choi, et al., "Combination of Titanium Oxide and a Conjugated Polyelectrolyte for High-Performance Inverted-Type Organic Optoelectronic Devices", Advanced Materials, vol. 23, 2011, pp. 2759-2763.
Zhou, et al., "A Universal Method to Produce Low-Work Function Electrodes for Organic Electronics", Science, vol. 336, Apr. 20, 2012, pp. 327-332.
Kim, et al., "Polyethylene Imine as an Ideal Interlayer for Highly efficient Inverted Polymer Light-Emitting Diodes", Advanced Functional Materials, vol. 24, 2014, pp. 3808-3814.
Hofle, et al., "Enhanced Electron Injection into Inverted Polymer Light-Emitting Diodes by Combined Solution-Processed Zinc Oxide/Polyethylenimine Interlayers", Advanced Materials, vol. 26, 2014, pp. 2750-2754.
Hofle, et al., "Solution Processed, White Emitting Tandem Organic Light-Emitting Diodes with Inverted Device Architecture", Advanced Materials, vol. 26, 2014, pp. 5155-5159.
Yoshida, Hiroyuki, "Electron Transport in Bathocuproine Interlayer in Organic Semiconductor Devices", J. Phys. Chem C, vol. 119, 2015, pp. 24459-24464.
Bin, et al., "Making silver a stronger n-dopant than cesium via in situ coordination reaction for organic electronics", Nature Communications, vol. 10, No. 866, 2019, 7 pages.
Fukagawa, et al., "Universal Strategy for Efficient Electron Injection into Organic Semiconductors Utilizing Hydrogen Bonds", Advanced Materials, vol. 31, 2019, pp. 1904201-1904201.
Xiong, et al., "A soluble nonionic surfactant as electron injection material for high-efficiency inverted bottom-emission organic light emitting diodes", Appl. Phys. Lett. 93, 123310 (2008), 4 pages.
Fukagawa, et al., "Understanding coordination reaction for producing stable electrode with various low work functions", Nature Communications, 11:3700 (2020), 8 pages.
Michaelson, Herbert B., "The work function of the elements and its periodicity", Journal of Applied Physics 48 (11), 4729-4733 (1977).

* cited by examiner

| Phenanthroline | 1 | 2 | 3 | 4 | 5 | 6 |
|---|---|---|---|---|---|---|
|  |  |  |  |  |  |  |
| −0.074 | −0.091 | −0.083 | −0.082 | −0.078 | −0.076 | −0.067 |
| 7 | 8 | 9 | 10 | 11 | 12 | 13 |
|  |  |  |  |  |  |  |
| −0.074 | −0.097 | −0.096 | −0.062 | −0.070 | −0.085 | −0.069 |

| | TPA | TPA+Phen-1 | TPA+Phen-3 | TPA+Phen-4 |
| --- | --- | --- | --- | --- |
| Most stable structure |  |   |  |  |
| Highest occupied molecular orbital of TPA |  |  |  |  |
| Ionization energy of TPA | 4.97eV | 4.65eV | 4.57eV | 4.59eV |
| Electrostatic potential of phenanthroline derivative | | −0.08263 | −0.101 | −0.09096 |

ORGANIC THIN FILM, METHOD FOR PRODUCING ORGANIC THIN FILM, ORGANIC ELECTROLUMINESCENT ELEMENT, DISPLAY DEVICE, LIGHTING DEVICE, ORGANIC THIN FILM SOLAR CELL, THIN FILM TRANSISTOR, PHOTOELECTRIC CONVERSION ELEMENT, COATING COMPOSITION AND MATERIAL FOR ORGANIC ELECTROLUMINESCENT ELEMENTS

TECHNICAL FIELD

The present invention relates an organic thin film and a method for producing an organic thin film, an organic electroluminescence (hereinafter, electroluminescence is also referred to as "EL") device, a display device, a lighting system, an organic thin film solar cell, a thin film transistor, a photoelectric transducer, a coating composition, and an organic electroluminescence device material.

BACKGROUND ART

Organic EL devices are thin, soft, and flexible. Display devices including organic EL devices are capable of providing higher brightness, higher definition display than currently dominant liquid crystal display devices and plasma display devices. Further, display devices including organic EL devices have a wider viewing angle than liquid crystal display devices. Thus, organic EL display devices are expected to be widely used, for example, as displays of TVs and mobiles.

In addition, organic EL devices are also expected to be used as lighting systems.

An organic EL device is a laminate of a cathode, an emitting layer, and an anode. In organic EL devices, the energy difference between the work function of the anode and the highest occupied molecular orbital (HOMO) of the emitting layer is smaller than the energy difference between the work function of the cathode and the lowest unoccupied molecular orbital (LUMO) of the emitting layer. It is therefore more difficult to inject electrons into the emitting layer from the cathode than to inject holes into the emitting layer from the anode. For this reason, in traditional organic EL devices, an electron injection layer is placed between the cathode and the emitting layer to facilitate electron injection from the cathode to the emitting layer. In addition, the electron injection property and the electron transport property are improved by doping dopants in a layer between the cathode and the emitting layer (see, for example, Non-Patent Literature 1 and Non-Patent Literature 2).

An example of the electron injection layer of an organic EL device is an inorganic oxide layer (see, for example, Non-Patent Literature 3). However, the inorganic oxide layer is poor in electron injection property.

The electron injection property of an organic EL device can be improved by forming an additional electron injection layer on an inorganic oxide layer. For example, Non-Patent Literature 4 discloses an organic EL device that includes an electron injection layer made of polyethyleneimine. Further, Non-Patent Literature 5 discloses that amines effectively improve the injection rate of electrons. Non-Patent Literatures 6, 7, 8, and 12 disclose the effects of an amino group on electron injection at an interface between an electrode and an organic layer. Non-Patent Literatures 10 and 11 report that phenanthroline derivatives, which have a high coordination ability with metal ions, facilitate electron emission from metal atoms and greatly lower electron injection barriers at the interface between an electrode and an organic layer. It is widely practiced to form an organic thin film consisting of a phenanthroline derivative at the interface between an electrode and an organic layer. Patent Literature 1 discloses an organic EL device in which an electron transport host material used is a phenanthroline compound and the host material is doped with an inert metal to lower the energy level of the LUMO of the electron transport material, facilitating electron injection and reducing the driving voltage of the device. Also, Patent Literatures 2 to 4 disclose organic EL devices in which an electron injection layer material used is a compound having a structure in which an amino group is attached to a group derived from an electron transport compound directly or via another group or an organic material having an acid dissociation constant pKa of 1 or greater.

CITATION LIST

Patent Literature

Patent Literature 1: WO 2017/211100
Patent Literature 2: JP 2017-157743 A
Patent Literature 3: JP 2019-176093 A
Patent Literature 4: JP 2019-179863 A

Non-Patent Literature

Non-Patent Literature 1: Karsten Walzer and three others, "Chemical Review", Vol. 107, 2007, pp. 1233-1271

Non-Patent Literature 2: Peng Wei and three others, "Journal of the American Chemical Society", Vol. 132, 2010, p. 8852

Non-Patent Literature 3: Jiangshan Chen and six others, "Journal Of Materials Chemistry", Vol. 22, 2012, pp. 5164-5170

Non-Patent Literature 4: Hyosung Choi and eight others, "Advanced Materials", Vol. 23, 2011, p. 2759

Non-Patent Literature 5: Yinhua Zho and 21 others, "Science", Vol. 336, 2012, p. 327

Non-Patent Literature 6: Young-Hoon Kim and five others, "Advanced Functional Materials", 2014, DOI: 10.1002/adfm.201304163

Non-Patent Literature 7: Stefan Hofle and four others, "Advanced Materials", 2014, DOI: 10.1002/adma.201304666

Non-Patent Literature 8: Stefan Hofle and five others, "Advanced Materials", Vol. 26, 2014, DOI: 10.1002/adma.201400332

Non-Patent Literature 9: Peng Wei and three others, "Journal of the American Chemical Society", Vol. 132, 2010, p. 8852

Non-Patent Literature 10: Hiroyuki Yoshida, "JOURNAL OF PHYSICAL CHEMISTRY" (J. Phys. Chem. C20151194324459-24464), Vol. 119, 2015, 24459

Non-Patent Literature 11: Zhengyang Bin and seven others, "Nature Communications", Vol. 10, 2019, p 866

Non-Patent Literature 12: Hirohiko Fukagawa and five others, "Advanced Materials", Vol. 31, 2019, p 1904201

SUMMARY OF INVENTION

Technical Problem

Organic EL devices including an existing electron injection layer however require a further improved electron injection property and a further improved electron transport property.

The present invention has been made in view of the above-mentioned circumstances, and aims to provide an organic thin film that imparts an excellent electron injection property and an excellent electron transport property when it is used as an electron injection layer of an organic EL device, a coating composition suitable for producing the organic thin film, and an organic EL device material for the organic thin film and the coating composition.

The present invention also aims to provide an organic EL device including the organic thin film of the present invention, a display device and a lighting system each including the organic EL device, and an organic thin film solar cell, a photoelectric transducer, and an organic thin film transistor each including the organic thin film of the present invention.

Solution to Problem

The present inventors focused on and examined a multidentate organic material containing a nitrogen atom, which has an electron-donating ability, in a heterocyclic ring as a material used for an electron injection layer of an organic EL device. As a result of the examination, the inventors found that an organic thin film containing a compound which has a specific structure containing multiple pyridine rings in the structure and a material which transports electrons may be used as an electron injection layer of an organic EL device.

In other words, owing to the high electron-donating ability of nitrogen atoms in the compound of the formula (1) in the present invention, the compound coordinates and interacts with an inorganic material to improve the electron injection property. In addition, when an organic material which transports electrons exists adjacent to the compound, the compound can form hydrogen bonding with the different organic material to yield a trace amount of charge. Thus, the negative charge generates on the organic material. This is also considered to be a factor for improving the electron injection property.

The present invention has been accomplished based on the above findings, and the following describes the summary thereof.

<1> An organic thin film, which is a single film containing a first material which is a compound having a structure of the following formula (1) and a second material which transports electrons or a laminate film including a film containing the first material and a film containing the second material,

[Chem. 1]

(1)

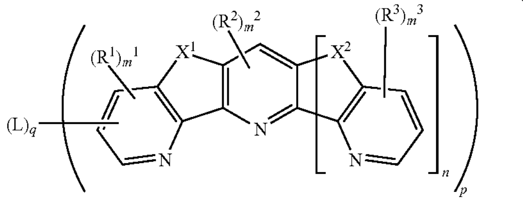

wherein $X^1$ and $X^2$ are the same as or different from each other and are each a nitrogen atom optionally having a substituent group, an oxygen atom optionally having a substituent group, a sulfur atom optionally having a substituent group, or a divalent linking group optionally having a substituent group; L is a direct bond or a linking group having a valence of p; n is a number of 0 or 1; p is a number of 1 to 4; q is a number of 0 or 1, with q being 0 when p is 1; $R^1$ to $R^3$ are the same as or different from each other and are each a monovalent substituent group; and $m^1$ to $m^3$ are the same as or different from each other and are each a number of 0 to 3.

<2> The organic thin film according to <1>, wherein the first material is a compound of the formula (1) in which n is 0.

<3> A laminate film including:

an oxide layer; and a layer of the organic thin film according to <1> or <2> disposed on the oxide layer.

<4> An organic electroluminescence device including:

a cathode;

an anode;

an emitting layer between the cathode and the anode; and the organic thin film according to <1> or <2> or the laminate film according to <3> between the cathode and the emitting layer.

<5> The organic electroluminescence device according to <4>, further including:

an inorganic oxide layer between the cathode and the organic thin film.

<6> The organic electroluminescence device according to <4> or <5>, including:

a laminate film including the film containing the first material and the second material and the film containing the second material between the cathode and the emitting layer.

<7> The organic electroluminescence device according to <6>, wherein the layer containing the second material is present between the emitting layer and the film containing the first material and the second material.

<8> The organic electroluminescence device according to <6>, wherein the layer containing the second material is present between the cathode and the film containing the first material and the second material.

<9> The organic electroluminescence device according to any one of <4> to <8>, wherein the layer containing the second material is present between the anode and the emitting layer.

<10> The organic electroluminescence device according to any one of <4> to <9>, wherein the emitting layer contains the second material.

<11> An organic electroluminescence device material, containing:

a phenanthroline compound having a structure of the following formula (2):

[Chem. 2]

(2)

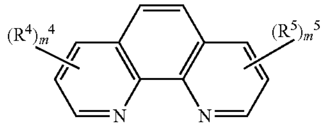

wherein $R^4$ and $R^5$ are the same as or different from each other and are each a dialkylamino group or an alkoxy group; and $m^4$ and $m^3$ are the same as or different from each other and are each a number of 1 or 2.

<12> An organic electroluminescence device including:

a cathode;

an anode;

an emitting layer between the cathode and the anode; and a layer containing the organic electroluminescence device material according to <11> between the cathode and the anode.

<13> The organic electroluminescence device according to <12>, wherein the layer containing the organic electroluminescence device material according to <11> is present between the cathode and the emitting layer.

<14> The organic electroluminescence device according to <12> or <13>, including:

an inorganic oxide layer between the cathode and the layer containing the organic electroluminescence device material according to <11>.

<15> A display device, including:

the organic electroluminescence device according to any one of <4> to <10> and <12> to <14>.

<16> A lighting system, including:

the organic electroluminescence device according to any one of <4> to <10> and <12> to <14>.

<17> An organic thin film solar cell material, containing:

a phenanthroline compound having a structure of the following formula (2):

[Chem. 3]

(2)

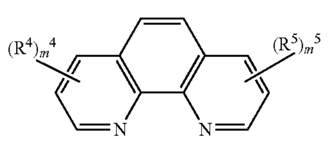

wherein $R^4$ and $R^5$ are the same as or different from each other and are each a dialkylamino group or an alkoxy group; and $m^4$ and $m^5$ are the same as or different from each other and are each a number of 1 or 2.

<18> An organic thin film solar cell, including:

the organic thin film according to <1> or <2>;

the laminate film according to <3>; or a layer containing the organic thin film solar cell material according to <17>.

<19> A photoelectric transducer material, containing:

a phenanthroline compound having a structure of the following formula (2):

[Chem. 4]

(2)

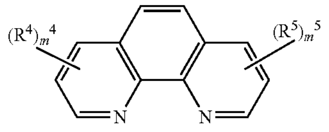

wherein $R^4$ and $R^5$ are the same as or different from each other and are each a dialkylamino group or an alkoxy group; and $m^4$ and $m^5$ are the same as or different from each other and are each a number of 1 or 2.

<20> A photoelectric transducer, including:

the organic thin film according to <1> or <2>;

the laminate film according to <3>; or a layer containing the photoelectric transducer material according to <19>.

<21> A thin film transistor material, containing:

a phenanthroline compound having a structure of the following formula (2):

[Chem. 5]

(2)

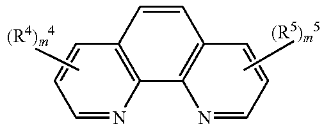

wherein $R^4$ and $R^5$ are the same as or different from each other and are each a dialkylamino group or an alkoxy group; and $m^4$ and $m^5$ are the same as or different from each other and are each a number of 1 or 2.

<22> A thin film transistor, including:

the organic thin film according to <1> or <2>;

the laminate film according to <3>; or a layer containing the thin film transistor material according to <21>.

<23> A coating composition, containing:

a first material which is a compound having a structure of the following formula (1); and a second material which transports electrons,

[Chem. 6]

(1)

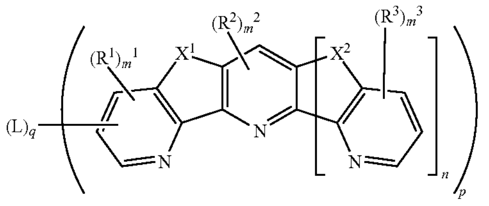

wherein $X^1$ and $X^2$ are the same as or different from each other and are each a nitrogen atom optionally having a substituent group, an oxygen atom optionally having a substituent group, a sulfur atom optionally having a substituent group, or a divalent linking group optionally having a substituent group; L is a direct bond or a linking group having a valence of p; n is a number of 0 or 1; p is a number of 1 to 4; q is a number of 0 or 1, with q being 0 when p is 1; $R^1$ to $R^3$ are the same as or different from each other and are each a monovalent substituent group; and $m^1$ to $m^3$ are the same as or different from each other and are each a number of 0 to 3.

<24> A coating composition, containing:

a first material which is a compound having a structure of the following formula (1):

[Chem. 7]

(1)

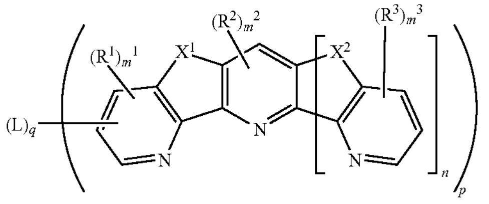

wherein $X^1$ and $X^2$ are the same as or different from each other and are each a nitrogen atom optionally having a substituent group, an oxygen atom optionally having a substituent group, a sulfur atom optionally having a substituent group, or a divalent linking group optionally having a substituent group; L is a direct bond or a linking group having a valence of p; n is a number of 0 or 1; p is a number of 1 to 4; q is a number of 0 or 1, with q being 0 when p is 1; $R^1$ to $R^3$ are the same as or different from each other and are each a monovalent substituent group; and $m^1$ to $m^3$ are the same as or different from each other and are each a number of 0 to 3.

<25> A method for producing an organic thin film, including:

forming a single film containing a first material which is a compound having a structure of the following formula (1) and a second material which transports electrons on a surface to be coated; or forming successively a film containing the first material and a film containing the second material on the surface to be coated,

[Chem. 8]

(1)

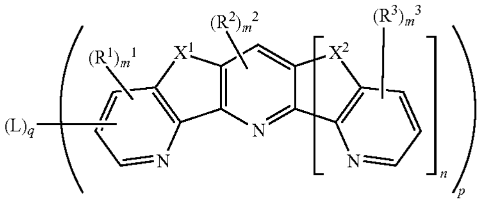

wherein $X^1$ and $X^2$ are the same as or different from each other and are each a nitrogen atom optionally having a substituent group, an oxygen atom optionally having a substituent group, a sulfur atom optionally having a substituent group, or a divalent linking group optionally having a substituent group; L is a direct bond or a linking group having a valence of p; n is a number of 0 or 1; p is a number of 1 to 4; q is a number of 0 or 1, with q being 0 when p is 1; $R^1$ to $R^3$ are the same as or different from each other and are each a monovalent substituent group; and $m^1$ to $m^3$ are the same as or different from each other and are each a number of 0 to 3.

<26> A method for producing an organic thin film, including:

forming a film containing a first material which is a compound having a structure of the following formula (1) on a surface on which the organic thin film is to be formed,

[Chem. 9]

(1)

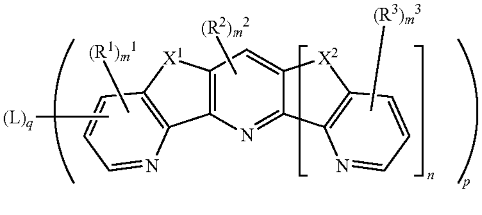

wherein $X^1$ and $X^2$ are the same as or different from each other and are each a nitrogen atom optionally having a substituent group, an oxygen atom optionally having a substituent group, a sulfur atom optionally having a substituent group, or a divalent linking group optionally having a substituent group; L is a direct bond or a linking group having a valence of p; n is a number of 0 or 1; p is a number of 1 to 4; q is a number of 0 or 1, with q being 0 when p is 1; $R^1$ to $R^3$ are the same as or different from each other and are each a monovalent substituent group; and $m^1$ to $m^3$ are the same as or different from each other and are each a number of 0 to 3.

<27> The method for producing an organic thin film according to <26>, wherein the surface on which the organic thin film is to be formed contains a second material.

Advantageous Effects of Invention

The organic thin film of the present invention contains a first material which is a specific electron-donating organic material and a second material which transports electrons. Thus, when the organic thin film of the present invention is used as, for example, an electron injection layer of an organic EL device, the organic EL device can have an excellent electron injection property and an excellent electron transport property and can have a long life time.

Since the organic EL device of the present invention includes the organic thin film of the present invention between the cathode and the emitting layer, the organic EL device can have an excellent electron injection property and an excellent electron transport property owing to the organic thin film and can have a long life time.

The organic thin film of the present invention containing a first material which is a compound having a specific structure containing multiple pyridine rings in the structure, which is a multidentate organic material containing a nitrogen atom, which has an electron-donating ability, in a heterocyclic ring, and a second material which transports electrons can be formed by either application or evaporation. Thus, an organic EL device including the organic thin film of the present invention can be produced with little restriction on the production process, and such an organic thin film can be easily used as materials of layers constituting the organic EL device. The method for producing an organic thin film of the present invention is a method for producing such an organic thin film of the present invention.

The coating composition of the present invention contains a first material which is a specific multidentate organic material containing a nitrogen atom, which has an electron-donating ability, in a heterocyclic ring and a second material which transports electrons. Accordingly, an organic thin film suitable for an electron injection layer of an organic EL device can be obtained by applying the coating composition of the present invention to a surface on which the organic thin film is to be formed.

The organic EL device material of the present invention is useful for the organic thin film and the coating composition of the present invention to be used for producing an organic EL device or the like. The organic EL device material is also useful in that it can be used alone as an electron injection layer or an electron transport layer.

The display device and the lighting system of the present invention each include the organic EL device of the present invention, and are thus driven with a low voltage and have excellent properties.

In addition, the organic thin film solar cell, the photoelectric transducer, and the organic thin film transistor of the present invention each include the organic thin film of the present invention, and thus have excellent properties.

BRIEF DESCRIPTION OF DRAWINGS

FIG. 8-1 is a schematic cross-sectional view illustrating an exemplary organic thin film of the present invention.

FIG. 8-2 is a schematic cross-sectional view illustrating an exemplary organic thin film of the present invention.

FIG. 9-1 is a schematic cross-sectional view illustrating another exemplary laminate structure of the organic thin film of the present invention.

FIG. 9-2 is a schematic cross-sectional view illustrating another exemplary laminate structure of the organic thin film of the present invention.

FIG. 10-1 is a schematic cross-sectional view illustrating another exemplary laminate structure of the organic thin film of the present invention.

FIG. 10-2 is a schematic cross-sectional view illustrating another exemplary laminate structure of the organic thin film of the present invention.

FIG. 11-1 is a schematic cross-sectional view illustrating another exemplary laminate structure of the organic thin film of the present invention.

FIG. 11-2 is a schematic cross-sectional view illustrating another exemplary laminate structure of the organic thin film of the present invention.

FIG. 12-1 is a schematic cross-sectional view illustrating another exemplary laminate structure of the organic thin film of the present invention.

FIG. 12-2 is a schematic cross-sectional view illustrating another exemplary laminate structure of the organic thin film of the present invention.

FIG. 13-1 is a schematic cross-sectional view illustrating another exemplary laminate structure of the organic thin film of the present invention.

FIG. 13-2 is a schematic cross-sectional view illustrating another exemplary laminate structure of the organic thin film of the present invention.

FIG. 14-1 is a schematic cross-sectional view illustrating another exemplary laminate structure of the organic thin film of the present invention.

FIG. 14-2 is a schematic cross-sectional view illustrating another exemplary laminate structure of the organic thin film of the present invention.

DESCRIPTION OF EMBODIMENTS

Figure 1:
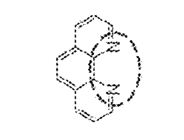
FIG. 1 shows the electrostatic potentials of phenanthroline derivatives calculated using quantum chemical calculations.
Figure 1:
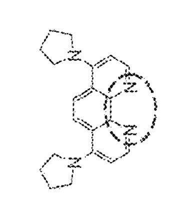
Figure 1:
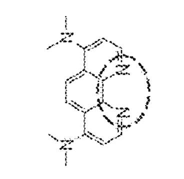
Figure 1:
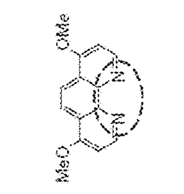
Figure 1:
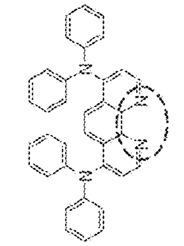
Figure 1:
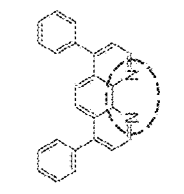
Figure 1:
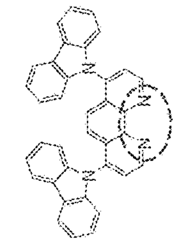
Figure 1:
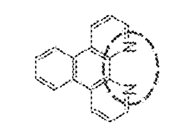
Figure 1:
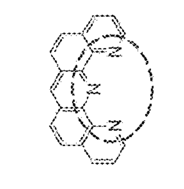
Figure 1:
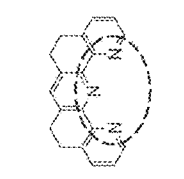
Figure 1:
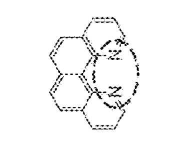
Figure 1:
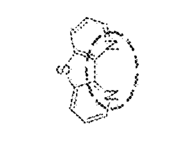
Figure 1:
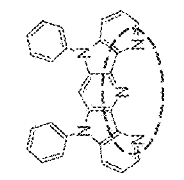
Figure 1:
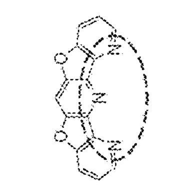

The present invention is described in detail below.

"Organic Thin Film and Organic EL Device Material"

The organic thin film of the present invention contains a first material which is a compound having a structure of the following formula (1) and a second material which transports electrons, which is different from the first material. The organic thin film of the present invention may be a film of a single layer containing the first material and the second material or may be a laminate film including a layer containing the first material and a layer containing the second material.

[Chem. 10]

(1)

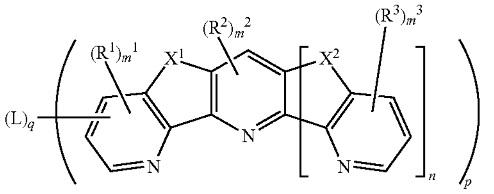

wherein $X^1$ and $X^2$ are the same as or different from each other and are each a nitrogen atom optionally having a substituent group, an oxygen atom optionally having a substituent group, a sulfur atom optionally having a substituent group, or a divalent linking group optionally having a substituent group; L is a direct bond or a linking group having a valence of p; n is a number of 0 or 1; p is a number of 1 to 4; q is a number of 0 or 1, with q being 0 when p is 1; $R^1$ to $R^3$ are the same as or different from each other and are each a monovalent substituent group; and $m^1$ to $m^3$ are the same as or different from each other and are each a number of 0 to 3.

The first material constituting the organic thin film of the present invention, which is a multidentate material containing a nitrogen atom, which has an electron-donating ability, in a heterocyclic ring, is capable of stably forming hydrogen bonding with the second material and capable of generating a negative charge on the second material. The first material preferably has high negative electrostatic potential at a nitrogen site serving as an electron donor. The first material having higher electrostatic potential is more highly capable of generating a negative charge on the second material. Furthermore, the first material is confirmed to have an effect of improving the life time of a device.

Thus, the organic thin film of the present invention can be used not only in a device consisting only of organic compounds, but also in, in particular, a device including organic compounds and inorganic compounds, and can enhance the electron injection property and the atmospheric stability. Further, the organic thin film can achieve a device having a long life time.

The organic thin film of the present invention contains a compound having a structure of the formula (1) as the first material. The organic thin film of the present invention, when used as an electron injection layer, can impart an excellent electron injection property and an excellent electron transport property. The compound having a structure of the formula (1) is a compound suitable as an organic EL device material. The compound of the formula (1) includes a phenanthroline compound of the formula (2). An organic EL device material containing such a phenanthroline compound of the formula (2) is another aspect of the present invention.

The "electrostatic potential" described in the present invention can be calculated using a quantum chemical calculation program such as GAUSSIAN, for example. The absolute amount of a calculated value varies depending on the basis function used in the calculation, whereas it is possible to discuss the correlation with the generation of a negative charge using the relative values of large and small values calculated using the same calculation method.

As an example of the first material of the present invention, the electrostatic potential of the nitrogen site in the phenanthroline contained in any of various types of the first material was calculated under the following conditions.

Function used to calculate the most stabilized structure of a phenanthroline compound B3LYP/6-31+G(d)

Function used to calculate the electrostatic potential of a phenanthroline compound B3LYP/6-311++G(2df,2p)

The results of calculation are shown in FIG. 1. FIG. 1 shows a calculated electrostatic potential value of a site surrounded by a dotted line in which the coordinated nitrogen atoms are close to each other in phenanthroline, which is the basic structure of the compounds. The electrostatic potential values of compounds 1 to 13 are also calculated at the same site as of phenanthroline. As shown in FIG. 1, the electrostatic potential values depend largely on a substituent to be added to phenanthroline.

The compound 1, the compound 2, and the compound 3 to which a pyrrolidino group, a dimethylamine group, and a methoxy group, which are electron-donating substituents, are respectively added have large electrostatic potential values. In these compounds, the electron-donating substituents increase the electron density of the phenanthroline structure to enhance an ability of the nitrogen atoms to bind to hydrogen and an ability of the nitrogen atoms to coordinate with an inorganic compound. Thus, these compounds are particularly suitable as the first material.

Also, a compound of the formula (1) in which n is 1, excluding phenanthroline, contains a large number of nitrogen atoms involved in hydrogen bonding or coordination with an inorganic compound, and is thus considered to have a relatively large electrostatic potential value.

In addition to the compounds having only one phenanthroline shown in FIG. 1, compounds of the following formulas (3-1) to (3-4) having multiple phenanthrolines are considered to be effective for generating a negative charge and are suitable as the first material.

[Chem. 11]

(3-1)

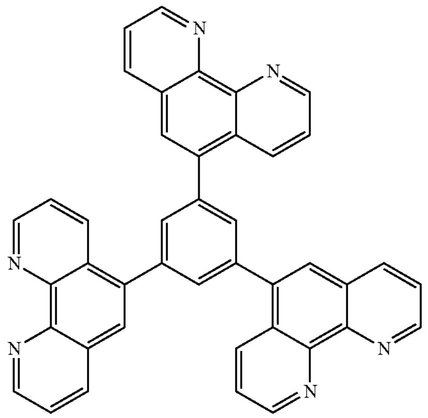

(3-2)

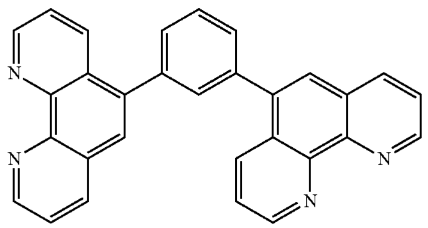

(3-3)

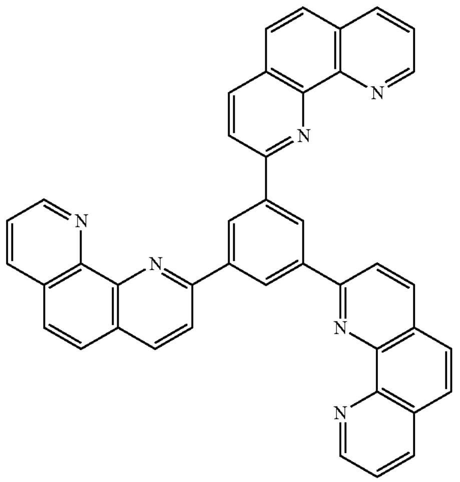

-continued (3-4)

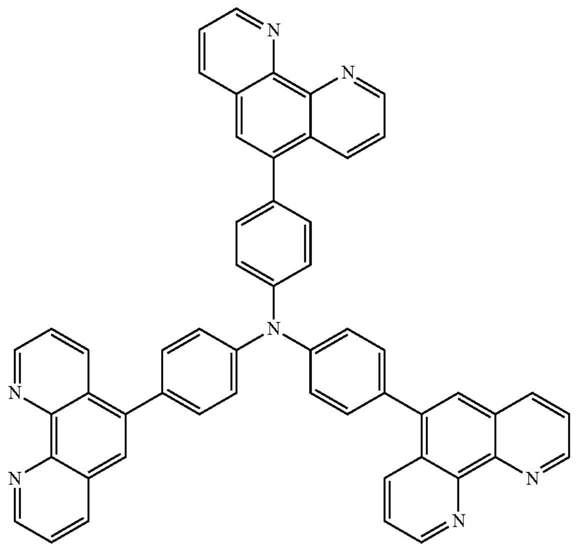

Figure 2:
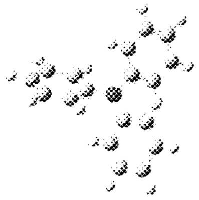
FIG. 2 shows the most stable structure, the highest occupied molecular orbital, and the ionization energy in a bimolecular system consisting of a phenanthroline derivative and triphenyl amine calculated using quantum chemical calculations.
Figure 2:
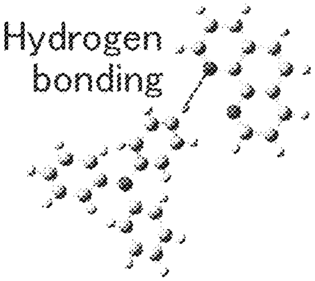
Figure 2:
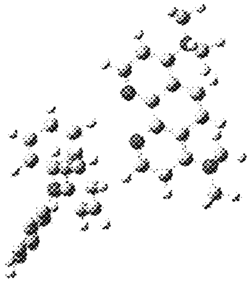
Figure 2:
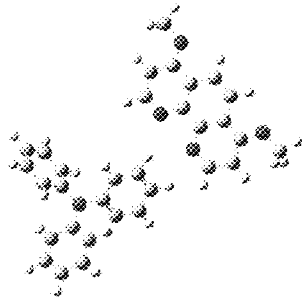
Figure 2:
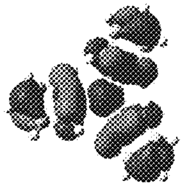
Figure 2:
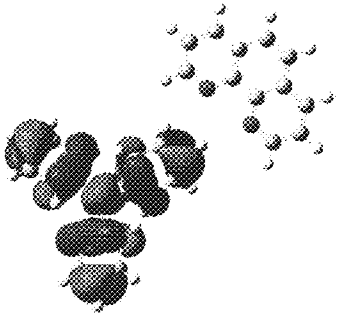
Figure 2:
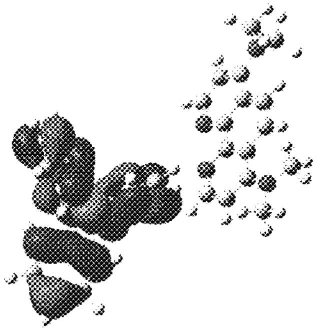
Figure 2:
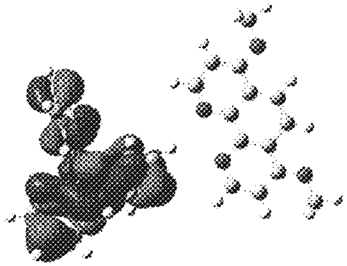

The generation of a negative charge caused by phenanthroline derivatives was also simulated using quantum chemical calculations. The results are shown in FIG. 2. Any of various phenanthroline derivatives are used as the first material, and triphenylamine (TPA) having a simple molecular structure is used as the second material. The optimized structure of the two molecules was calculated, and the ionization energy of triphenylamine in the optimized structure was calculated.

As shown in FIG. 2, in the optimized structure, a specific hydrogen atom of triphenylamine forms hydrogen bonding with a nitrogen atom of phenanthroline, and a change in ionization energy is observed. There is no change in the distribution of the highest occupied orbitals in the calculation of the two molecules, whereas the larger the electrostatic potential value of the phenanthroline derivative used, the lower the ionization energy.

At low ionization energy, electrons are easily extracted from a triphenylamine molecule. In other words, the triphenylamine is likely to be negatively charged, and the first material having a larger electrostatic potential value can generate a more negative charge on the second material.

Figure 3:
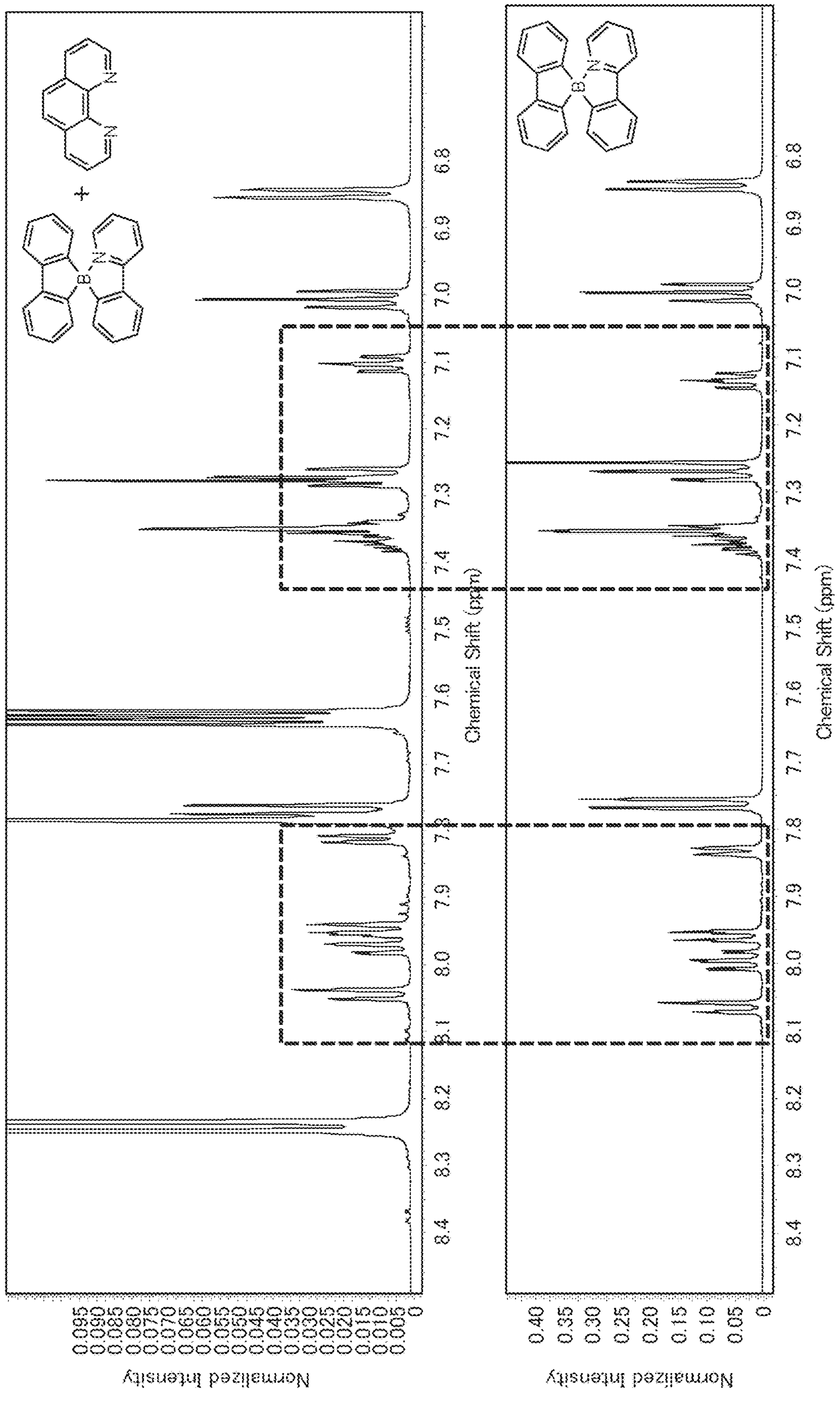
FIG. 3 shows the comparison of the results of $^{1}$H-NMR analysis of a boron compound alone and a mixture of the boron compound and phenanthroline.

The presence of hydrogen bonding is suggested by the $^{1}$H-NMR analysis shown in FIG. 3.

The analysis was performed using a simplified boron compound, and the peak positions of the protons of the boron compound were compared with those of the protons of the boron compound in the presence of phenanthroline.

The amount of phenanthroline was 5 molar equivalents relative to the boron compound and the measurement was carried out in heavy chloroform. It can be seen from FIG. 3 that the peak positions of the protons enclosed by frames are shifted toward the high magnetic field. This is because the interaction between the boron compound and phenanthroline through hydrogen bonding increases the electron density of the hydrogen atoms of the boron compound.

$X^1$ and $X^2$ in the formula (1) are the same as or different from each other and are each a nitrogen atom optionally having a substituent, an oxygen atom optionally having a substituent, a sulfur atom optionally having a substituent, or a divalent linking group optionally having a substituent.

Examples of the divalent linking group include a divalent hydrocarbon group and a group in which at least one carbon atom of a hydrocarbon group is replaced with a nitrogen atom, an oxygen atom, or a sulfur atom as a heteroatom.

The hydrocarbon group preferably has a carbon number of 1 to 6, more preferably has a carbon number of 1, 2, or 6.

The hydrocarbon group may be linear, branched, or cyclic, or may include a combination thereof.

The divalent hydrocarbon group may be a saturated hydrocarbon group such as an alkylene group or may be an unsaturated hydrocarbon group such as an alkenylene group or an alkynylene group.

Specifically, the divalent hydrocarbon group is preferably any of compounds of the following formulas (4-1) to (4-4).

R in the formulas (4-1) to (4-4) is a substituent. Specific examples of R in the formulas (4-1) to (4-4) and a substituent in $X^1$ and $X^2$ include monovalent substituents for $R^1$ to $R^3$ described later.

[Chem. 12]

(4-1)

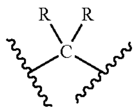

(4-2)

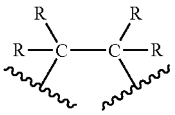

(4-3)

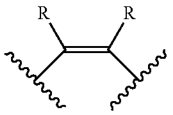

(4-4)

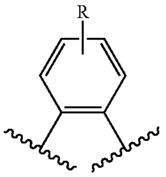

L in the formula (1) is a direct bond or a linking group having a valence of p. L is a direct bond only when p is 2.

Examples of the linking group having a valence of p include nitrogen, oxygen, sulfur, and carbon atoms, and a group prepared by removing p number of hydrogen atoms from a hydrocarbon group or a group in which at least one of the carbon atoms of a hydrocarbon group is replaced with a nitrogen atom, an oxygen atom, or a sulfur atom as a heteroatom.

When the linking group having a valence of p contains a carbon atom, it preferably has a carbon number of 1 to 30. More preferably, it has a carbon number of 1 to 20.

The hydrocarbon group may be linear, branched, or cyclic, or may include a combination thereof.

The hydrocarbon group may be any of a saturated hydrocarbon group, an unsaturated hydrocarbon group, and an aromatic hydrocarbon group.

Examples of the aromatic hydrocarbon group include groups prepared by removing a hydrogen atom from an aromatic compound such as a benzene ring, a naphthalene ring, an anthracene ring, a tetracene ring, a pentacene ring, a triphenylene ring, a pyrene ring, a fluorene ring, or an indene ring.

$R^1$ to $R^3$ in the formula (1) are the same as or different from each other, and are each a monovalent substituent.

Examples of the monovalent substituent include a fluorine atom; haloalkyl groups such as fluoromethyl, difluoromethyl, and trifluoromethyl groups; C1-C20 linear or branched acyclic alkyl groups such as methyl, ethyl, propyl, isopropyl, butyl, isobutyl, and tert-butyl groups; C5-C7 cyclic alkyl groups such as cyclopentyl, cyclohexyl, and cycloheptyl groups; C1-C20 linear or branched acyclic alkoxy groups such as methoxy, ethoxy, propoxy, isopropoxy, butoxy, isobutoxy, tert-butoxy, pentyloxy, hexyloxy, heptyloxy, and octyloxy groups; a nitro group; a cyano group; C1-C10 alkyl group-containing alkylamino groups such as methylamino, ethylamino, dimethylamino, and diethylamino groups; cyclic amino groups such as pyrrolidino, piperidino, and morpholino group; diarylamino groups such as diphenylamino and carbazolyl groups; acyl groups such as acetyl, propionyl, and butyryl groups; C2-C30 alkenyl groups such as a styryl group; a C5-C20 aryl group optionally substituted with a halogen atom such as a fluorine atom, a C1-C20 alkyl group, a C1-C20 alkoxy group, a C1-C20 amino group, or the like (specific examples of the aryl group include the above-described examples of the aromatic hydrocarbon group); a C4-C20 heterocyclic group containing at least one of a nitrogen atom, a sulfur atom, or an oxygen atom, optionally substituted with a halogen atom such as a fluorine atom, a C1-C20 alkyl group, a C1-C20 alkoxy group, a C1-C20 amino group, or the like (the heterocyclic group may consist of one ring or may be a compound in which multiple compounds each consisting of one aromatic heterocyclic ring are directly bound to each other via a carbon-carbon bond, or a condensed heterocyclic group, and specific examples of the heterocyclic group include aromatic heterocyclic groups such as a thiophene ring, a furan ring, a pyrrole ring, a benzothiophene ring, a benzofuran ring, an indole ring, a dibenzothiophene ring, a dibenzofuran ring, a carbazole ring, a thiazole ring, a benzothiazole ring, an oxazole ring, a benzoxazole ring, an imidazole ring, a benzimidazole ring, a pyridine ring, a pyrimidine ring, a pyrazine ring, a pyridazine ring, a triazine ring, a quinoline ring, an isoquinoline ring, a quinoxaline ring, a benzothiadiazole ring, and a phenanthridine ring); and ester groups and thioether groups. These groups may be substituted with a halogen atom, a heteroatom, an alkyl group, or an aromatic ring, for example.

$R^4$ and $R^3$ in the formula (2) are the same as or different from each other and are each a dialkylamino group or an alkoxy group.

Preferably, the dialkylamino group has a C1-C20 alkyl group such as a methyl group or an ethyl group. More preferably, the dialkylamino group has a C1-C10 alkyl group. The carbon number of the two alkyl groups in the dialkylamino group may be the same as or different from each other. An amino group in which two alkyl groups link to each other such as a cyclic amino group (e.g., a piperidino group, a pyrrolidino group, or a morpholino group) is also preferred.

Examples of the alkoxy group include the alkoxy groups for $R^1$ to $R^3$ in the formula (1).

The letter p in the formula (1) is the number of 1 to 4, preferably the number of 1 to 3. Specific examples of a compound of the formula (1) in which p is 1 include compounds of any of the following formulas (5-1) to (5-9).

[Chem. 13]

(5-1)

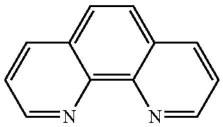

(5-2)

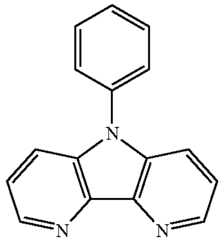

(5-3)

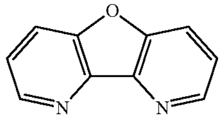

(5-4)

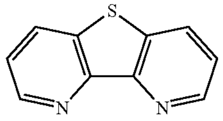

(5-5)

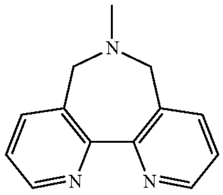

(5-6)

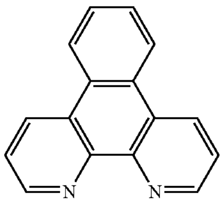

(5-7)

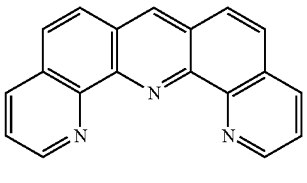

(5-8)

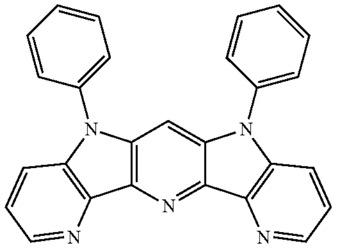

-continued (5-9)

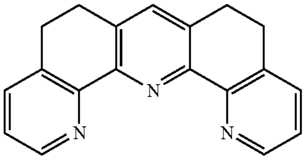

The letter n in the formula (1) is the number of 0 or 1. In the compound of the formula (1), the compound in which n is 0 is a preferred embodiment of the present invention. Specific examples of the compound of the formula (1) in which n is 0 include compounds of the formulas (5-1) to (5-6).

The second material in the present invention has only to be a material which transports electrons, and is preferably an organic material, more preferably an organic material having a lowest unoccupied molecular orbital (LUMO) level of 2.0 eV to 4.0 eV. Particularly preferred is an n-type organic semiconductor material having a LUMO level of 2.5 eV to 3.5 eV. For example, any of the below-described conventionally known materials may be used as a material of an electron transport layer of the organic EL device. In particular, a material satisfying the requirements of the LUMO level is preferred.

Specific examples of the second material include phosphine oxide derivatives such as phenyl-dipyrenylphosphine oxide ($POPy_2$); pyridine derivatives such as tris-1,3,5-(3'-(pyridin-3"-yl)phenyl)benzene (TmPhPyB), 1,3,5-tris(6-(3-(pyridin-3-yl)phenyl)pyridine-2-yl)benzene, and 8,9-diphenyl-7,10-(3-(pyridin-3-yl))fluoranthene; quinoline derivatives such as (2-(3-(9-carbazolyl)phenyl)quinoline (mCQ)); pyrimidine derivatives such as 2-phenyl-4,6-bis(3,5-dipyridylphenyl)pyrimidine (BPyPPM), 2-methyl-4,6-bis(3,5-dipyridylphenyl)pyrimidine, and 9-(4-(4,6-diphenylpyrimidine-2-yl)phenyl)-9H-carbazole; pyrazine derivatives; phenanthroline derivatives such as bathophenanthroline (BPhen) and 2,9-dimethyl-4,7-diphenyl-1,10-phenanthroline (BCP); triazine derivatives such as 2,4-bis(4-biphenyl)-6-(4'-(2-pyridinyl)-4-biphenyl)-(1,3,5)triazine (MPT), tris-1,3,5-(3'-(pyridin-3"-yl)phenyl)triazine (TmPhPyTz), tris-1,3,5-([1,1'-biphenyl)-3-yl)triazine, 2-(3-(4,6-di(pyridin-3-yl)-1,3,5-triazin-2-yl)phenyl)-1-phenyl-1H-benzo[d]imidazole, 9-(4-(4,6-diphenyl-1,3,5-triazin-2-yl)phenyl)-9H-3,9'-bicarbazole, 9-(4-(4,6-diphenyl-1,3,5-triazin-2-yl)phenyl)-9H-carbazole, 11-(4,6-diphenyl-1,3,5-triazin-2-yl)-12-phenyl-11,12-dihydroindolo(2,3-a)carbazole, 12-(2-(4,6-diphenyl-1,3,5-triazin-2-yl)phenyl)-12H-benzofuro[2,3,a]-carbazole, and 9-((4-(4,6-dipyridin-3-yl)-1,3,5-triazin-2-yl)phenyl)-9H-carbazole; triazole derivatives such as 3-phenyl-4-(1'-naphthyl)-5-phenyl-1,2,4-triazole (TAZ); oxazole derivatives; oxadiazole derivatives such as 2-(4-biphenyl)-5-(4-tert-butylphenyl-1,3,4-oxadiazole) (PBD); imidazole derivatives such as 2,2',2"-(1,3,5-benzenetriyl)-tris(1-phenyl-1-H-benzimidazole) (TPBI); aromatic carboxylic anhydrides such as naphthalene-1,4,5,8-tetracarboxylic dianhydride and 3,4,9,10-perylene tetracarboxylic dianhydride; aromatic imide compounds such as N,N'-dimethyl-3,4,9,10-perylene tetracarboxylic imide; carbonyl-containing compounds such as an isoindigo derivative, a 2,5-dihydropyrrolo[3,4-c]pyrrole-1,4-dione derivative (diketopyrrolopyrrole), and truxenone; 1,2,5-thiadiazole derivatives such as naphtho[1,2-c:5,6-c']bis[1,2,5]thiadiazole and benzo[c][1,2,5]thiadiazole; a compound containing a carbonyl-containing heterocyclic ring such as a compound of the below-described formula (30); various metal complexes typified by bis(2-(2-hydroxyphenyl)benzothiazolato)zinc ($Zn(BTZ)_2$) and tris(8-hydroxyquinolinato)aluminum ($Alq_3$); organic silane derivatives typified by silole derivatives such as 2,5-bis(6'-(2',2"-bipyridyl))-1,1-dimethyl-3,4-diphenylsilole (PyPySPyPy); and boron-containing compounds such as tris(2,4,6-trimethyl-3-(pyridin-3-yl)phenyl)borane (3TPYMB) and compounds disclosed in Japanese Patent Application No. 2012-228460, Japanese Patent Application No. 2015-503053, Japanese Patent Application No. 2015-053872, Japanese Patent Application No. 2015-081108, and Japanese Patent Application No. 2015-081109. One or two or more of these may be used.

The second material may also be the below-described material of an emitting layer.

Of these, the second material is more preferably a phosphine oxide derivative such as $POPy_2$, a boron-containing compound of any of the following formulas (6) to (9), a metal complex such as $Alq_3$, a pyridine derivative such as TmPhPyB, or a triazine derivative such as TmPhPyTz. Of these, the second material is particularly preferably a boron-containing compound or a triazine derivative. The letter $n^1$ in the formula (8) is an integer of 1 or more.

[Chem. 14]

(6)

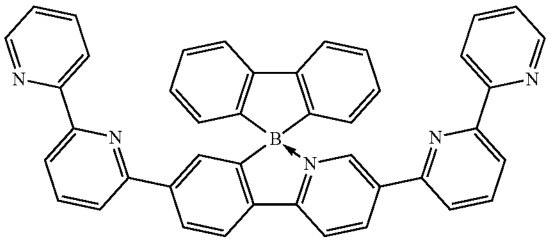

(7)

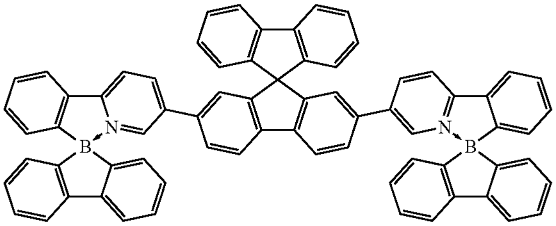

(8)

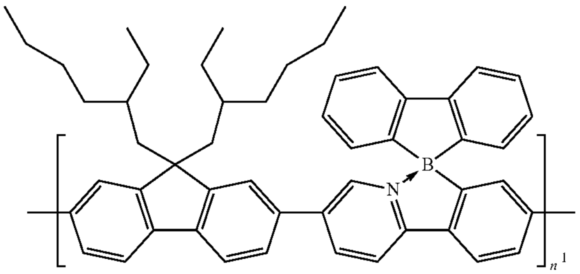

-continued (9)

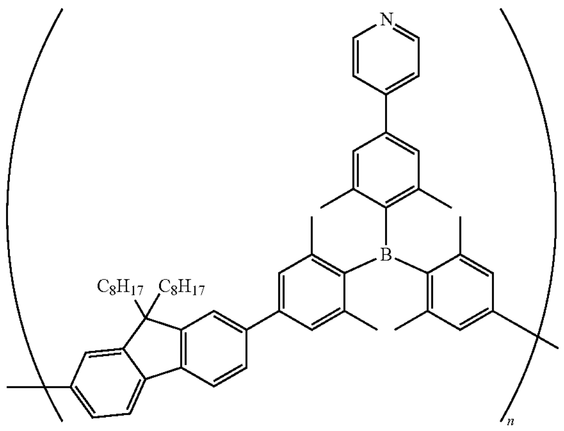

When a boron-containing compound is used as the second material having an electron transport property, a uniform organic thin film is easily obtained by application of a coating composition containing the first material and the second material. The coating composition containing the electron-donating first material of the formula (1) and the second material which transports electrons is another aspect of the present invention. Furthermore, the coating composition containing the electron-donating first material of the formula (1) but free from the second material is also useful. The coating composition containing the electron-donating first material of the formula (1) is another aspect of the present invention.

A boron-containing compound and a triazine derivative are suitable for a material of an electron injection layer of an organic EL device owing to their deep unoccupied molecular orbital (LUMO) levels. Thus, an organic thin film containing a boron-containing compound as the second material is suitable particularly as an electron injection layer of an organic EL device.

The first material and the second material may be present at any ratio in the organic thin film of the present invention, and the ratio may be appropriately determined depending on the types of compounds used as the first material and the second material. The ratio (mass ratio) between the first material and the second material (first material:second material) is preferably 0.1:99.9 to 20:1. The ratio is more preferably 0.5:99.5 to 10:1. With a ratio within the mass ratio indicated above, the electron transport property and the electron injection property are remarkably improved owing to the presence of the first material and the second material in the organic thin film.

The organic thin film of the present invention may be a single film containing the first material and the second material or a laminate film including a film containing at least the first material and a film containing at least the second material. The laminate film may be a laminate film including a film containing only the first material and a film containing only the second material or may be a laminate film including a film containing the first material and the second material and a film containing either the first material or the second material. In the laminate film including a film containing the first material and the second material and a film containing either the first material or the second material, the film containing either the first material or the second material may contain either the first material or the second material, and preferably contains the second material.

When such an organic thin film is used in an organic electroluminescence device as a constituent layer, either the film containing the first material and the second material or the film containing either the first material or the second material may be located on a cathode side, and preferably, the film containing either the first material or the second material is located on the cathode side.

When the organic thin film of the present invention is a laminate film including a film containing the first material and the second material and a film containing only the first material, the first material is present in the both two films of the laminate. The first material may be the same or different between the two films.

When the organic thin film of the present invention is a laminate film including a film containing the first material and the second material and a film containing only the second material, the second material is present in the both two films of the laminate. The second material may be the same or different between the two films.

The organic thin film of the present invention may contain a different component as long as it contains at least the first material and the second material. The sum of the first material and the second material preferably accounts for more than 95% by mass, more preferably more than 99% by mass of the entire organic thin film. Most preferably, the sum accounts for 100% by mass of the entire organic thin film, i.e., the organic thin film consists only of the first material and the second material.

In a preferred embodiment of the present invention, the organic thin film of the present invention contains a metal oxide. The organic electroluminescence device of the present invention may include a metal oxide layer. As described later, it has been reported that, in both the case where a metal film is formed on the organic thin film and the case where an organic thin film is formed on the cathode, the metal diffuses toward the organic thin film by a distance of several nanometers. Thus, when the organic electroluminescent device of the present invention contains a metal oxide as a material for a cathode or a metal oxide layer and the organic thin film of the present invention is formed adjacent to the metal oxide layer, the organic thin film is caused to contain a metal oxide. In a preferred embodiment of the present invention, the organic thin film contains a metal oxide.

The first material alone can impart an excellent electron injection property. Such an organic thin film containing the first material but free from the second material is another aspect of the present invention.

Thus, an organic thin film containing at least the first material is the organic thin film of the present invention. And a single film further containing the second material, that is, a single film containing the first material and the second material, or a laminate film including a film containing the first material and a film containing the second material are preferred embodiments of the present invention. In the organic thin film of the present invention containing the first material but free from the second material, the first material preferably accounts for more than 95% by mass, more preferably more than 99% by mass of the entire organic thin film. Most preferably, the first material accounts for 100% by mass of the entire organic thin film, i.e., the organic thin film consists of the first material. The following describes a method for producing an organic thin film which is a single film containing the first material and the second material or a laminate film including a film containing the first material and a film containing the second material. An organic thin film containing the first material but free from the second material can be produced by the same method using the same materials, except that no second material is contained.

"Method for Producing Organic Thin Film"

The following describes a method for producing an organic thin film of the present invention with examples.

The organic thin film of the present invention contains a first material which is an electron-donating compound having a structure of the formula (1) and a second material which transports electrons. Due to the relatively large molecular weights of the first material and the second material, the organic thin film of the present invention can be formed not only by application but also by evaporation. Thus, an organic EL device including the organic thin film of the present invention can be produced with little restriction on the production process, and the organic thin film can be easily used as materials of layers constituting the organic EL device.

When the organic thin film is produced by evaporation, it may be produced by the same evaporation as in the production of the other layers constituting the organic EL device. The first material and the second material may be evaporated simultaneously or sequentially. When the first material and the second material are evaporated sequentially, either of them may be evaporated first. Alternatively, either the first material or the second material may be evaporated, followed by co-evaporation of both of them, or both the first material and the second material may be co-evaporated, followed by evaporation of either of them. In a preferred embodiment of the method for producing an organic thin film of the present invention, the method for producing an organic thin film includes simultaneous evaporation of the first material which is a compound having a structure of the formula (1) and the second material which transports electrons, on a surface on which the organic thin film is to be formed. In another preferred embodiment of the method for producing an organic thin film of the present invention, the method for producing an organic thin film includes evaporation of one of the first material or the second material on a surface on which the organic thin film is to be formed, followed by evaporation of the other material or both of the materials, or the method for producing an organic thin film includes simultaneous evaporation of the first material and the second material on a surface on which the organic thin film is to be formed, followed by evaporation of either the first material or the second material.

The organic thin film of the present invention can also be produced by application. In this case, the organic thin film can be produced by a method including preparing a coating composition containing the first material and the second material which transports electrons and applying the coating composition or a method including preparing a coating composition containing the first material and a coating composition containing the second material and sequentially applying them. When the coating composition containing the first material and the coating composition containing the second material are applied sequentially, either of them may be applied first. Alternatively, the coating composition containing either of the materials may be applied, followed by application of the coating composition containing both of the materials, or the coating composition containing both of the materials may be applied, followed by application of the coating composition containing either of the materials. In a preferred embodiment of the method for producing an organic thin film of the present invention, the method for producing an organic thin film includes application of a coating composition containing the first material which is a compound having a structure of the formula (1) and the second material which transports electrons on a surface on which the organic thin film is to be formed. In another preferred embodiment of the method for producing an organic thin film of the present invention, the method for producing an organic thin film includes application of one of a coating composition containing only the first material or a coating composition containing only the second material to a surface on which the organic thin film is to be formed to form a coat, followed by application of the other coating composition or a coating composition containing both of the materials to the coat, or the method for producing an organic thin film includes application of the coating composition containing both of the first material and the second material to form a coat, followed by application of the coating composition containing either the first material or the second material to the coat.

The following describes the method for producing an organic thin film including preparing a coating composition containing the first material which is a compound having a structure of the formula (1) and the second material which transports electrons and applying the coating composition.

The coating composition may be obtained by adding predetermined amounts of the first material and the second material to a solvent in a vessel and stirring the contents for dissolution, for example.

Examples of the solvent to dissolve the first material and the second material include inorganic solvents, organic solvents, and solvent mixtures containing any of these solvents.

Examples of the inorganic solvents include nitric acid, sulfuric acid, ammonia, hydrogen peroxide, water, carbon disulfide, carbon tetrachloride, and ethylene carbonate.

Examples of the organic solvents include ketone-based solvents such as methyl ethyl ketone (MEK), acetone, diethyl ketone, methyl isobutyl ketone (MIBK), methyl isopropyl ketone (MIPK), diisobutyl ketone, 3,5,5-trimethylcyclohexanone, diacetone alcohol, cyclopentanone, and cyclohexanone; alcohol-based solvents such as methanol, ethanol, isopropanol, ethylene glycol, diethylene glycol (DEG), and glycerine; ether-based solvents such as diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (carbitol); cellosolve-based solvents such as methyl cellosolve, ethyl cellosolve, and phenyl cellosolve; aliphatic hydrocarbon-based solvents such as hexane, pentane, heptane, and cyclohexane; aromatic hydrocarbon-based solvents such as toluene, xylene, and benzene; aromatic heterocyclic compound-based solvents such as pyridine, pyrazine, furan, pyrrole, thiophene, and methylpyrrolidone; amide-based solvents such as N,N-dimethylformamide (DMF) and N,N-dimethylacetamide (DMA); halogen compound-based solvents such as chlorobenzene, dichloromethane, chloroform, and 1,2-dichloroethane; ester-based solvents such as ethyl acetate, methyl acetate, and ethyl formate; sulfur compound-based solvents such as dimethyl sulfoxide (DMSO) and sulfolane; nitrile-based solvents such as acetonitrile, propionitrile, and acrylonitrile; and organic acid-based solvents such as formic acid, acetic acid, trichloroacetic acid, and trifluoroacetic acid. Preferred among these are ketone-based solvents such as methyl ethyl ketone (MEK), acetone, diethyl ketone, methyl isobutyl ketone (MIBK), methyl isopropyl ketone (MIPK), diisobutyl ketone, 3,5,5-trimethylcyclohexanone, diacetone alcohol, and cyclopentanone.

Various methods can be used to apply the coating composition containing the first material and the second material, and examples thereof include a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, and an inkjet printing method.

After the application of the coating composition by such a method, the coating composition is preferably annealed at 70° C. to 200° C. for 0.1 to 5 hours in a nitrogen atmosphere or in the air atmosphere. Such annealing can vaporise solvents, forming an organic thin film.

An organic thin film containing the electron-donating first material of the formula (1) but free from the second material is also useful as a material of organic EL devices and the like. A method for producing an organic thin film including forming a film containing such an electron-donating first material of the formula (1) on a surface on which the organic thin film is to be formed is another aspect of the present invention, and in a preferred embodiment of the method for producing an organic thin film, the method includes forming a film containing such an electron-donating first material of the formula (1) on a surface on which the organic thin film is to be formed containing the second material.

"Organic EL Device"

The present invention also relates to an organic electroluminescence (EL) device including a cathode, an anode, a light emitting layer therebetween, and a layer of the organic thin film of the present invention, a layer of a laminate film including the layer of the organic thin film and a metal oxide layer, or a layer containing the organic electroluminescence device material of the present invention.

The layer of the organic thin film, the layer of a laminate film including the layer of the organic thin film and a metal oxide layer, or the layer containing the organic electroluminescence device material of the present invention may be present between the cathode and the emitting layer or between the anode and the emitting layer in the organic EL device of the present invention, preferably between the cathode and the emitting layer.

The layer containing the organic electroluminescence device material of the present invention may contain a different component as long as it contains a compound having a structure of the formula (1). Preferably, it consists of the compound having a structure of the formula (1).

The present invention also relates to an organic electroluminescence (EL) device including a cathode, an anode, an emitting layer therebetween, and a layer of the organic thin film of the present invention or a layer of a laminate film including the layer of the organic thin film and a metal oxide layer between the cathode and the anode, with the light emitting layer containing the second material. The present invention also relates to an organic electroluminescence (EL) device including a layer of the organic thin film of the present invention or a layer of a laminate film including the layer of the organic thin film and a metal oxide layer between the cathode and the anode. The organic thin film or the laminate film is adjacent to the emitting layer and contains a material to be used as the second material in an emitting layer, or the organic thin film or the laminate film contains the second material and serves as an emitting layer.

The compound of the formula (1) which serves as the first material in the present invention is remarkably excellent in electron injection property and thus can directly inject electrons into an emitting material and a host material to be used for an emitting layer. Thus, use of the first material in the present invention for the electron injection layer enables reduction in the number of materials to be used and enables reduction in the number of layers to be laminated, leading to simplification of the structure of the organic EL device.

In other words, even in a device including the organic thin film or the laminate film of the present invention in which a layer containing the first material, a layer containing the second material, and an emitting layer are adjacent to each other, and an emitting material or a host material for an emitting layer is used as a material of the layer containing the second material, electrons can be injected from the layer containing the first material, and the layer containing the second material and the emitting layer can be formed using the same material, whereby the number of materials to be used can be reduced. In this case, the second material may be either an emitting material or a host material of an emitting layer. When a layer containing the second material formed from an emitting material or a host material of an emitting layer is used as an emitting layer, formation of an additional emitting layer can be eliminated, whereby the number of layers to be laminated can be reduced and an organic EL device having a simpler structure can be provided. Further, when the second material is used for a layer between the emitting layer and the anode and adjacent to the emitting layer, the number of layers to be laminated can be further reduced and an organic EL device having a simpler structure can be provided. Thus, in a preferred embodiment of the organic electroluminescence (EL) device of the present invention, the emitting layer contains the second material, and a layer containing the second material is present between the anode and the emitting layer.

The following specifically describes the organic EL device of the present invention with examples.

Figure 4:
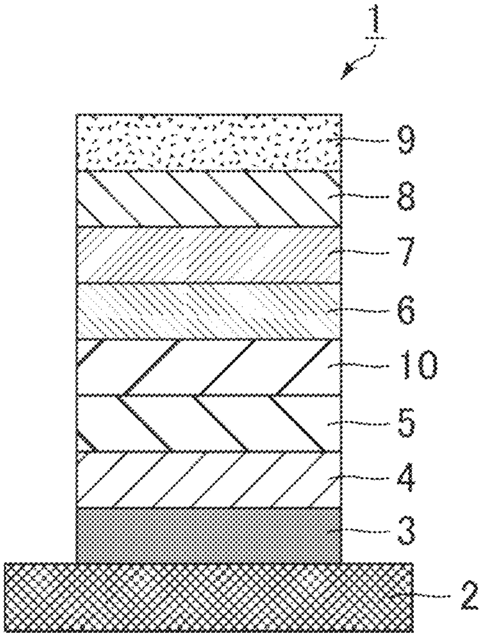
FIG. 4 is an explanatory schematic cross-sectional view illustrating an exemplary organic EL device of the present invention.

FIG. 4 is an explanatory schematic cross-sectional view illustrating an exemplary organic EL device of the present invention. An organic EL device 1 of the present embodiment illustrated in FIG. 4 includes a cathode 3, an anode 9, and an emitting layer 6 therebetween. The organic EL device 1 illustrated in FIG. 4 includes an electron injection layer 5 made of the organic thin film of the present invention or the organic electroluminescence device material of the present invention between the cathode 3 and the emitting layer 6. An oxide layer 4 is present between the cathode 3 and the organic thin film of the present invention or the electron injection layer 5 made of the organic electroluminescence device material of the present invention, and the oxide layer 4 is adjacent to the electron injection layer 5. These features are included in preferred embodiments of the organic EL device of the present invention.

The organic EL device 1 of the present embodiment has a laminate structure in which the following layers are formed on a substrate 2 in the stated order: the cathode 3, the inorganic oxide layer 4, the electron injection layer 5, an electron transport layer 10, the emitting layer 6, a hole transport layer 7, a hole injection layer 8, and the anode 9. In a preferred embodiment of the organic EL device of the present invention, an inorganic oxide layer is present between the cathode and a layer of the organic thin film or a layer of the organic electroluminescence device material of the present invention.

The organic EL device 1 illustrated in FIG. 4 is an inverted organic EL device including the cathode 3 between the substrate 2 and the emitting layer 6. Also, the organic EL device 1 illustrated in FIG. 4 is an organic-inorganic hybrid organic electroluminescence device (HOILED device) in which one or more of the layers that constitute the organic EL device (at least the inorganic oxide layer 4) is formed from an inorganic compound.

The organic EL device 1 illustrated in FIG. 4 may be a top emission device in which light is extracted from the side opposite to the substrate 2, or may be a bottom emission device in which light is extracted from a substrate 2 side.

Figure 5:
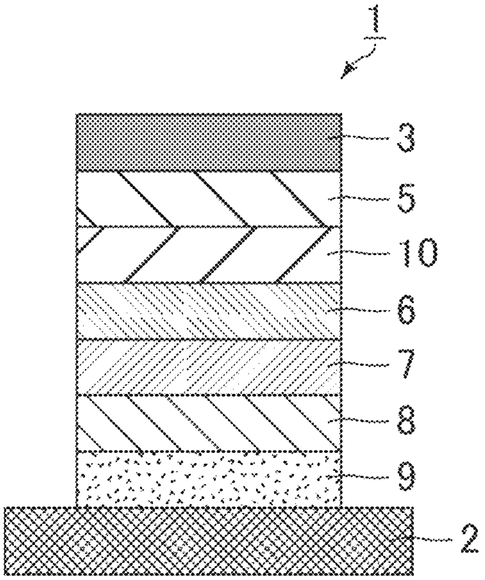
FIG. 5 is an explanatory schematic cross-sectional view illustrating an exemplary organic EL device of the present invention.

FIG. 5 illustrates an exemplary device structure of the organic EL device of the present invention, which is a conventional organic EL device, in which the emitting layer 6 is present between the substrate 2 and the cathode 3.

Figure 6:
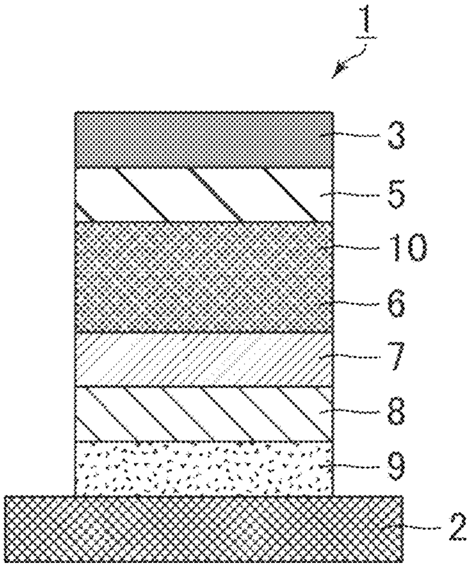
FIG. 6 is a schematic cross-sectional view illustrating another exemplary laminate structure of the organic EL device of the present invention.

As described above, a compound of the formula (1) in the present invention is remarkably excellent in electron injection property and thus can directly inject electrons into a material used for an emitting layer. Thus, when an organic EL device material containing a compound of the formula (1) in the present invention is used and this compound of the formula (1) is used for the electron injection layer 5, even an organic EL device having a simple structure in which the electron transport layer 10 is made of a material used for an emitting layer and the emitting layer 6 and the electron transport layer 10 are made of the same material, as illustrated in FIG. 6, can be driven with a low voltage. Such a device can be produced using one or more fewer materials than a typical organic EL device. Here, when the electron transport layer 10 contains the second material in the present invention, the organic EL device can be said to include the organic thin film of the present invention.

Figure 7:
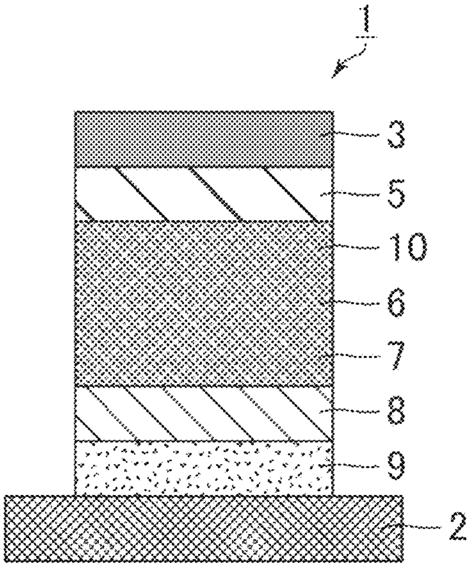
FIG. 7 is a schematic cross-sectional view illustrating another exemplary laminate structure of the organic EL device of the present invention.

Further, the hole injection layer 8 can relatively easily inject holes into a material used for an emitting layer. Thus, even a device in which a material used for an emitting layer is used for a hole transport layer 7, as illustrate in FIG. 7, and the organic EL device material containing a compound of the formula (1) in the present invention is used for the electron injection layer 5, can be driven with a low voltage. Such a device can be produced using two or more fewer materials than a typical organic EL device. When the electron transport layer 10 contains the second material in the present invention, the organic EL device can be said to include the organic thin film of the present invention.

The above describes a conventional organic EL device with reference to figures. The organic EL device of the present invention in which the emitting layer contains the second material is not limited to a conventional organic EL device, but may be an inverted organic EL device.

The organic EL device will be described with an inverted organic EL device 1 as an example in the present embodiment described below. The organic EL device of the present invention may be a conventional organic EL device in which the anode is present between the substrate and the emitting layer. When the organic EL device of the present invention is a conventional organic EL device, it also has the organic thin film between the cathode and the emitting layer like an inverted organic EL device. In an inverted organic EL device, the electron injection layer may also be referred to as an organic buffer layer. The following describes materials and thicknesses of the layers constituting the organic EL device 1 and a sealing method of the organic EL device 1, which can also be applied to a conventional organic EL device, except for the materials of a cathode and an anode described below. All of the contents described below shall be applied to conventional organic EL devices.

"Substrate"

The substrate 2 is made of, for example, a resin material or a glass material.

Examples of the resin material of the substrate 2 include polyethylene terephthalate, polyethylene naphthalate, polypropylene, cycloolefin polymers, polyamides, polyethersulfone, polymethylmethacrylate, polycarbonate, and polyarylate. The substrate 2 made of a resin material is preferred because it makes the organic EL device 1 to be highly flexible.

Examples of the glass material of the substrate 2 include silica glass and soda glass.

When the organic EL device 1 is a bottom emission device, a transparent substrate may be used as the material of the substrate 2.

When the organic EL device 1 is a top emission device, not only a transparent substrate but also an opaque substrate may be used as the material of the substrate 2. Examples of the opaque substrate include a substrate made of a ceramic material such as alumina, a substrate in which an oxide film (insulating film) is formed on the surface of a metal plate such as a stainless steel plate, and a substrate made of a resin material.

The average thickness of the substrate 2 may be determined according to, for example, the material of the substrate 2, and is preferably 0.1 to 30 mm, more preferably 0.1 to 10 mm. The average thickness of the substrate 2 can be measured with a digital multimeter or a caliper.

"Cathode"

The cathode 3 is formed in direct contact with the substrate 2.

Examples of a material of the cathode 3 include conductive materials, including an oxide such as indium tin oxide (ITO), indium zinc oxide (IZO), fluorine tin oxide (FTO), $In_3O_3$, $SnO_2$, Sb-containing $SnO_2$, or Al-containing ZnO; Al, Au, Pt, Ag, and Cu; and an alloy containing any of these. Preferred among these materials of the cathode 3 are ITO, IZO, FTO, and Al.

The average thickness of the cathode 3 is not limited, and is preferably 10 to 500 nm, more preferably 100 to 200 nm.

The average thickness of the cathode 3 can be measured with a stylus profiler or a spectroscopic ellipsometer.

When the organic EL device of the present invention is a conventional organic EL device in which the anode is present between the substrate and the emitting layer, these materials can be used as an anode material. In this case, the average thickness of the anode is preferably the same as that of the cathode 3.

"Oxide Layer"

The inorganic oxide layer 4 functions as an electron injection layer and/or a cathode. The oxide layer 4 is a layer including a thin semiconductor film and/or a thin insulating film. Specifically, the oxide layer 4 may be a layer consisting of a single metal oxide; a laminate of layers each consisting of a combination of two or more different metal oxides, a laminate of layers each consisting of a single metal oxide, or a laminate of a layer(s) each consisting of a combination of two or more different metal oxides and a layer(s) consisting of a single metal oxide; or a layer consisting of a combination of two or more different metal oxides.

Examples of a metal element of the metal oxide that forms the oxide layer 4 include magnesium, calcium, strontium, barium, titanium, zirconium, hafnium, vanadium, niobium, tantalum, chromium, molybdenum, tungsten, manganese, indium, gallium, iron, cobalt, nickel, copper, zinc, cadmium, aluminum, and silicon.

When the oxide layer 4 includes a layer consisting of a combination of two or more different metal oxides, at least one of the metal elements of the metal oxides is preferably magnesium, aluminum, calcium, zirconium, hafnium, silicon, titanium, or zinc.

When the oxide layer 4 is a layer consisting of a single metal oxide, the metal oxide is preferably selected from the group consisting of magnesium oxide, aluminum oxide, zirconium oxide, hafnium oxide, silicon oxide, titanium oxide, and zinc oxide.

When the oxide layer 4 is a laminate of layers each consisting of a combination of two or more different metal oxides, a laminate of layers each consisting of a single metal oxide, a laminate of a layer(s) each consisting of a combination of two or more different metal oxides and a layer(s) consisting of a single metal oxide, or a layer consisting of a combination of two or more different metal oxides, two different metal oxides may be laminated and/or combined selected as a combination from, for example, titanium oxide/zinc oxide, titanium oxide/magnesium oxide, titanium oxide/zirconium oxide, titanium oxide/aluminum oxide, titanium oxide/hafnium oxide, titanium oxide/silicon oxide, zinc oxide/magnesium oxide, zinc oxide/zirconium oxide, zinc oxide/hafnium oxide, zinc oxide/silicon oxide, and calcium oxide/aluminum oxide; and three different metal oxides may be laminated and/or combined selected as a combination from, for example, titanium oxide/zinc oxide/magnesium oxide, titanium oxide/zinc oxide/zirconium oxide, titanium oxide/zinc oxide/aluminum oxide, titanium oxide/zinc oxide/hafnium oxide, titanium oxide/zinc oxide/silicon oxide, and indium oxide/gallium oxide/zinc oxide.

The oxide layer 4 may optionally contain indium gallium zinc oxide (IGZO) which is an oxide semiconductor with a particular composition and good characteristics and/or a $12CaO \cdot 7Al_2O_3$ electride.

The average thickness of the oxide layer 4 is not limited, and is preferably 1 to 1000 nm, more preferably 2 to 100 nm.

The average thickness of the oxide layer 4 can be measured with a stylus profiler or a spectroscopic ellipsometer.

"Electron Injection Layer"

The electron injection layer 5 improves the injection rate of electrons from the cathode to the emitting layer 6 and the electron transport property. The electron injection layer 5 includes the organic thin film.

The average thickness of the electron injection layer 5 is preferably 0.5 to 100 nm, more preferably 1 to 100 nm, still more preferably 5 to 100 nm, particularly preferably 10 to 50 nm. In the case of forming an electron injection layer 5 having an average thickness of 0.5 nm or greater, the electron injection layer 5 may be formed by applying a coating composition containing the first material and the second material or by sequentially applying a coating composition containing the first material and a coating composition containing the second material. In this case, the resulting electron injection layer 5 has a smooth surface. Alternatively, the electron injection layer 5 containing the first material and the second material is obtained by co-evaporation of the first material and the second material by a vacuum evaporation method. In the case of forming an electron injection layer 5 having an average thickness of 100 nm or smaller, an increase in the voltage for driving the organic EL device 1 due to the formation of the electron injection layer 5 can be sufficiently prevented.

Figures 1, 8:
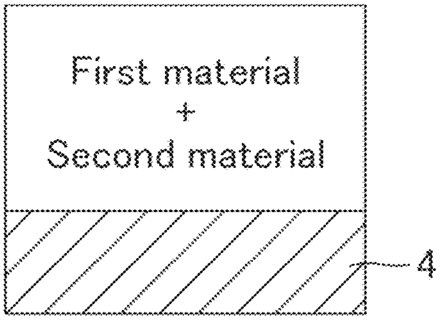
Figures 2, 8:
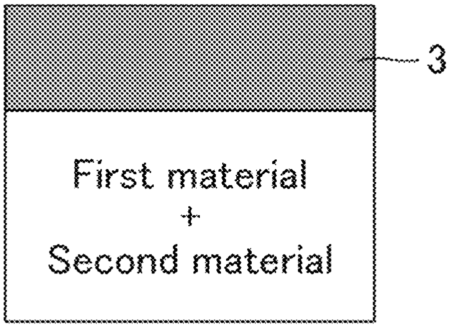
Figures 1, 9:
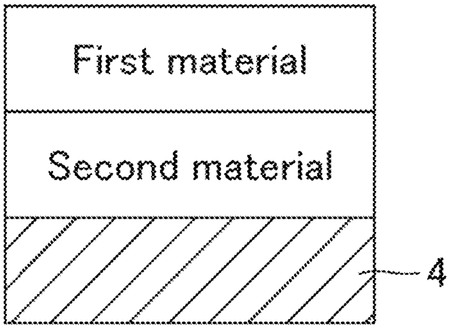
Figures 2, 9:
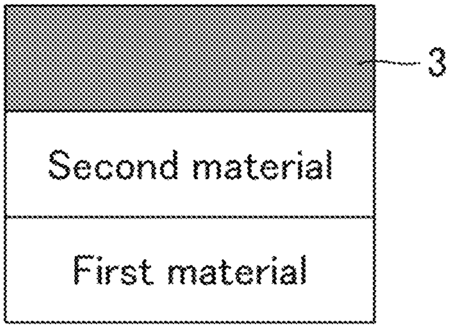
Figures 1, 10:
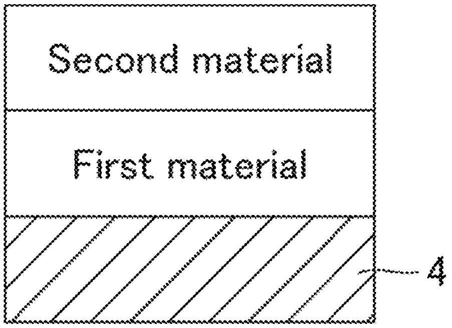
Figures 2, 10:
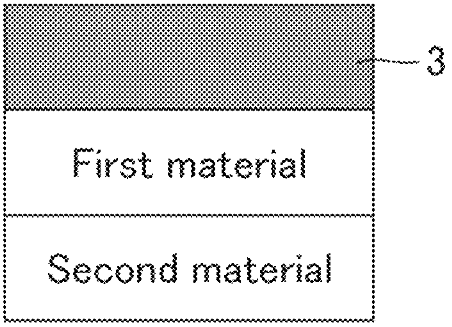
Figures 1, 11:
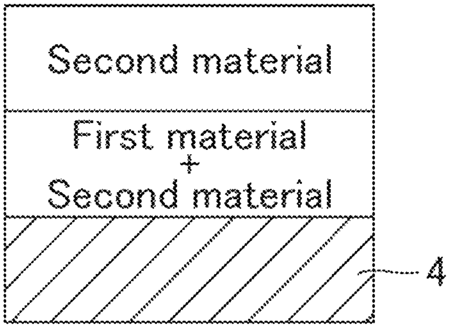
Figures 2, 11:
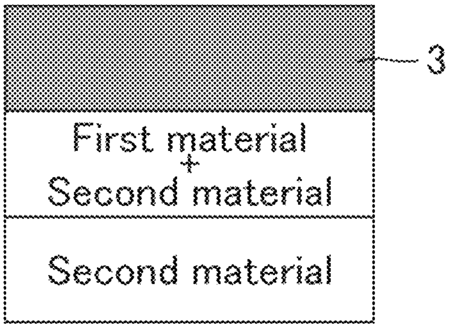
Figures 1, 12:
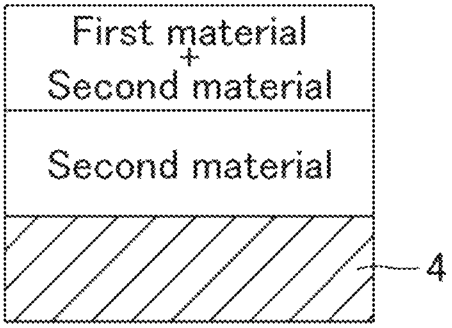
Figures 2, 12:
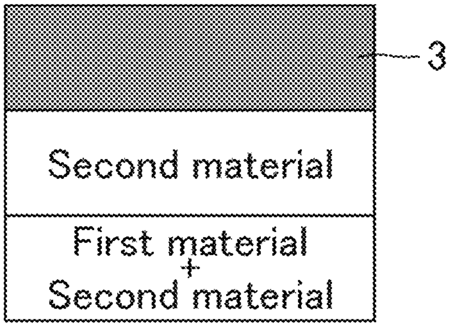
Figures 1, 13:
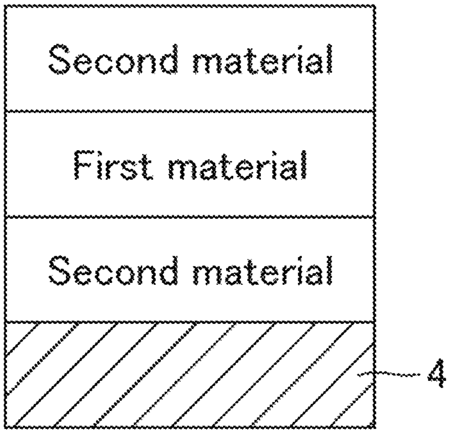
Figures 2, 13:
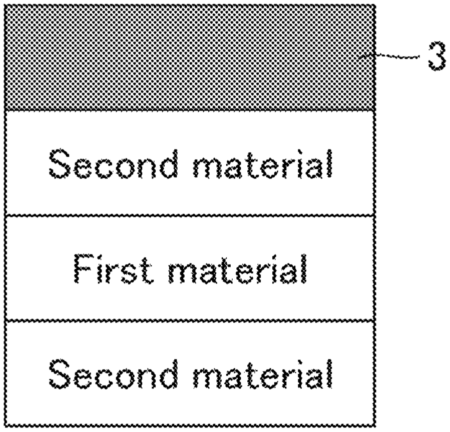
Figures 1, 14:
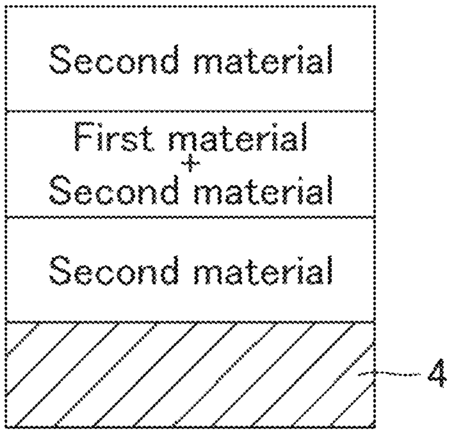
Figures 2, 14:
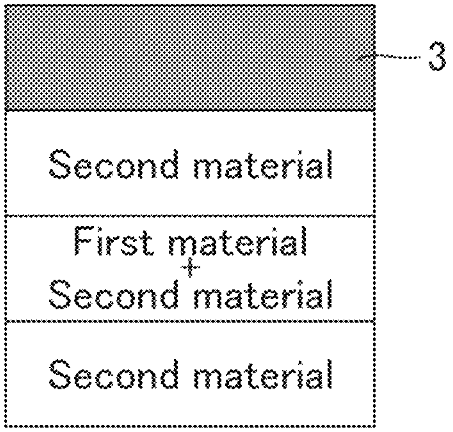

A film containing the first material and the second material may have any of the structures illustrated in FIGS. 8-1 to 14-1 (FIGS. 8-2 to 14-2 in the case of a conventional structure). For example, a single layer of the film containing the first material and the second material as a whole may constitute an electron injection layer (FIGS. 8-1 and 8-2), or one of a film consisting of the first material or a film consisting of the second material may be formed adjacent to the cathode or the oxide, and the other film may be formed adjacent to the film (FIGS. 9-1, 9-2, 10-1, and 10-2). A film containing the first material and the second material may be formed adjacent to the cathode or the oxide, and a film consisting of the second material may be formed adjacent to the film (FIGS. 11-1 and 11-2), or a film consisting of the second material, free from the first material, may be formed adjacent to the cathode or the oxide, and a film containing the first material and the second material may be formed adjacent to the film (FIGS. 12-1 and 12-2). Furthermore, a film consisting of the first material or a film containing the first material and the second material may be present between films each consisting of the second material to have a three-layer structure (FIGS. 13-1, 13-2, 14-1, and 14-2). The films of the present invention encompass the films having the structures illustrated in FIGS. 8-1 to 14-1 and FIGS. 8-2 to 14-2. When the second material is contained in both two adjacent films or in two or more films of a three-layer structure as illustrated in FIGS. 11-1 to 14-1 and FIGS. 11-2 to 14-2, the second material may be the same or different between these two or more films. Of these structures, in the structures including a layer consisting of the first material as illustrated in FIGS. 9-1, 9-2, 10-1, 10-2, 13-1, and 13-2, the layer consisting of the first material may be regarded as a layer made of the organic thin film of the present invention (organic thin film consisting of the first material, free from the second material).

The average thickness of the electron injection layer 5 can be measured, for example, with a stylus profiler or a spectroscopic ellipsometer.

As described above, the first material which is an electron-donating organic material is capable of generating a negative charge on other materials. Thus, a larger amount of the first material is preferably present on a cathode 3 side or an oxide layer 4 side in order to sufficiently facilitate electron injection from the cathode 3 or the oxide layer 4. Since the negative charge can contribute to the facilitation of electron injection even when it is not in direct contact with the oxide or the cathode, the effect of electron injection due to the presence of the first material can be obtained even in the laminate structures shown in FIGS. 9-1, 9-2, 12-1, 12-2, 13-1, 13-2, 14-1, and 14-2. It has been reported that, in both the case where metal is evaporated on the organic thin film and the case where an organic thin film is evaporated on the cathode, the metal diffuses toward the organic thin film by a distance of several nanometers (see Lee, J. H., Yi, Y. & Moon, D. W. Direct evidence of Al diffusion into tris-(8-hydroquinoline) aluminum layer: medium energy ion scattering analysis. Applied Physics Letters 93, doi:10.1063/1.3002290 (2008) and Non-Patent Literature 12). Owing to the diffusion of the metal, the effect of electron injection due to the coordination reaction with the first material can be obtained even in a laminate structure in which the second material is present on the cathode 3 side. In other words, the effect of the present invention can be obtained without directly forming the first material on the cathode 3 or the oxide layer 4.

As described above, the first material which is an electron-donating organic material is capable of generating a negative charge on other materials. For sufficiently providing the effect of the organic thin film of the present invention, the organic thin film of the present invention is preferably formed such that a layer containing the first material is adjacent to the cathode or oxide layer (FIGS. 8-1, 8-2, 10-1, 10-2, 11-1, and 11-2). However, the effect can be obtained even when a layer containing the first material is not directly formed adjacent to the cathode or oxide layer as illustrated in FIGS. 9-1, 9-2, 12-1, 12-2, 13-1, 13-2, 14-1, and 14-2. The thus obtained films having a laminate structure, that is, a laminate film including an oxide layer and a layer of the organic thin film of the present invention formed adjacent to the oxide layer and a laminate film including a cathode and the layer of the organic thin film of the present invention formed adjacent to the cathode are also another aspect of the present invention.

When the organic EL device has a laminate structure including an oxide layer and a layer of the organic thin film of the present invention formed adjacent to the oxide layer or a laminate structure including a cathode and a layer of the organic thin film of the present invention formed adjacent to the cathode, the organic EL device can be said to include the laminate film of the present invention. Such an organic EL device including the laminate film of the present invention is also another aspect of the present invention.

The organic EL device of the present invention may include a laminate film as illustrated in FIG. 11-1, 11-2, 12-1, 12-2, 14-1, or 14-2 as an electron injection layer. In other words, in a preferred embodiment of the organic EL device of the present invention, a laminate film including a film containing the first material and the second material and a film containing the second material is present between the cathode and the emitting layer.

In such a preferred embodiment of the organic EL device of the present invention, the organic EL device includes a layer containing the second material between the emitting layer and the film containing the first material and the second material, or the organic EL device includes a layer containing the second material between the cathode and the film containing the first material and the second material.

"Electron Transport Material"

The material of the electron transport layer 10 can be any material that can be commonly used as a material of an electron transport layer.

Specific examples of the material of the electron transport layer 10 include phosphine oxide derivatives such as phenyl-dipyrenylphosphine oxide ($POPy_2$); pyridine derivatives such as tris-1,3,5-(3'-(pyridin-3"-yl)phenyl)benzene (TmPhPyB); quinoline derivatives such as (2-(3-(9-carbazolyl)phenyl)quinoline (mCQ)); pyrimidine derivatives such as 2-phenyl-4,6-bis(3,5-dipyridylphenyl)pyrimidine (BPyPPM); pyrazine derivatives; phenanthroline derivatives such as bathophenanthroline (BPhen); triazine derivatives such as 2,4-bis(4-biphenyl)-6-(4'-(2-pyridinyl)-4-biphenyl)-[1,3,5]triazine (MPT); triazole derivatives such as 3-phenyl-4-(1'-naphthyl)-5-phenyl-1,2,4-triazole (TAZ); oxazole derivatives; oxadiazole derivatives such as 2-(4-biphenyl)-5-(4-tert-butylphenyl-1,3,4-oxadiazole) (PBD); imidazole derivatives such as 2,2',2"-(1,3,5-benzenetriyl)-tris(1-phenyl-1-H-benzimidazole) (TPBI); aromatic carboxylic anhydrides such as naphthalene-1,4,5,8-tetracarboxylic dianhydride and 3,4,9,10-perylene tetracarboxylic dianhydride; aromatic imide compounds such as N,N'-dimethyl-3,4,9,10-perylene tetracarboxylic imide; carbonyl-containing compounds such as an isoindigo derivative, a 2,5-dihydropyrrolo[3,4-c]pyrrole-1,4-dione derivative (diketopyrrolopyrrole), and truxenone; 1,2,5-thiadiazole derivatives such as naphtho[1,2-c:5,6-c']bis[1,2,5]thiadiazole and benzo[c][1,2,5]thiadiazole; various metal complexes typified by bis[2-(2-hydroxyphenyl)benzothiazolato]zinc ($Zn(BTZ)_2$) and tris(8-hydroxyquinolinato)aluminum ($Alq_3$); organic silane derivatives typified by silole derivatives such as 2,5-bis(6'-(2',2"-bipyridyl))-1,1-dimethyl-3,4-diphenylsilole (PyPySPyPy); and boron-containing compounds such as tris(2,4,6-trimethyl-3-(pyridin-3-yl)phenyl)borane (3TPYMB) and compounds disclosed in Japanese Patent Application No. 2012-228460, Japanese Patent Application No. 2015-503053, Japanese Patent Application No. 2015-053872, Japanese Patent Application No. 2015-081108, and Japanese Patent Application No. 2015-081109. One or two or more of these may be used.

Particularly preferred among the materials of the electron transport layer 10 are phosphine oxide derivatives such as $POPy_2$, metal complexes such as $Alq_3$, and pyridine derivatives such as TmPhPyB.

The organic EL device of the present invention may not include an electron transport layer containing the electron transport material as described above in the laminate structure, as long as the organic EL device functions like an organic EL device including a layer containing the second material formed from an emitting material or a host material used for an emitting layer.

When the organic EL device of the present invention includes an organic thin film consisting of the first material as an electron injection layer, the second material of the organic thin film of the present invention can be used as the material of the electron transport layer 10.

When the organic EL device of the present invention includes a single film containing the first material and the second material as the electron injection layer 5, the electron transport layer 10 may be omitted.

The average thickness of the electron transport layer 10 is not limited, and is preferably 10 to 150 nm, more preferably 20 to 100 nm.

The average thickness of the electron transport layer 10 can be measured with a stylus profiler or a spectroscopic ellipsometer.

"Emitting Layer"

The emitting layer 6 may be made of any material that can be commonly used for the emitting layer 6 or may be made of a mixture of these materials. Specifically, for example, the emitting layer 6 may contain bis[2-(2-benzothiazolyl)phenolato]zinc(II) ($Zn(BTZ)_2$) and tris[1-phenylisoquinoline]iridium(III) ($Ir(piq)_3$).

The material of the emitting layer 6 may be a low-molecular compound or a high-molecular compound. The term "low-molecular material" as used herein refers to a material that is not a high-molecular material (polymer), and does not necessarily refer to a low molecular weight organic compound.

Examples of the high-molecular material of the emitting layer 6 include polyacetylene-based compounds such as trans-polyacetylene, cis-polyacetylene, poly(di-phenylacetylene) (PDPA), and poly(alkylphenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly(para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT) and poly(oxypropylene) triol (POPT); polyfluorene-based compounds such as poly(9,9-dialkylfluorene) (PDAF), poly(dioctylfluorene-alt-benzothiadiazole) (F8BT), α,ω-bis[N,N'-di(methylphenyl)aminophenyl]-poly[9,9-bis(2-ethylhexyl)fluorene-2,7-diyl] (PF2/6am4), and poly(9,9-dioctyl-2,7-divinylenefluorenyl-ortho-co(anthracene-9,10-diyl); polyparaphenylene-based compounds such as poly(para-phenylene) (PPP) and poly(1,5-dialkoxy-para-phenylene) (RO-PPP); polycarbazole-based compounds such as poly(N-vinylcarbazole) (PVK); polysilane-based compounds such as poly(methylphenylsilane) (PMPS), poly(naphthylphenylsilane) (PNPS), and poly(biphenylylphenylsilane) (PBPS); and boron compound-based high-molecular materials disclosed in Japanese Patent Application No. 2010-230995 and Japanese Patent Application No. 2011-6457.

Examples of the low-molecular material of the emitting layer 6 include various metal complexes such as a tridentate iridium complex having 2,2'-bipyridine-4,4'-dicarboxylic acid as a ligand, fac-tris(2-phenylpyridine)iridium ($Ir(ppy)_3$), fac-tris(3-methyl-2-phenylpyridinato-N,C2'-)iridium(III) ($Ir(mppy)_3$), 8-hydroxyquinoline aluminum ($Alq_3$), tris(4-methyl-8-quinolinolato)aluminum(III) ($Almq_3$), 8-hydroxyquinoline zinc ($Znq_2$), (1,10-phenanthroline)-tris-(4,4,4-trifluoro-1-(2-thienyl)-butane-1,3-dionate)europium(III) ($Eu(TTA)_3(phen)$), and 2,3,7,8,12,13,17,18-octaethyl-21H,23H-porphinplatinum(II); benzene-based compounds such as distyrylbenzene (DSB) and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-di-carboxyimide (BPPC); coronene-based compounds such as coronene; anthracene-based compounds such as anthracene, bisstyrylanthracene, and (9,10-bis(4-(9H-carbazol-9-yl)-2,6-dimethylphenyl))-9,10-diboraanthracene (CzDBA) of the below-described formula (31); pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzoxazolethiophene; benzoxazole-based compounds such as benzoxazole; benzimidazole-based compounds such as benzimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; triazine-based compounds such as 2,4-diphenyl-6-bis((12-phenylindolo) [2,3a]carbazol-11-yl)-1,3,5-triazine (DIC-TRZ) of the following formula (26); spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; and boron compound materials disclosed in JP 2009-155325 A, JP 2011-184430 A, and Japanese Patent Application No. 2011-6458.

Examples of the host material of the emitting layer include a carbazole compound such as 4,4'-bis(9H-carbazol-9-yl)biphenyl (CPB), a silicon compound, a phenanthroline compound, and a triphenylene compound.

The average thickness of the emitting layer 6 is not limited, and is preferably 10 to 150 nm, more preferably 20 to 100 nm.

The average thickness of the emitting layer 6 may be measured with a stylus profiler, or may be measured during formation of the emitting layer 6 with a quartz crystal film thickness monitor.

"Hole Transport Layer"

Examples of a hole transport organic material of the hole transport layer 7 include p-type polymer materials (organic polymers) and p-type low-molecular materials. These materials may be used alone or in combination.

Specific examples of the material of the hole transport layer 7 include N,N'-di(1-naphthyl)-N,N'-diphenyl-1,1'-biphenyl-4,4'-diamine (α-NPD), N4,N4'-bis(dibenzo[b,d]thiophen-4-yl)-N4,N4'-diphenylbiphenyl-4,4'-diamine (DBTPB), N3,N3'''-bis(dibenzo[b,d]thiophene-4-yl)-N3,N3'''-diphenyl-[1,1':2',1":2",1'''-quaterphenyl)-3,3'''-diamine (4DBTP3Q), polyarylamine, fluorene-arylamine copolymers, fluorene-bithiophene copolymers, poly(N-vinylcarbazole), polyvinylpyrene, polyvinylanthracene, polythiophene, polyalkylthiophene, polyhexylthiophene, poly(p-phenylenevinylene), polythienylenevinylene, pyrene formaldehyde resin, ethylcarbazole formaldehyde resin, and derivatives thereof. These materials of the hole transport layer 7 may be used with other compounds as a mixture. An example of a mixture containing polythiophene used as the material of the hole transport layer 7 is poly(3,4-ethylenedioxythiophene/styrenesulfonate) (PEDOT/PSS).

As described above, the hole injection layer can relatively easily inject holes into a material used for an emitting layer. Thus, even a device including a hole transport layer made of a material used for the emitting layer can be driven with a low voltage. Thus, the organic EL device of the present invention is not required to include a hole transport layer made of a hole transport material.

The average thickness of the hole transport layer 7 is not limited, and is preferably 10 to 150 nm, more preferably 20 to 100 nm.

The average thickness of the hole transport layer 7, for example, can be measured with a stylus profiler or a spectroscopic ellipsometer.

"Hole Injection Layer"

The hole injection layer 8 may be made of an inorganic material or an organic material. Since an inorganic material is more stable than an organic material, the use of an inorganic material imparts higher resistance to oxygen and water than the use of an organic material.

Non-limiting examples of the inorganic material include metal oxides such as vanadium oxide ($V_2O_5$), molybdenum oxide ($MoO_3$), and ruthenium oxide ($RuO_2$). These may be used alone or in combination of two or more of these.

Examples of the organic material include a low-molecular-weight material such as dipyrazino(2,3-f:2',3'-h]quinoxaline-2,3,6,7,10,11-hexacarbonitrile (HAT-CN), 2,3,5,6-tetrafluoro-7,7,8,8-tetracyano-quinodimethane (F4-TCNQ), fullerene, and poly(3,4-ethylenedioxythiophene)/polystyrene sulfonate (PEDOT:PSS).

The average thickness of the hole injection layer 8 is not limited, and is preferably 1 to 1000 nm, more preferably 5 to 50 nm.

The average thickness of the hole injection layer 8 can be measured with a quartz crystal thickness monitor, a stylus profiler, or a spectroscopic ellipsometer during film formation.

"Anode"

Examples of a material of the anode 9 include ITO, IZO, Au, Pt, Ag, Cu, Al, and alloys containing any of these. Preferred among these materials of the anode 9 are ITO, IZO, Au, Ag, and Al.

The average thickness of the anode 9 is not limited, and is preferably 10 to 1000 nm, more preferably 30 to 150 nm. Even when the anode 9 is made of an opaque material, the anode 9 having an average thickness of about 10 to 30 nm can be used as a transparent anode for a top emission organic EL device.

The average thickness of the anode 9 can be measured with a quartz crystal film thickness monitor during formation of the anode 9.

These materials in combination with Mg added thereto can be used as a cathode material when the organic EL device of the present invention is a conventional organic EL device. In this case, the average thickness of the cathode is preferably the same as that of the anode 9.

"Sealing"

The organic EL device 1 illustrated in FIG. 4 may be sealed, as required.

For example, the organic EL device 1 illustrated in FIG. 4 may be sealed in a sealing container (not shown) having a recessed space for containing the organic EL device 1 by bonding the edge of the sealing container and the substrate 2 with an adhesive. Alternatively, the organic EL device 1 may be contained in the sealing container and sealed by filling the container with a sealing material made of an ultraviolet (UV) curable resin, for example. Also, for example, the organic EL device 1 illustrated in FIG. 4 may be sealed using sealing members including a plate member (not shown) placed on the anode 9 and a frame member (not shown) placed along an anode 9-side edge of the plate member, with the plate member being bonded to the frame member and the frame member being bonded to the substrate 2 with an adhesive.

When the organic EL device 1 is sealed using the sealing container or the sealing members, a desiccant to absorb moisture may be placed in the sealing container or in the sealing members. Also, the sealing container or the sealing members may be made of a moisture absorbing material. There may be a space in the sealing container or in the sealing members after sealing.

Examples of a material of the sealing container or the sealing members used to seal the organic EL device 1 illustrated in FIG. 4 include a resin material and a glass material. Examples of the resin material and glass material of the sealing container or sealing members include those mentioned as the material of the substrate 2.

When the organic EL device 1 of the present embodiment includes, as an organic thin film, an electron injection layer containing the first material which is an electron-donating organic material of the formula (1) and the second material which is the boron-containing compound of the formula (6), the organic EL device 1 has better durability than an organic EL device including an electron injection layer made of an alkali metal, which is unstable in the air. A sealing container or sealing members having a water vapor transmission rate of about $10^{-4}$ to $10^{-3}$ g/m$^2$/day can sufficiently prevent degradation of the organic EL device 1. Thus, a resin material having a water vapor transmission rate of about $10^{-3}$ g/m$^2$/day or less can be used as the material of the sealing container or sealing members, and the organic EL device 1 with excellent flexibility can be obtained.

"Method for Producing Organic EL Device"

Next, a method for producing the inverted organic EL device 1 illustrated in FIG. 4 will be described as an example of the method for producing an organic EL device of the present invention.

In order to produce the organic EL device 1 illustrated in FIG. 4, first, the cathode 3 is formed on the substrate 2.

The cathode 3 may be formed by, for example, a sputtering method, a vacuum evaporation method, a sol-gel method, a spray pyrolysis deposition (SPD) method, an atomic layer deposition (ALD) method, a vapor deposition method, or a liquid phase deposition method. The cathode 3 may be formed by bonding metal foil.

Next, the inorganic oxide layer 4 is formed on the cathode 3.

The oxide layer 4 is formed by, for example, a spray pyrolysis deposition method, a sol-gel method, a sputtering method, or a vacuum evaporation method. The resulting oxide layer 4 sometimes has an irregular surface, not a smooth surface.

Next, the electron injection layer 5 is formed on the oxide layer 4.

The electron injection layer 5 can be formed by the above-described method for producing an organic thin film.

Next, the electron transport layer 10, the emitting layer 6, and the hole transport layer 7 are formed on the electron injection layer 5 in the stated order.

The electron transport layer 10, the emitting layer 6, and the hole transport layer 7 may be formed by any method, and any of known various forming methods can be appropriately used depending on the properties of the materials of the electron transport layer 10, the emitting layer 6, and the hole transport layer 7.

Specific examples of the forming methods of the electron transport layer 10, the emitting layer 6, and the hole transport layer 7 include application of a solution of an organic compound that forms the electron transport layer 10, a solution of an organic compound that forms the emitting layer 6, or a solution of an organic compound that forms the hole transport layer 7; vacuum evaporation; and evaporative spray deposition from ultra-dilute solution (ESDUS). In particular, the electron transport layer 10, the emitting layer 6, and the hole transport layer 7 are preferably formed by application. When the organic compound that forms the electron transport layer 10, the emitting layer 6, or the hole transport layer 7 is less soluble in a solvent, vacuum evaporation or ESDUS is preferably used.

When the electron transport layer 10, the emitting layer 6, and the hole transport layer 7 are formed by application, the solution of an organic compound that forms the electron transport layer 10, the solution of an organic compound that forms the emitting layer 6, and the solution of an organic compound that forms the hole transport layer 7 are prepared respectively by dissolving the organic compound that forms the electron transport layer 10, the organic compound that forms the emitting layer 6, and the organic compound that forms the hole transport layer 7 in respective solvents.

Preferred examples of the solvent used to dissolve the organic compound that forms the electron transport layer 10, the solvent used to dissolve the organic compound that forms the emitting layer 6, and the solvent used to dissolve the organic compound that forms the hole transport layer 7 include aromatic hydrocarbon solvents such as xylene, toluene, cyclohexylbenzene, dihydrobenzofuran, trimethylbenzene, and tetramethylbenzene; aromatic heterocyclic compound solvents such as pyridine, pyrazine, furan, pyrrole, thiophene, and methylpyrrolidone; and aliphatic hydrocarbon solvents such as hexane, pentane, heptane, and cyclohexane. These may be used alone or as a mixture.

Examples of the method for applying the solution of an organic compound that forms the electron transport layer 10, the solution of an organic compound that forms the emitting layer 6, or the solution of an organic compound that forms the hole transport layer 7 include various application methods such as a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, and an inkjet printing method. Preferred among these methods are a spin coating method and a slit coating method because they can easily control the film thickness.

Next, the hole injection layer 8 is formed on the hole transport layer 7, and the anode 9 is formed on the layer 8.

When the hole injection layer 8 is made of an inorganic material, the hole injection layer 8 can be formed in the same manner as for the oxide layer 4, for example.

When the hole transport layer 9 is made of an organic material, the hole injection layer 8 can be formed in the same manner as for the electron transport layer 10, the emitting layer 6, and the hole transport layer 7, for example.

The anode 9 can be formed, for example, in the same manner as for the cathode 3.

The organic EL device 1 illustrated in FIG. 4 is obtained through the above steps.

Next, a method for producing a conventional organic EL device 2 illustrated in FIG. 5 will be described as an example of the method for producing an organic EL device of the present invention.

In order to produce the organic EL device 2 illustrated in FIG. 5, first, an anode 9 is formed on a substrate 2.

The anode 9 may be formed by, for example, a sputtering method, a vacuum vapor deposition method, a sol-gel method, a spray pyrolysis deposition (SPD) method, an atomic layer deposition (ALD) method, a vapor deposition method, or a liquid phase deposition method. The anode 9 may be formed by bonding metal foil.

Next, a hole injection layer 8 is formed on the anode 9. The hole injection layer 8 can be formed by the above-described method for producing an organic thin film.

Next, a hole transport layer 7, an emitting layer 6, an electron transport layer 10, and an electron injection layer 5 are formed on the hole injection layer 8 in the stated order.

The hole transport layer 7, the emitting layer 6, the electron transport layer 10, and the electron injection layer 5 may be formed by any method, and any of known various forming methods can be appropriately used depending on the properties of the materials of the hole transport layer 7, the emitting layer 6, the electron transport layer 10, and the electron injection layer 5.

Specific examples of the forming methods of the hole transport layer 7, the emitting layer 6, the electron transport layer 10, and the electron injection layer 5 include application of a solution of an organic compound that forms the hole transport layer 7, a solution of an organic compound that forms the emitting layer 6, a solution of an organic compound that forms the electron transport layer 10, or a solution of an organic compound that forms the electron injection layer 5; vacuum vapor deposition; and evaporative spray deposition from ultra-dilute solution (ESDUS).

When the hole transport layer 7, the emitting layer 6, the electron transport layer 10, and the electron injection layer 5 are formed by application, the solution of an organic compound that forms the hole transport layer 7, the solution of an organic compound that forms the emitting layer 6, the solution of an organic compound that forms the electron transport layer 10, and the solution of an organic compound that forms the electron injection layer 5 are prepared respectively by dissolving the organic compound that forms the hole transport layer 7, the organic compound that forms the emitting layer 6, the organic compound that forms the electron transport layer 10, and the organic compound that forms the electron injection layer 5 in respective solvents.

Examples of the solvents used for dissolving an organic compound which is to be the hole transport layer 7, the light emitting layer 6, the electron transport layer 10, or the electron injection layer 5 include ketone-based solvents such as methyl ethyl ketone (MEK), acetone, diethyl ketone, methyl isobutyl ketone (MIBK), methyl isopropyl ketone (MIPK), diisobutyl ketone, 3,5,5-trimethylcyclohexanone, diacetone alcohol, cyclopentanone, and cyclohexanone; alcohol-based solvents such as methanol, ethanol, isopropanol, ethylene glycol, diethylene glycol (DEG), and glycerine; ether-based solvents such as diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (carbitol); cellosolve-based solvents such as methyl cellosolve, ethyl cellosolve, and phenyl cellosolve; aliphatic hydrocarbon-based solvents such as hexane, pentane, heptane, and cyclohexane; aromatic hydrocarbon-based solvents such as toluene, xylene, benzene, cyclohexylbenzene, dihydrobenzofuran, trimethylbenzene, and tetramethylbenzene; aromatic heterocyclic compound-based solvents such as pyridine, pyrazine, furan, pyrrole, thiophene, and methylpyrrolidone; amide-based solvents such as N,N-dimethylformamide (DMF) and N,N-dimethylacetamide (DMA); halogen compound-based solvents such as chlorobenzene, dichloromethane, chloroform, and 1,2-dichloroethane; ester-based solvents such as ethyl acetate, methyl acetate, and ethyl formate; sulfur compound-based solvents such as dimethyl sulfoxide (DMSO) and sulfolane; nitrile-based solvents such as acetonitrile, propionitrile, and acrylonitrile; and organic acid-based solvents such as formic acid, acetic acid, trichloroacetic acid, and trifluoroacetic acid. Preferred among these are ketone-based solvents such as methyl ethyl ketone (MEK), acetone, diethyl ketone, methyl isobutyl ketone (MIBK), methyl isopropyl ketone (MIPK), diisobutyl ketone, 3,5,5-trimethylcyclohexanone, diacetone alcohol, and cyclopentanone. These may be used alone or in combination.

Examples of the method for applying the solution of an organic compound that forms the hole transport layer 7, the solution of an organic compound that forms the emitting layer 6, the solution of an organic compound that forms the electron transport layer 10, or the solution of an organic compound that forms the electron injection layer 5 include various application methods such as a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, and an inkjet printing method. Preferred among these methods are a spin coating method and a slit coating method because they can easily control the film thickness.

Next, a cathode 3 is formed.

The cathode 3 can be formed, for example, in the same manner as for the anode 9.

Through the above steps, the organic EL device 2 illustrated in FIG. 5 is obtained.

"Sealing Method"

The organic EL device 1 illustrated in FIG. 4 and the organic EL device 2 illustrated in FIG. 5 can be sealed by the method commonly used to seal organic EL devices.

Since the organic EL device 1 of the present embodiment illustrated in FIG. 4 includes the electron injection layer 5 which is an organic thin film that contains the first material which is an electron-donating organic material and the second material which transports electrons, hydrogen bonding is formed between the first material and the second material so that a negative charge is generated and an excellent electron injection property is obtained. Thus, electrons are injected and transported from the cathode 3 to the emitting layer 6 at a high speed, and the organic EL device 1 is driven with a low voltage.

In another embodiment of the organic EL device of the present invention, the organic EL device 1 is a device in which the organic thin film containing the first material which is an electron-donating organic material and the second material which transports electrons is a laminate film, and the layer formed from the second material and the electron injection layer formed from the first material are different layers. In such an embodiment of the organic EL device 1, electrons are injected and transported from the cathode 3 to the emitting layer 6 at a high speed, and the organic EL device 1 is driven with a low voltage.

Further, in the organic EL device 2 of the embodiment illustrated in FIG. 5, a negative charge is generated by the formation of coordination bonding between the first material which is an electron-donating organic material as described above and the adjacent cathode material, whereby an excellent electron injection property is obtained. Thus, electrons are injected and transported from the cathode 3 to the emitting layer 6 at a high speed, and the organic EL device 2 is driven with a low voltage. In another embodiment of the organic EL device of the present invention, the organic EL device 2 is a device in which the organic thin film containing the first material which is an electron-donating organic material and the second material which is a compound in which electrons are hardly injected from a cathode even when an alkali metal is added thereto is a laminate film, and the layer formed from the second material and the electron injection layer formed from the first material are different layers. In such an embodiment of the organic EL device, electrons are injected and transported from the cathode 3 to the emitting layer 6 at a high speed, and the organic EL device 2 is driven with a low voltage.

Other Examples

The organic EL device of the present invention is not limited to the organic EL devices described in the above embodiments.

Specifically, in the above embodiments, the device was described with the case where an organic thin film serves as an electron injection layer as an example. The organic EL device of the present invention has only to include the organic thin film between the cathode and the emitting layer. Thus, the organic thin film may not be an electron injection layer, and may be formed as a layer serving as both an electron injection layer and an electron transport layer or may be formed as an electron transport layer.

In the organic EL device 1 illustrated in FIG. 4, the inorganic oxide layer 4, the electron transport layer 10, the hole transport layer 7, and the hole injection layer 8 may be formed as required and may not be formed.

The cathode 3, the oxide layer 4, the electron injection layer 5, the electron transport layer 10, the emitting layer 6, the hole transport layer 7, the hole injection layer 8, and the anode 9 each may be a single layer or may include two or more layers.

The organic EL device 1 illustrated in FIG. 4 may include a different layer between any two of the layers illustrated in FIG. 4. Specifically, for example, in order to enhance the properties of the organic EL device, the device may include an electron blocking layer or other layers, as required.

In the above embodiments, the organic EL device was described with an inverted organic EL device including the cathode 3 between the substrate 2 and the emitting layer 6, as an example. The organic EL device may be a conventional organic EL device including an anode between a substrate and an emitting layer.

In the conventional organic EL device 2 illustrated in FIG. 5, the electron transport layer 10, the hole transport layer 7, and the hole injection layer 8 may be formed as required and may not be formed.

The anode 9, the hole injection layer 8, the hole transport layer 7, the emitting layer 6, the electron transport layer 10, the electron injection layer 5, and the cathode 3 each may be a single layer or may include two or more layers.

The organic EL device 2 illustrated in FIG. 5 may include a different layer between any two of the layers illustrated in FIG. 5. Specifically, for example, in order to further enhance the properties of the organic EL device, the device may include a hole blocking layer or other layers, as required.

The organic EL device of the present invention is capable of changing the color of light by suitably selecting a material of an emitting layer or the like, and is also capable of providing a desired color of light by using a color filter or the like together therewith. Thus, the organic EL device of the present invention can be suitably used as an emitting portion of a display device or a lighting system.

The display device of the present invention includes the organic EL device of the present invention that includes an organic thin film which has high productivity ans is driven with a low voltage between a cathode and an emitting layer. Thus, the display device of the present invention is suitable as a display device.

The lighting system of the present invention includes the organic EL device of the present invention that is produced in a high yield and is driven with a low voltage. Thus, the lighting system of the present invention is suitable as a lighting system.

The present invention is not limited to the above-described embodiments, and the organic thin film of the present invention can be used, for example, for devices such as organic thin film solar cells, photoelectric transducers, and thin film transistors.

The organic thin film solar cell or photoelectric transducer of the present invention includes an organic thin film. For example, when the organic thin film is used for an electron injection layer of the organic thin film solar cell or the photoelectric transducer, hydrogen bonding is formed between the first material and the second material in the organic thin film so that a negative charge is generated. Thus, electrons are transported at a high speed, and high power generation efficiency can be obtained. Thus, the organic thin film solar cell and the photoelectric transducer each including the organic thin film of the present invention are preferred.

The thin film transistor of the present invention includes an organic thin film. For example, when a channel layer of the thin film transistor is formed from the organic thin film, the channel layer has high electron mobility.

When the organic thin film is formed on an electrode, a reduction in contact resistance can be expected.

Thus, the organic thin film of the present invention is suitable as materials of organic thin film solar cells, photoelectric transducers, and thin film transistors. Thus, a compound having a structure of the formula (1) constituting the organic thin film is suitable as the materials of these. The organic thin film solar cell material, photoelectric transducer material, or thin film transistor material, containing a compound having a structure of the formula (1), is also another aspect of the present invention.

EXAMPLES

The present invention is described in more detail with reference to examples below, but the present invention is not limited to these examples. Herein, "%" means "mol %" unless otherwise stated.

Synthesis Example 1

A boron-containing compound of the following formula (11) was synthesized in the following way.

[Chem. 15]

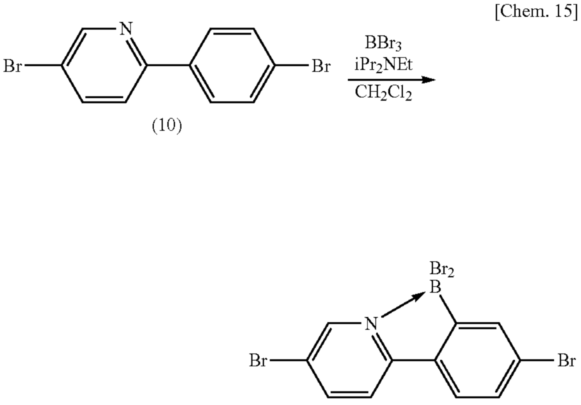

(10)

(11)

In an argon atmosphere, ethyldiisopropylamine (39 mg, 0.30 mmol) was added to a dichloromethane solution (0.3 mL) containing 5-bromo-2-(4-bromophenyl)pyridine (94 mg, 0.30 mmol) of the formula (10). Thereafter, boron tribromide (1.0 M dichloromethane solution, 0.9 mL, 0.9 mmol) was added thereto at 0° C., and the solution was allowed to react with stirring for nine hours at room temperature. The reaction solution was cooled to 0° C., and an aqueous solution of saturated potassium carbonate was added to the reaction solution, followed by extraction with chloroform. The organic layer was washed with a saturated saline solution, dried over magnesium sulfate, and filtered. The filtrate was concentrated with a rotary evaporator, and the resulting white solid was collected by filtration and then washed with hexane. Thus, the boron-containing compound of the formula (11) (40 mg, 0.082 mmol) was obtained in a yield of 28%.

The resulting boron-containing compound was identified by $^1$H-NMR.

$^1$H-NMR ($CDCl_3$): 7.57-7.59 (m, 2H), 7.80 (dd, J=8.4, 0.6 Hz, 1H), 7.99 (s, 1H), 8.27 (dd, J=8.4, 2.1 Hz, 1H), 9.01 (d, J=1.5 Hz, 1H).

Synthesis Example 2

A boron-containing compound of the formula (12) was synthesized in the following way using the boron-containing compound of the formula (11).

[Chem. 16]

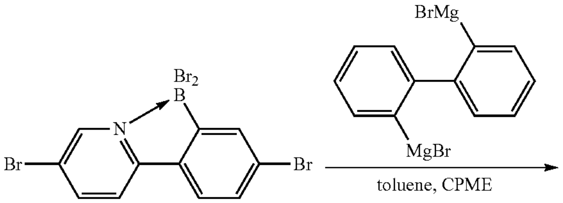

(11)

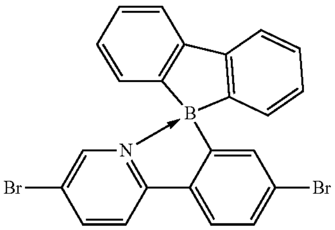

(12)

Magnesium (561 mg, 23.1 mmol) was placed in a 50-mL two-necked flask, which was then purged with nitrogen. Subsequently, cyclopentyl methyl ether (CPME) (10 mL) was placed in the reaction vessel and a small portion of iodine was placed therein, followed by stirring until the color disappeared. A solution (9 mL) of 2,2'-dibromobiphenyl (3.0 g, 9.6 mmol) in cyclopentyl methyl ether was added dropwise to the reaction vessel, followed by stirring at room temperature for 12 hours and at 50° C. for one hour. Thus, a Grignard reagent was prepared.

The boron-containing compound of the formula (11) (3.71 g, 7.7 mmol) was placed in a different 200-mL three-necked flask, which was then purged with nitrogen. Subsequently, toluene (77 mL) was added. While the contents were stirred at −78° C., the Grignard reagent was added collectively through a cannula. The contents were stirred for 10 minutes, heated to room temperature, and stirred for another 12 hours. Water was added to the reaction solution, followed by extraction with toluene. The organic layer was washed with a saturated saline solution, dried over magnesium sulfate, and filtered. The filtrate was concentrated, and the residue was purified by column chromatography. Thus, 3.0 g of the boron-containing compound of the formula (12) was obtained (yield 82%).

The resulting boron-containing compound was identified by $^1$H-NMR.

$^1$H-NMR ($CDCl_3$): 6.85 (d, J=7.04 Hz, 2H), 7.05 (t, J=7.19 Hz, 2H), 7.32 (t, J=7.48 Hz, 2H), 7.47 (s, 1H), 7.49-7.57 (m, 1H), 7.74-7.84 (m, 3H), 7.90-8.00 (m, 2H), 8.07-8.20 (m, 1H).

Synthesis Example 3

A boron compound A of the formula (14) was synthesized in the following way using the boron-containing compound of the formula (12).

[Chem. 17]

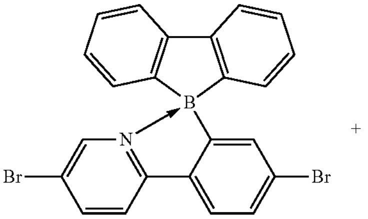

(12)

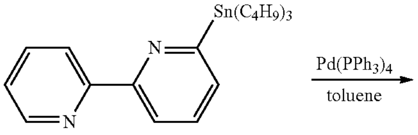

(13)

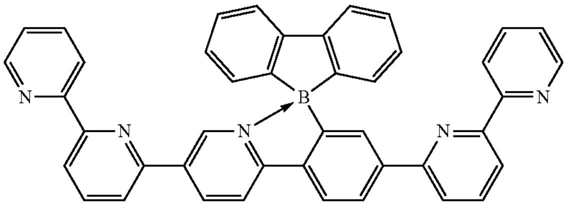

(14)

A 50-mL two-necked flask was charged with the boron-containing compound of the formula (12) (2.50 g, 5.26 mmol), 6-tri(n-butylstannyl)-2,2'-bipyridine of the formula (13) (5.62 g, 12.6 mmol), $Pd(PPh_3)_4$ (610 mg, 0.53 mmol), and toluene (26 mL). The flask was then purged with nitrogen, and the contents were allowed to react with stirring at 120° C. for 24 hours. Thereafter, the resulting reaction solution was cooled to room temperature and concentrated, and the residue was purified by column chromatography. Thus, 2.0 g of the boron compound A of the formula (14) was obtained (yield 60%).

The resulting boron compound A was identified by $^1$H-NMR.

$^1$H-NMR ($CDCl_3$): 6.6.96 (d, J=6.8 Hz, 2H), 7.04 (t, J=7.2 Hz, 2H), 7.29-7.35 (m, 4H), 7.49 (d, J=7.8 Hz, 1H), 7.73-7.85 (m, 7H), 8.01 (d, J=0.8 Hz, 1H), 8.16 (d, J=8.4 Hz, 1H), 8.23 (d, J=8.6 Hz, 1H), 8.30-8.42 (m, 5H), 8.60 (d, J=8.0 Hz, 1H), 8.66-8.67 (m, 2H), 8.89 (d, J=8.0 Hz, 1H).

Synthesis Example 4

A compound of the formula (15) was synthesized in the following way.

[Chem. 18]

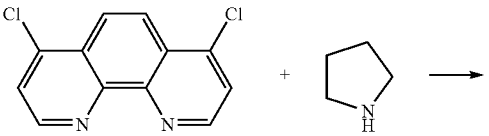

-continued

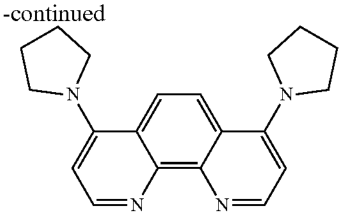

(15)

A mixture of 4,7-dichloro-1,10-phenanthroline (3.00 g) and pyrrolidine (19.5 mL) in a 100-mL recovery flask was heated to reflux in an oil bath at 100° C. for one hour. The mixture was cooled to room temperature and concentrated under reduced pressure. Water was added to the concentrate, and they were subjected to ultrasonication to precipitate solids, which were collected by filtration. The resulting solids were dried under reduced pressure and dissolved in methanol (100 mL). To the mixture was added activated carbon, the mixture was stirred at room temperature for one hour, and insoluble matters were filtered off. The filtrate was concentrated under reduced pressure to obtain solids, which were recrystallized with methanol (9 mL). The resulting solids were washed with a small amount of methanol and dried under reduced pressure. Thus, the compound of the formula (15) was obtained as a white solid (1.69 g, 44%).

Synthesis Example 5

<Synthesis of Monomer for Synthesizing Boron-Containing Polymer>

A 300-mL reaction vessel was charged with a compound of the following formula (16) (3.96 g), 4-pyridine boronic acid (1.03 g), $Pd(PPh_3)_4$ (0.24 g), sodium carbonate (2.24 g), toluene (40 mL), distilled water (40 mL), and ethanol (20 mL). The resulting suspension was stirred for 10 minutes under argon bubbling, heated to 95° C. with an oil bath, and heated at the same temperature for 18 hours with stirring. To the resulting yellow solution were added water (100 mL) and toluene (100 mL) to prepare a two-layer solution. The organic layer was washed with water, followed by saturated saline, and concentrated. The resulting residue was purified by column chromatography and preparative GPC to obtain colorless solids. The solids were subjected to recrystallization with ethanol/hexane. Thus, a compound of the following formula (17) (0.69 g) was obtained.

[Chem. 19]

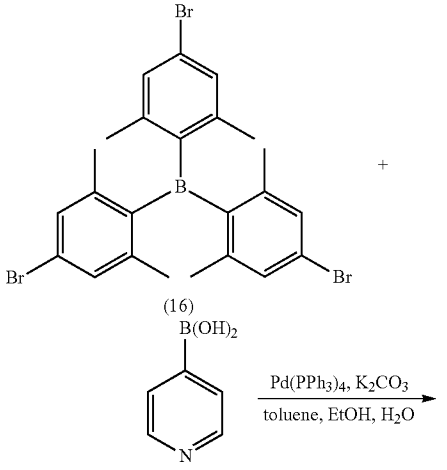

(16)

-continued

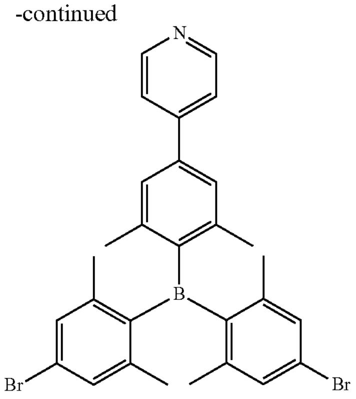

(17)

<Synthesis of Boron-Containing Polymer>

In an argon atmosphere, a 50-mL pressure resistant test tube was charged with the compound of the formula (17) (0.5 g), a compound of the following formula (18) (0.57 g), $Pd(PPh_3)_4$ (0.1 g), sodium carbonate (0.472 g), Aliquat 336 (0.2 g), toluene (10 mL), and distilled water (10 mL). The suspension was subjected to argon bubbling for about 15 minutes and stirred for 24 hours with heating in an oil bath at 100° C. Iodobenzene (0.181 g) was added thereto, the contents were stirred for 18 hours at the same temperature, phenylboronic acid (0.217 g) was added thereto, and the contents were stirred for 18 hours. The resulting organic layer of a dark brown suspension was filtered with celite, and the filtrate was concentrated. The resulting residue was purified with a column to obtain light brown powder. To the powder were added heptane and ethanol to prepare a dispersion. The dispersion were heated, and cooled to obtain solids, which were collected by filtration and were washed with ethanol. Thus, 0.61 g of a boron-containing polymer (9) was obtained.

[Chem. 20]

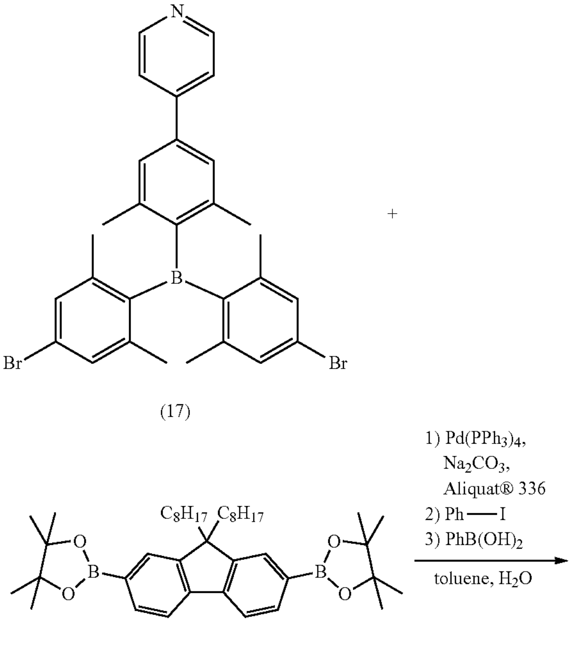

(17)

(18)

-continued

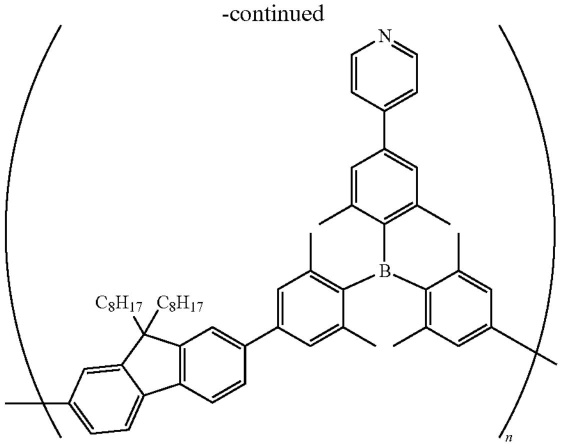

(9)

Synthesis Example 6

A compound of the formula (19) was synthesized in the following way.

[Chem. 21]

(19)

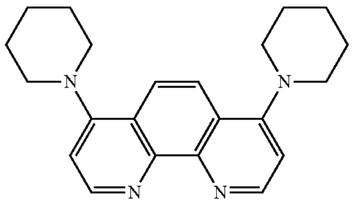

A mixture of 4,7-dichloro-1,10-phenanthroline (3.00 g) and piperidine (47 mL) in a 300-mL recovery flask was heated with stirring in an oil bath at 120° C. for three hours. The mixture was cooled to room temperature, water (250 mL) was added to the mixture, and they were stirred for one hour to obtain a precipitate, which were collected by filtration. Thus, 4.47 g of the compound of the formula (19) was obtained as a beige solid.

Synthesis Example 7

A compound of the formula (20) was synthesized in the following way.

[Chem. 22]

(20)

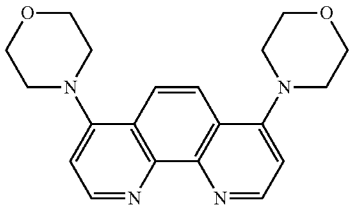

A mixture of 4,7-dichloro-1,10-phenanthroline (1.99 g) and morpholine (27.6 mL) in a 200-mL recovery flask was heated with stirring in an oil bath at 120° C. for three hours. The mixture was cooled to room temperature, water was added thereto, and they were subjected to extraction with chloroform. The organic layer separated was dried over anhydrous sodium sulfate, and impurities were filtered off. The filtrate was concentrated under reduced pressure, and the residue was washed with ethyl acetate. Thus, the compound of the formula (20) was obtained as a pale pink solid (2.03 g, 72%).

Examples 1 and 2

An organic EL device 1 illustrated in FIG. 4 was produced in the following way and evaluated.

(Step 1)

A commercially available transparent glass substrate having an average thickness of 0.7 mm with a 150-nm-thick electrode (cathode 3) made of ITO with a pattern of 3 mm width was prepared as a substrate 2.

The substrate 2 with the cathode 3 was ultrasonically cleaned in acetone and isopropanol each for 10 minutes and then boiled in isopropanol for five minutes. Thereafter, the substrate 2 with the cathode 3 was taken out from isopropanol, dried by blowing nitrogen, and cleaned with UV ozone for 20 minutes.

(Step 2)

The substrate 2 with the cathode 3 cleaned in (Step 1) was fixed to a substrate holder of a mirrortron sputtering apparatus having a zinc metal target. The pressure in the chamber of the sputtering apparatus was reduced to about $1\times10^{-4}$ Pa, and the substrate 2 was subjected to sputtering with argon and oxygen introduced therein to form a zinc oxide layer (oxide layer 4) having a thickness of about 7 nm on the cathode 3 of the substrate 2. Upon the formation of the zinc oxide layer, the zinc oxide film was not formed on part of the ITO electrode (cathode 3) in order to lead out the electrode. The substrate 2 with the oxide layer 4 was annealed in the atmosphere at 400° C. for one hour.

(Step 3)

Next, an organic thin film containing the first material and the second material was formed as an electron injection layer 5 on the oxide layer 4 in the following way.

First, the boron compound A synthesized in Synthesis Examples 1 to 3 and a phenanthroline derivative in a weight ratio of 1:0.05 were dissolved in cyclopentanone at a concentration of 1% by weight to prepare a coating composition. Next, the substrate 2 with the cathode 3 and the oxide layer 4 produced in (Step 2) was placed on a spin coater. Then, the substrate 2 was rotated at 3000 rpm for 30 seconds while the coating composition was dropped on the oxide layer 4. Thus, a coat was formed. Subsequently, the substrate 2 was annealed in a nitrogen atmosphere at 120° C. for two hours using an electric griddle to form the electron injection layer 5. The electron injection layer 5 had an average thickness of 20 nm.

The phenanthroline derivative serving as the first material was the following compound 1 in Example 1 or the following compound 2 in Example 2.

The compound 1 was synthesized referring to the known compounds described in European Journal of Organic Chemistry (2017), 2017, (14), 1902-1910. The compound 2 is a commercially available product.

[Chem. 23]

Compound 1

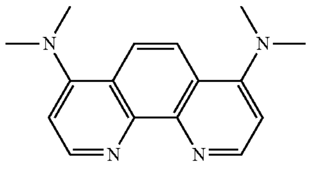

Compound 2

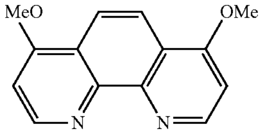

(Step 4)

Next, the substrate 2 with the electron injection layer 5 and the previous layers was fixed to a substrate holder of a vacuum evaporation apparatus. Bis(2-(2-benzothiazolyl)phenolato)zinc(II) ($Zn(BTZ)_2$) of the following formula (24), tris[1-phenylisoquinoline]iridium(III) ($Ir(piq)_3$) of the following formula (23), N,N'-di(1-naphthyl)-N,N'-diphenyl-1,1'-biphenyl-4,4'-diamine (α-NPD) of the following formula (22), N4,N4'-bis(dibenzo[b,d]thiophen-4-yl)-N4,N4'-diphenyl biphenyl-4,4'-diamine (DBTPB) of the following formula (21), 1,4,5,8,9,12-hexaazatriphenylene-2,3,6,7,10,11-hexacarbonitrile (HAT-CN) of the following formula (25), and Al were separately put into alumina crucibles, which were set as evaporation sources.

[Chem. 24]

(21)

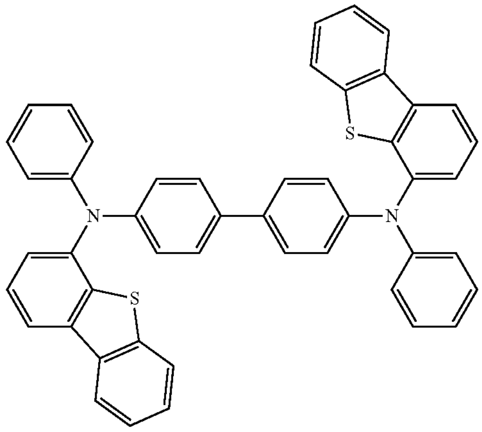

DBTPB (22)

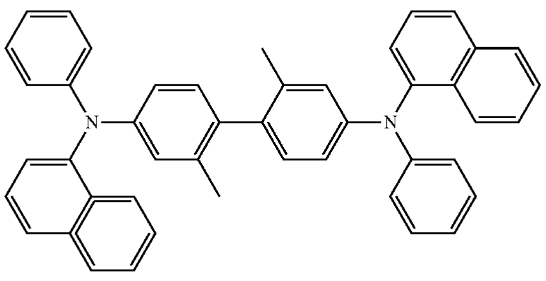

α-NPD

-continued (23)

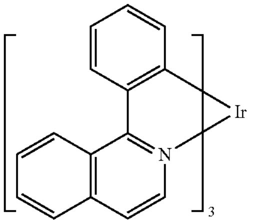

Ir(piq)3

(24)

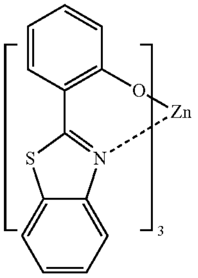

Zn(BTZ)2

(25)

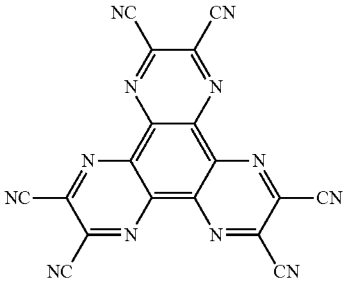

HAT-CN

The pressure in the chamber of the vacuum evaporation apparatus was reduced to $1 \times 10^{-5}$ Pa, and an electron transport layer 10, an emitting layer 6, a hole transport layer 7, a hole injection layer 8, and an anode 9 were successively formed by a vacuum evaporation method involving resistance heating.

First, the electron transport layer 10 with a thickness of 10 nm made of $Zn(BTZ)_2$ was formed. Subsequently, the emitting layer 6 was formed by co-evaporating $Zn(BTZ)_2$ as a host and $Ir(piq)_3$ as a dopant to a thickness of 30 nm. The doping concentration was controlled such that $Ir(piq)_3$ would be 6% by mass relative to the entire emitting layer 6. Next, the hole transport layer 7 was formed on the substrate 2 with the emitting layer 6 and the previous layers by forming a 10-nm-thick DBTPB film and a 30-nm-thick α-NPD film. The hole injection layer 8 was formed by forming a 10-nm-thick HAT-CN film. Next, the anode 9 with a thickness of 100 nm made of aluminum was formed by a vacuum evaporation method on the substrate 2 with the hole injection layer 8 and the previous layers.

The anode 9 was formed using a stainless steel evaporation mask to have a 3-mm-width-band-like evaporation area. The produced organic EL device had an emitting area of 9 $mm^2$.

(Step 5)

Next, the substrate 2 with the anode 9 and the previous layers was placed in a glass cap (sealing container) with a recessed space, and the container was filled with a sealing material made of an ultraviolet (UV) curable resin to seal the substrate. Thus, organic EL devices of Examples 1 and 2 were obtained.

Comparative Example 1

An organic EL device of Comparative Example 1 was produced as in Examples 1 and 2, except that a phenanthroline derivative was not used.

To the thus obtained devices of Examples 1 and 2 and Comparative Example 1 was applied a voltage using "2400 series SourceMeter" available from Keithley Instruments, and the luminance was measured using "LS-100" available from Konica Minolta, Inc. Thus, the relationship between the applied voltage and the luminance was determined. Also, the relationship between the applied voltage and the current density was examined. Further, the relationship between the current density and the external quantum efficiency was calculated based on the correlation between the luminance and the voltage and the current value. The results are shown in FIGS. 15 to 17.

Figure 15:
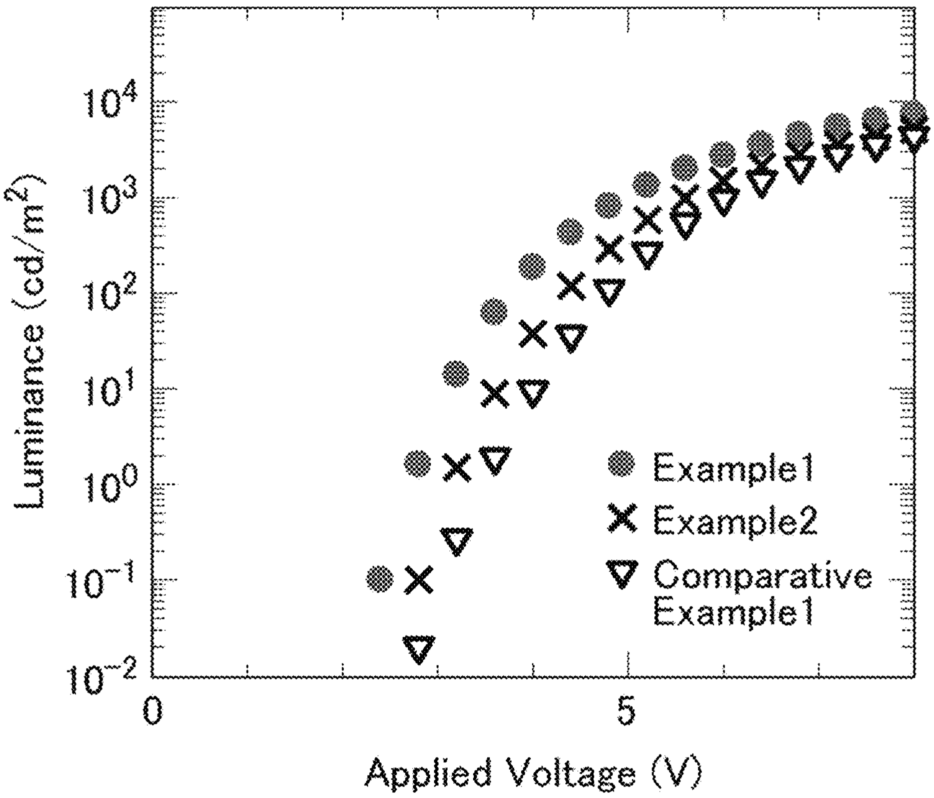
FIG. 15 is a graph of the relationship between the applied voltage and the luminance of organic EL devices produced in Examples 1 and 2 and Comparative Example 1.
Figure 16:
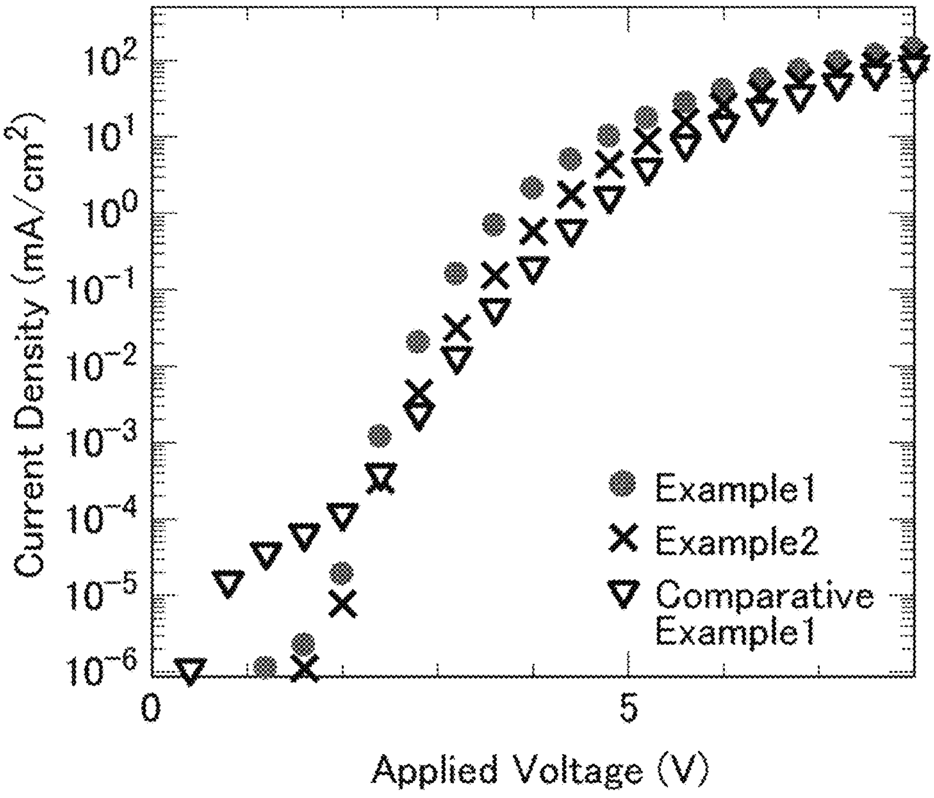
FIG. 16 is a graph of the relationship between the applied voltage and the current density of the organic EL devices produced in Examples 1 and 2 and Comparative Example 1.
Figure 17:
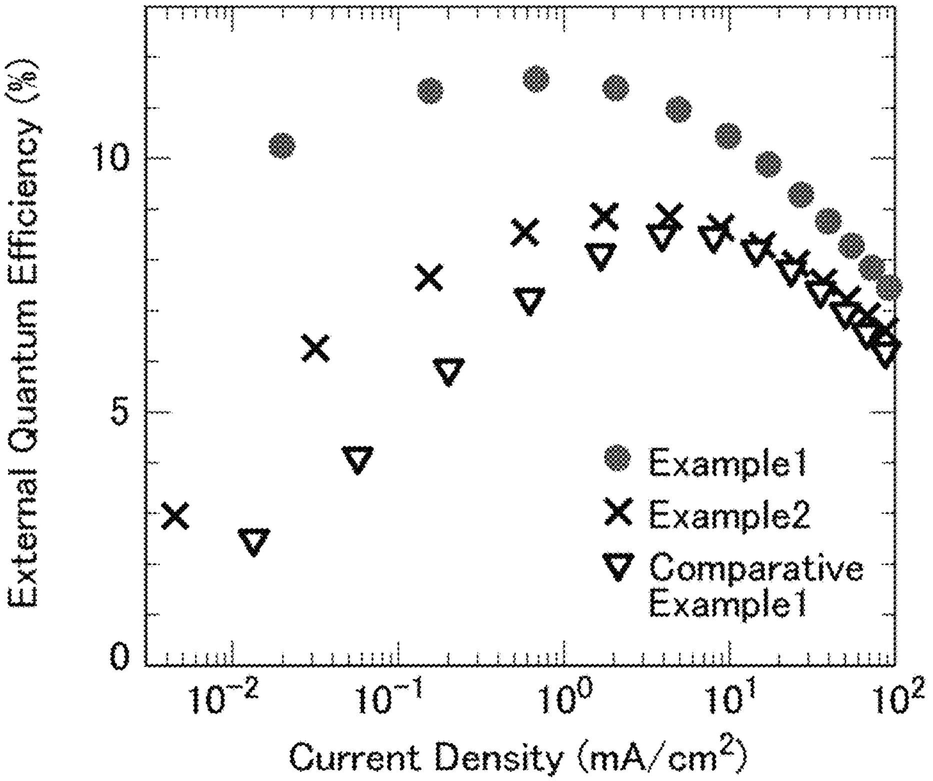
FIG. 17 is a graph of the relationship between the current density and the external quantum efficiency of the organic EL devices produced in Examples 1 and 2 and Comparative Example 1.

FIGS. 15 to 17 demonstrate that the devices of Examples 1 and 2 in which the electron injection layer was doped with a phenanthroline derivative show a higher luminance at a lower applied voltage and have a higher external quantum efficiency than the device of Comparative Example 1. Comparison between Example 1 and Example 2 shows that the device of Example 1 including a phenanthroline derivative having a higher electrostatic potential has better properties than the device of Example 2. This is considered to result from that the phenanthroline derivative acts as an n-type dopant that generates a negative charge on a boron compound, improving the electron injection property and the electron transport property.

Examples 3 to 5

An organic thin film containing the first material and the second material was formed on the oxide layer 4 as an electron injection layer 5 in the following way. The substrate 2 with the oxide 4 and the previous layer was fixed to a substrate holder of a vacuum evaporation apparatus. A 10-nm-thick organic thin film containing the boron compound A and a phenanthroline derivative in a weight ratio of 1:0:05 was formed by co-evaporation. Thus, organic EL devices of Examples 3 to 5 were produced as in Example 1 excepting the above steps.

The phenanthroline derivative serving as the first material was a compound 3 in Example 3, a compound 4 in Example 4, or the compound 2 in Example 5. The compounds 3 and 4 are commercially available products.

[Chem. 25]

Compound 3

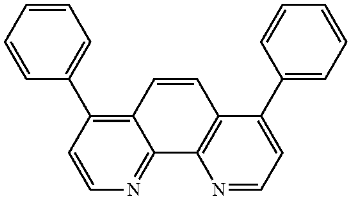

-continued

Compound 4

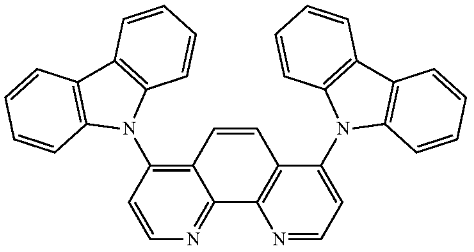

Comparative Example 2

An organic EL device of Comparative Example 2 was produced as in Examples 3 to 5, except that a phenanthroline derivative was not used.

To the thus obtained devices of Examples 3 to 5 and Comparative Example 2 was applied a voltage using "2400 series SourceMeter" available from Keithley Instruments, and the luminance was measured using "LS-100" available from Konica Minolta, Inc. Thus, the relationship between the applied voltage and the luminance was determined. Also, the relationship between the applied voltage and the current density was examined. Further, the relationship between the current density and the external quantum efficiency was calculated based on the correlation between the luminance and the voltage and the current value. The results are shown in FIGS. 18 to 20.

Figure 18:
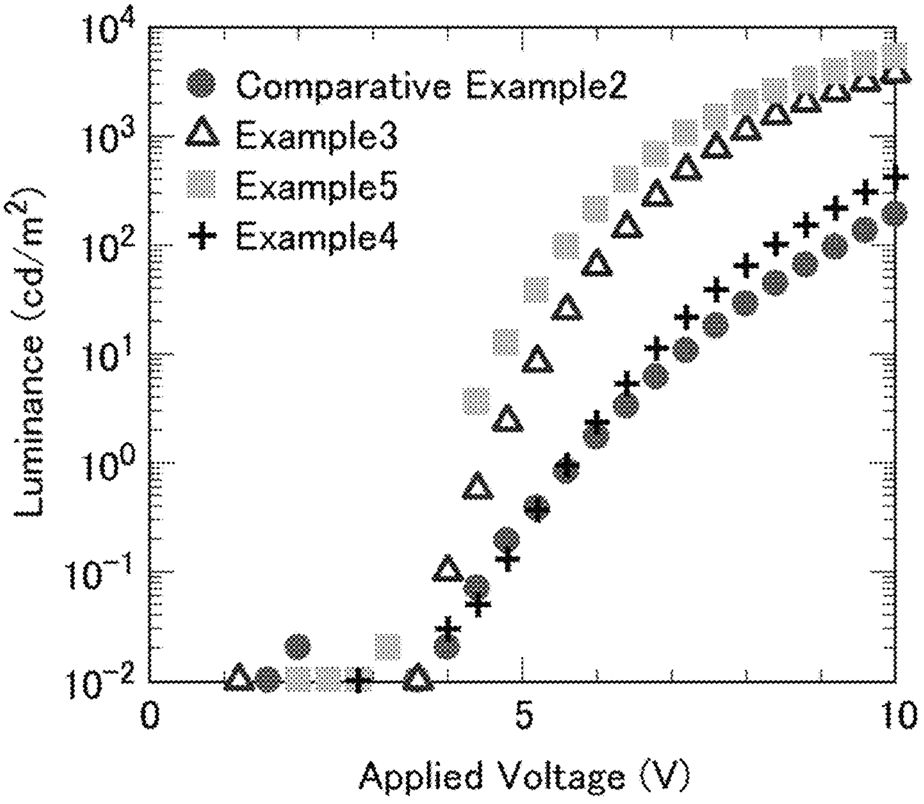
FIG. 18 is a graph of the relationship between the applied voltage and the luminance of organic EL devices produced in Examples 3 to 5 and Comparative Example 2.
Figure 19:
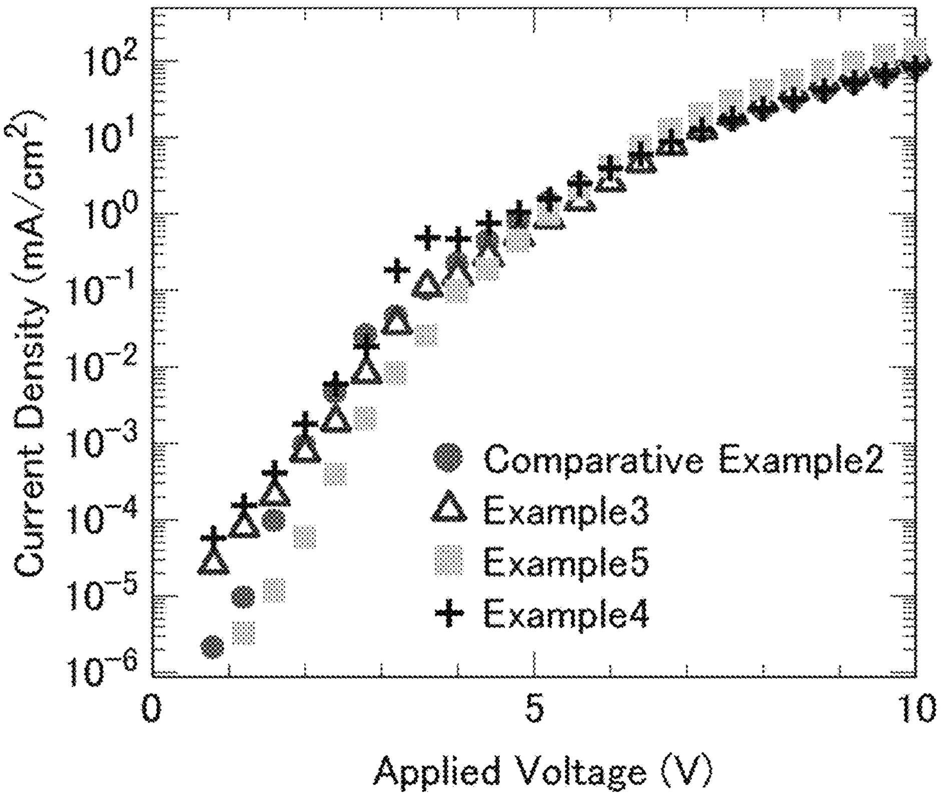
FIG. 19 is a graph of the relationship between the applied voltage and the current density of the organic EL devices produced in Examples 3 to 5 and Comparative Example 2.
Figure 20:
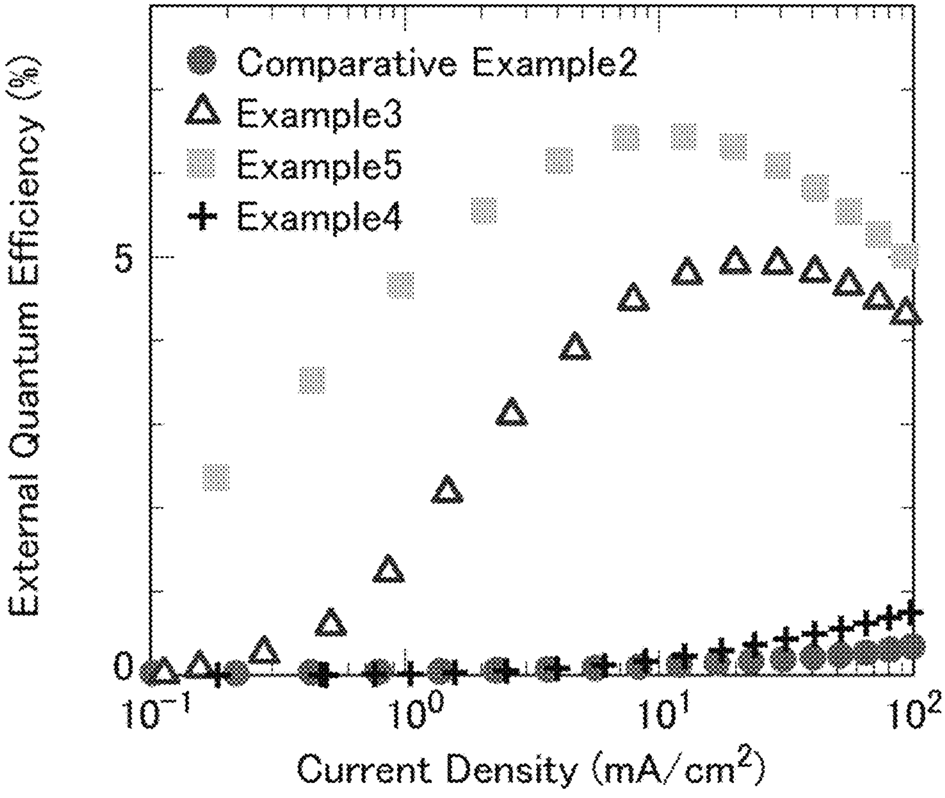
FIG. 20 is a graph of the relationship between the current density and the external quantum efficiency of the organic EL devices produced in Examples 3 to 5 and Comparative Example 2.

FIGS. 18 to 20 demonstrate that the devices of Examples 3 to 5 in which the electron injection layer was doped with a phenanthroline derivative show a higher luminance at a lower applied voltage and have a higher external quantum efficiency than the device of Comparative Example 2. Comparison of Examples 3 to 5 shows that the device including a phenanthroline derivative having a higher electrostatic potential has better properties. This is considered to result from that the phenanthroline derivative acts as an n-type dopant that generates a negative charge on a boron compound, improving the electron injection property and the electron transport property.

Example 6

An organic thin film containing the first material and the second material was formed on the oxide layer 4 as an electron injection layer 5 in the following way. The substrate 2 with the oxide 4 and the previous layer was fixed to a substrate holder of a vacuum evaporation apparatus. A 5-nm-thick organic thin film containing the boron compound A and the compound 2 in a weight ratio of 1:0:05 was formed by co-evaporation. In addition, a 5-nm-thick organic thin film consisting of the boron compound was formed. Thereby, the electron injection layer 5 having a total thickness of 10 nm was formed. Thus, an organic EL device of Example 6 was produced as in Example 1 excepting the above steps.

Example 7

An organic thin film containing the first material and the second material was formed on the oxide layer 4 as an electron injection layer 5 in the following way. The substrate 2 with the oxide 4 and the previous layer was fixed to a substrate holder of a vacuum evaporation apparatus. A substrate holder of a vacuum evaporation apparatus. A 5-nm-thick organic thin film consisting of the boron compound A was formed, and a 5-nm-thick organic thin film containing the boron compound and the compound 2 in a weight ratio of 1:0:05 was formed by co-evaporation. Thereby, the electron injection layer 5 having a total thickness of 10 nm was formed. Thus, an organic EL device of Example 7 was produced as in Example 1 excepting the above steps.

Figure 21:
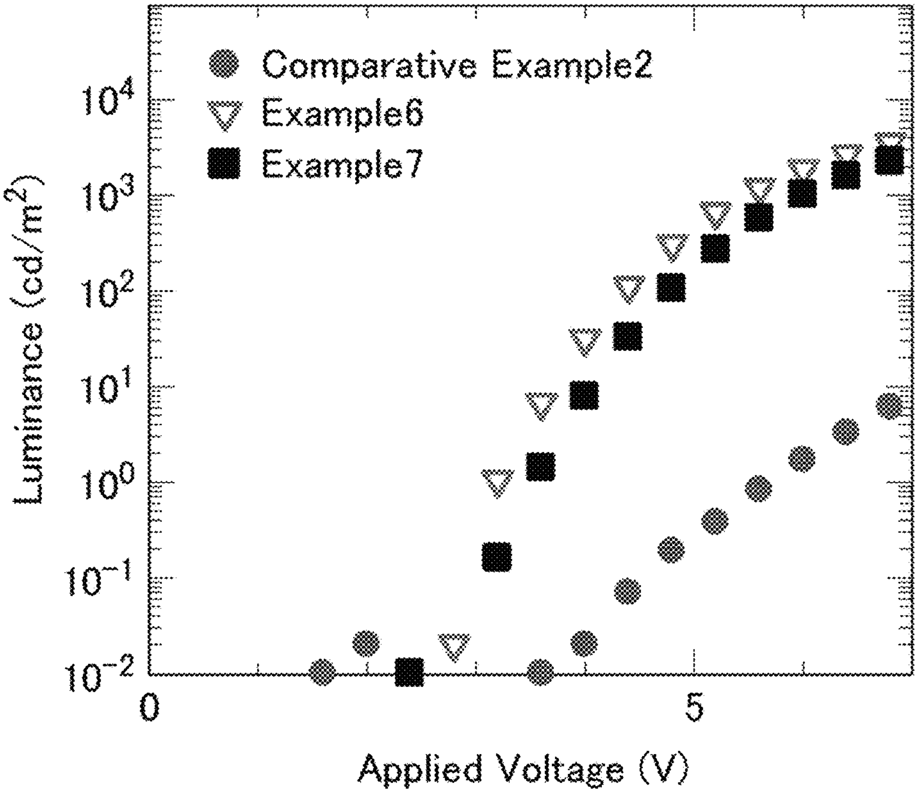
FIG. 21 is a graph of the relationship between the applied voltage and the luminance of organic EL devices produced in Examples 6 and 7 and Comparative Example 2.
Figure 22:
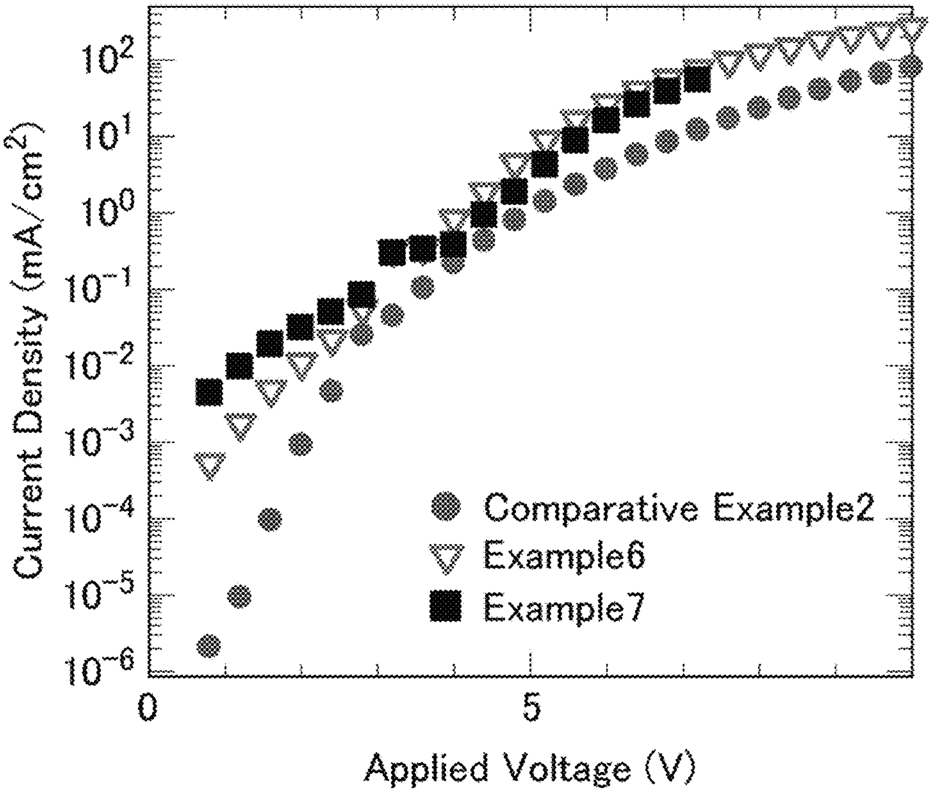
FIG. 22 is a graph of the relationship between the applied voltage and the current density of the organic EL devices produced in Examples 6 and 7 and Comparative Example 2.
Figure 23:
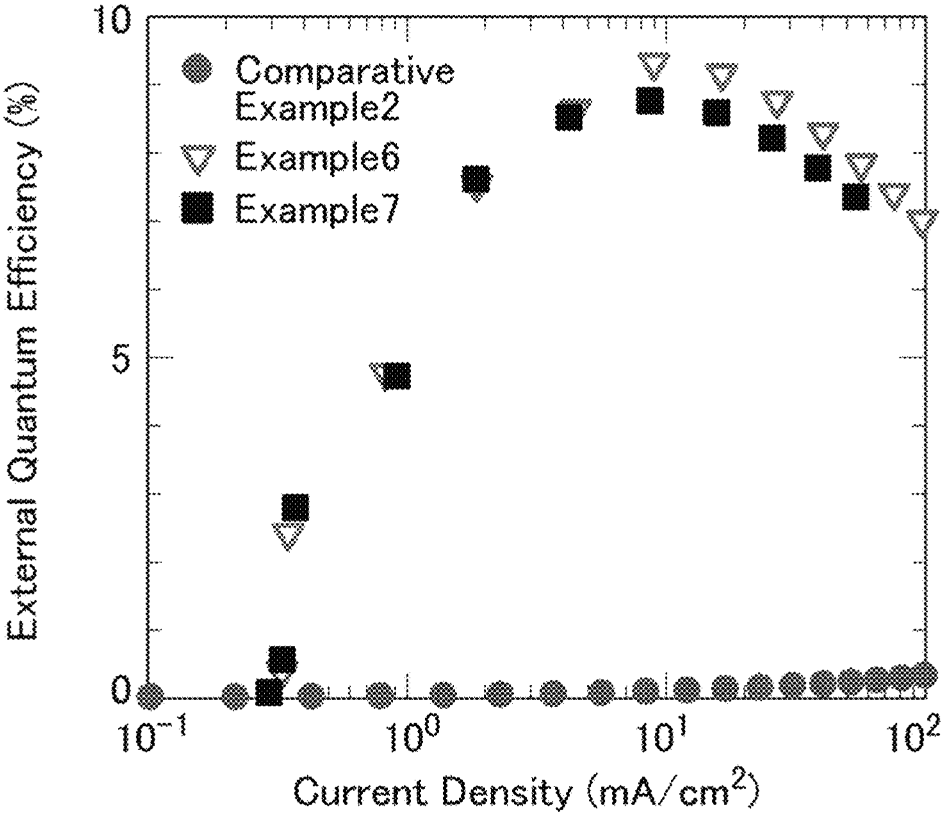
FIG. 23 is a graph of the relationship between the current density and the external quantum efficiency of the organic EL devices produced in Examples 6 and 7 and Comparative Example 2.

To the thus obtained devices of Examples 6 and 7 was applied a voltage using “2400 series SourceMeter” available from Keithley Instruments, and the luminance was measured using “LS-100” available from Konica Minolta, Inc. Thus, the relationship between the applied voltage and the luminance was determined. Also, the relationship between the applied voltage and the current density was examined. Further, the relationship between the current density and the external quantum efficiency was calculated based on the correlation between the luminance and the voltage and the current value. These results are compared with the results of Comparative Example 2. The results are shown in FIGS. 21 to 23. The luminance of the devices of Examples 6 and 7 were measured while the devices were continuously driven. The results are shown in FIG. 24.

As demonstrated in FIGS. 21 to 23, comparison of Examples 6 and 7 shows that the device of Example 6 in which the layer closer to the oxide layer 4 in the electron injection layer is doped with the compound 2 has slightly better properties than the device of Example 7. This is considered to result from interaction between phenanthroline and the oxide layer as reported in Non-Patent Literatures 10 and 11. Meanwhile, a more remarkable decrease in driving voltage is observed even in the device of Example 7 not containing the compound 2 in the vicinity of the oxide layer 4 than in the device of Comparative Example 2. This fact results from that the phenanthroline derivative acts as an n-type dopant that generates a negative charge on a boron compound, improving the electron injection property and the electron transport property. Examples 1 to 6 show that the effect of interaction between phenanthroline and the oxide layer 4 also contributes to a decrease in driving voltage. Meanwhile, as shown in Example 7, a remarkable decrease in driving voltage owing to the phenanthroline derivative is observed even in the device having a system in which no interaction with the substrate occurs. This indicates the validity of facilitation of electron injection due to the formation of hydrogen bonding proposed in the present invention.

Figure 24:
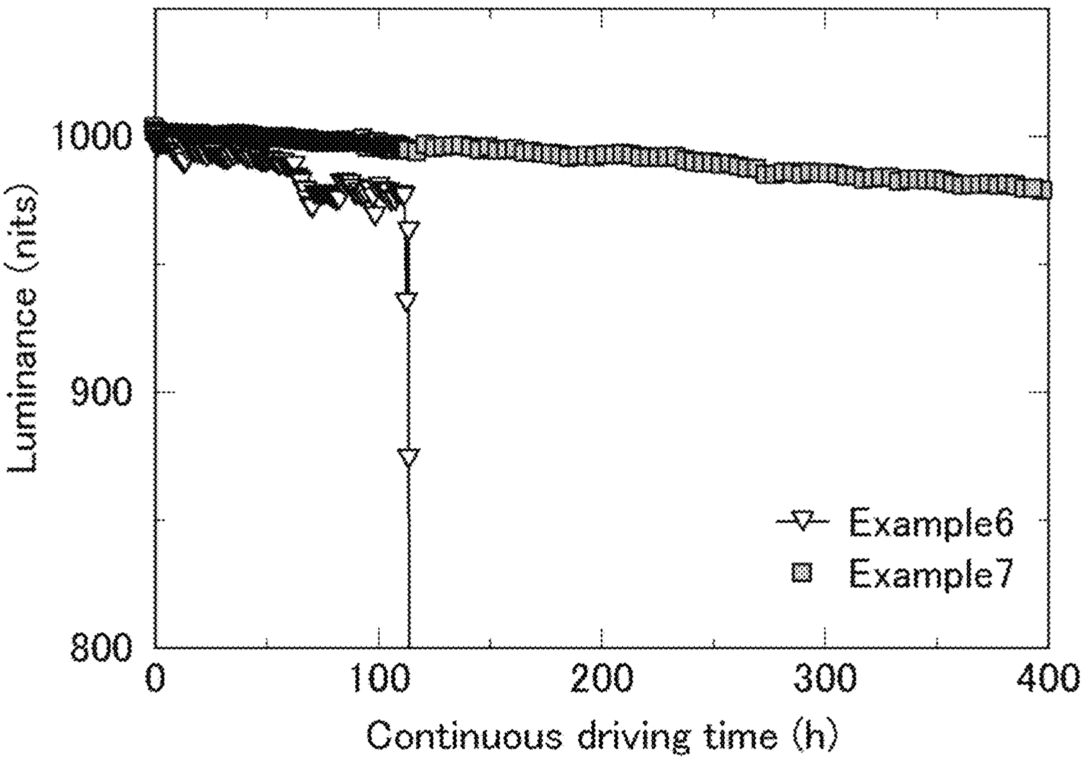
FIG. 24 is a graph of the relationship between the continuous driving time and the luminance of the organic EL devices produced in Examples 6 and 7.

FIG. 24 showing the luminance attenuation of the devices of Examples 6 and 7 continuously driven shows that the device of Example 7 in which interaction between the substrate and the phenanthroline derivative does not occur has a longer life time than the device of Example 6 in which interaction between the substrate and the phenanthroline derivative occurs. This result demonstrates that interaction between the substrate and the phenanthroline derivative impairs the stabilities of materials, and the device of Example 6 using hydrogen bonding is suitable for elongation of life time.

Example 8

An organic thin film containing the first material and the second material was formed in combination with a different material on the oxide layer 4 as an electron injection layer 5 in the following way. First, the boron-containing polymer (9) synthesized in Synthesis Example 5 was dissolved in DMF (concentration: 0.1% by weight) to prepare a coating composition. Next, the substrate 2 with the oxide layer 4 and the previous layer was placed on a spin coater. Then, the substrate 2 was rotated at 3000 rpm for 30 seconds while the coating composition was dropped on the oxide layer 4. Thus, a 5-nm-thick coat was formed. Subsequently, the substrate 2 was annealed in a nitrogen atmosphere at 120° C. for two hours using an electric griddle and fixed to a substrate holder of a vacuum evaporation apparatus. A 5-nm-thick organic thin film containing the boron compound A and the compound 1 in a weight ratio of 1:0:05 was formed by co-evaporation. Thereby, the electron injection layer 5 having a total thickness of 10 nm was formed. Thus, an organic EL device of Example 8 was produced as in Example 1 excepting the above steps.

Figure 25:
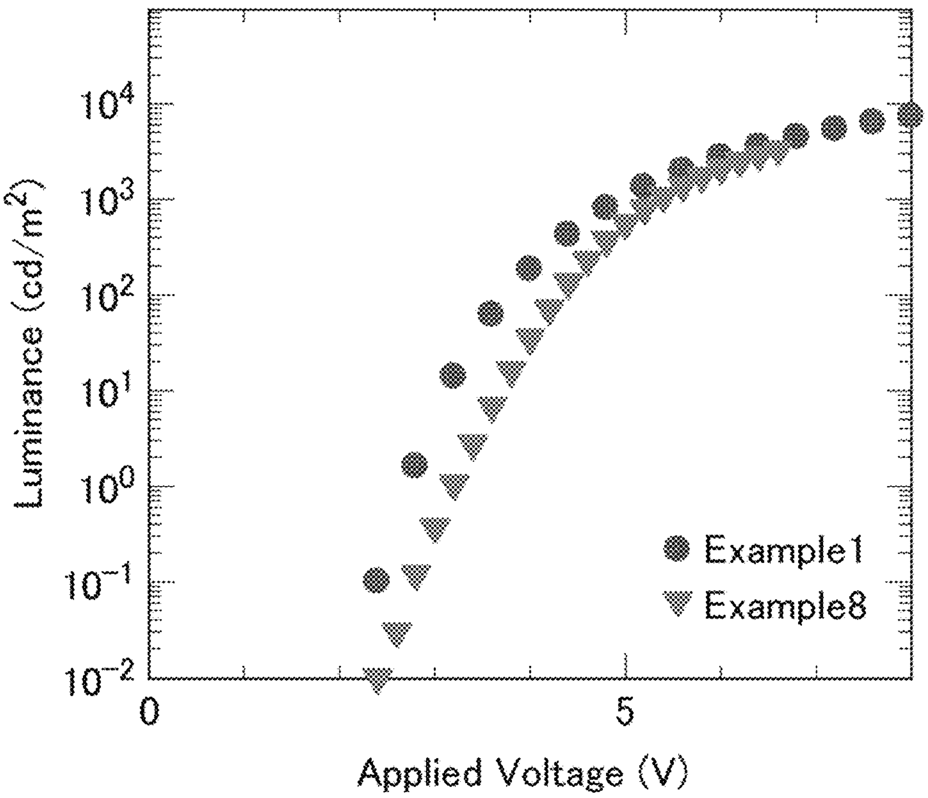
FIG. 25 is a graph of the relationship between the applied voltage and the luminance of organic EL devices produced in Examples 1 and 8.
Figure 26:
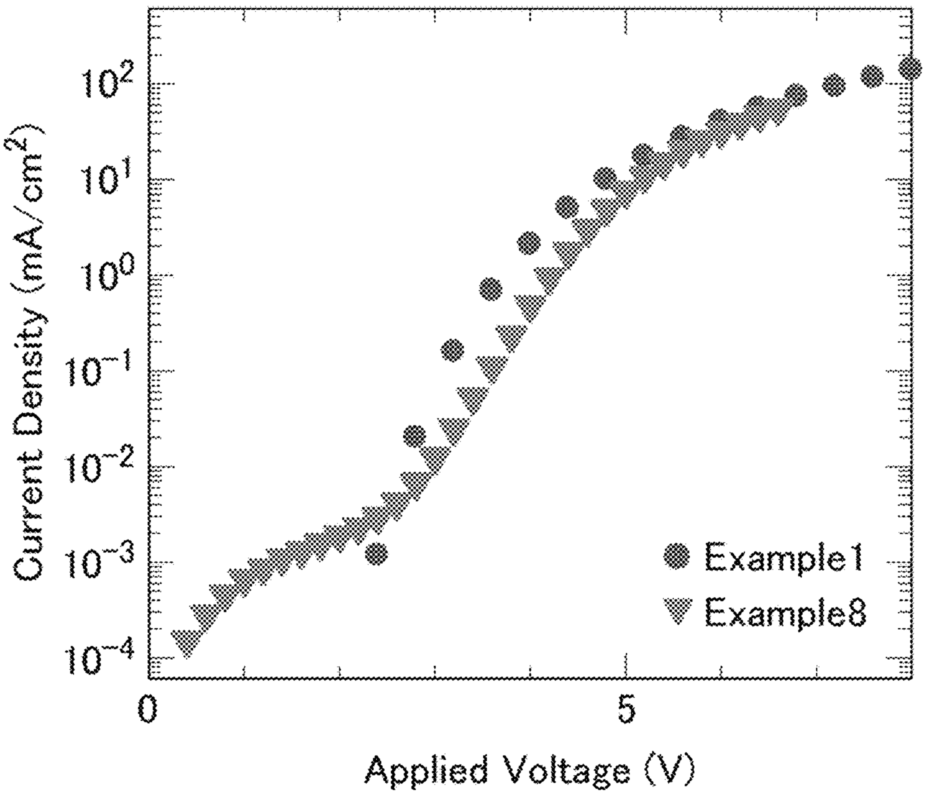
FIG. 26 is a graph of the relationship between the applied voltage and the current density of the organic EL devices produced in Examples 1 and 8.
Figure 27:
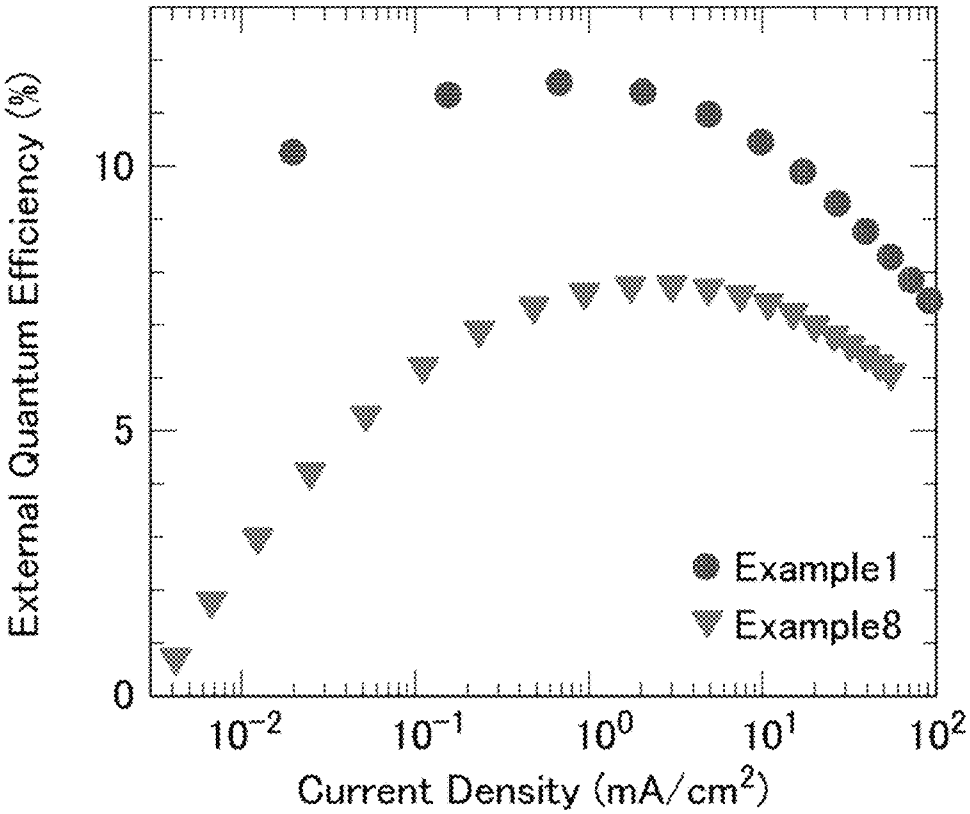
FIG. 27 is a graph of the relationship between the current density and the external quantum efficiency of the organic EL devices produced in Examples 1 and 8.

To the thus obtained device of Example 8 was applied a voltage using “2400 series SourceMeter” available from Keithley Instruments, and the luminance was measured using “LS-100” available from Konica Minolta, Inc. Thus, the relationship between the applied voltage and the luminance was determined. Also, the relationship between the applied voltage and the current density was examined. Further, the relationship between the current density and the external quantum efficiency was calculated based on the correlation between the luminance and the voltage and the current value. These results are compared with the results of Example 1. The results are shown in FIGS. 25 to 27. Further, the luminance of the device of Example 8 was measured while the device was continuously driven, and was compared with that of the device of Example 1. The results are shown in FIG. 28.

As demonstrated in FIGS. 25 to 27, comparison of Examples 1 and 8 shows that the device of Example 1 in which the layer closer to the oxide layer 4 in the electron injection layer is doped with the compound 1 has better properties than the device of Example 8. This results from interaction between phenanthroline and the oxide layer as reported in Non-Patent Literatures 10 and 11. Meanwhile, a remarkable decrease in driving voltage is observed even in the device of Example 8 not containing the compound 1 in the vicinity of the oxide layer 4 than in the device of Comparative Example 2. This is derived from that the phenanthroline derivative acts as an n-type dopant that generates a negative charge on a boron compound, improving the electron injection property and the electron transport property. Like Example 7, a remarkable decrease in driving voltage owing to the phenanthroline derivative is observed even in the device having a system in which no interaction with the substrate occurs. This indicates the validity of facilitation of electron injection due to the formation of hydrogen bonding proposed in the present invention.

Figure 28:
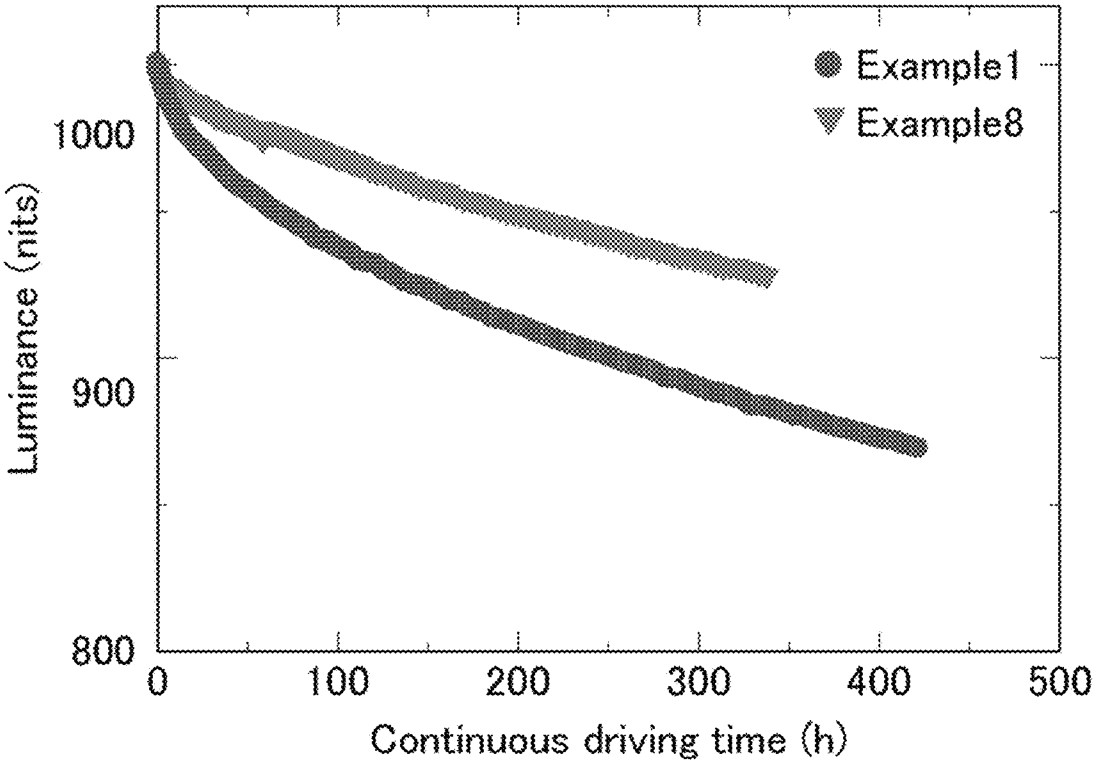
FIG. 28 is a graph of the relationship between the continuous driving time and the luminance of the organic EL devices produced in Examples 1 and 8.

FIG. 28 showing the luminance attenuation of the devices of Examples 1 and 8 continuously driven shows that the device of Example 8 in which interaction between the substrate and the phenanthroline derivative does not occur owing to the presence of polymer has a longer life time than the device of Example 1 in which interaction between the substrate and the phenanthroline derivative occurs. This result demonstrates that interaction between the substrate and the phenanthroline derivative impairs the stabilities of materials, and the device of Example 8 using hydrogen bonding is suitable for elongation of life time. Thus, a device having a long life time can be achieved even when a material other than the host material of a doped layer is used between an electrode (oxide) and the doped layer.

Examples 9 to 13 and Comparative Example 3

Next, in order to verify that the phenanthroline derivative alone can inject electrons, an organic thin film consisting of the first material as an electron injection layer 5 was formed on the oxide layer 4 in the following way. Organic EL devices of Examples 9 to 13 and Comparative Example 3 were produced using (Step 1) and (Step 2) up to the formation of the oxide layer 4, and (Step 4) and (Step 5) following the formation of the electron injection layer 5 in Example 1.

Example 9: The compound 3 was evaporated to a thickness of 10 nm by a vacuum evaporation method.

Example 10: The compound 2 was evaporated to a thickness of 10 nm by a vacuum evaporation method.

Example 11: The compound 1 was evaporated to a thickness of 10 nm by a vacuum evaporation method.

Example 12: The compound of the formula (15) was evaporated to a thickness of 10 nm by a vacuum evaporation method.

Example 13: The compound of the formula (15) was dissolved in cyclopentanone (concentration: 0.5% by weight) to prepare a coating composition. Next, the substrate 2 with the cathode 3 and the oxide layer 4 produced in (Step 2) was placed on a spin coater. Then, the substrate 2 was rotated at 3000 rpm for 30 seconds while the coating composition was dropped on the oxide layer 4. Thus, a coat was formed. Subsequently, the substrate 2 was annealed in a nitrogen atmosphere at 120° C. for two hours using an electric griddle to form the electron injection layer 5. The electron injection layer 5 had an average thickness of 10 nm.

Comparative Example 3: Lithium fluoride and the compound of the formula (14) were evaporated to a thickness of 1 nm and to a thickness of 10 nm, respectively, by a vacuum evaporation method.

Figure 29:
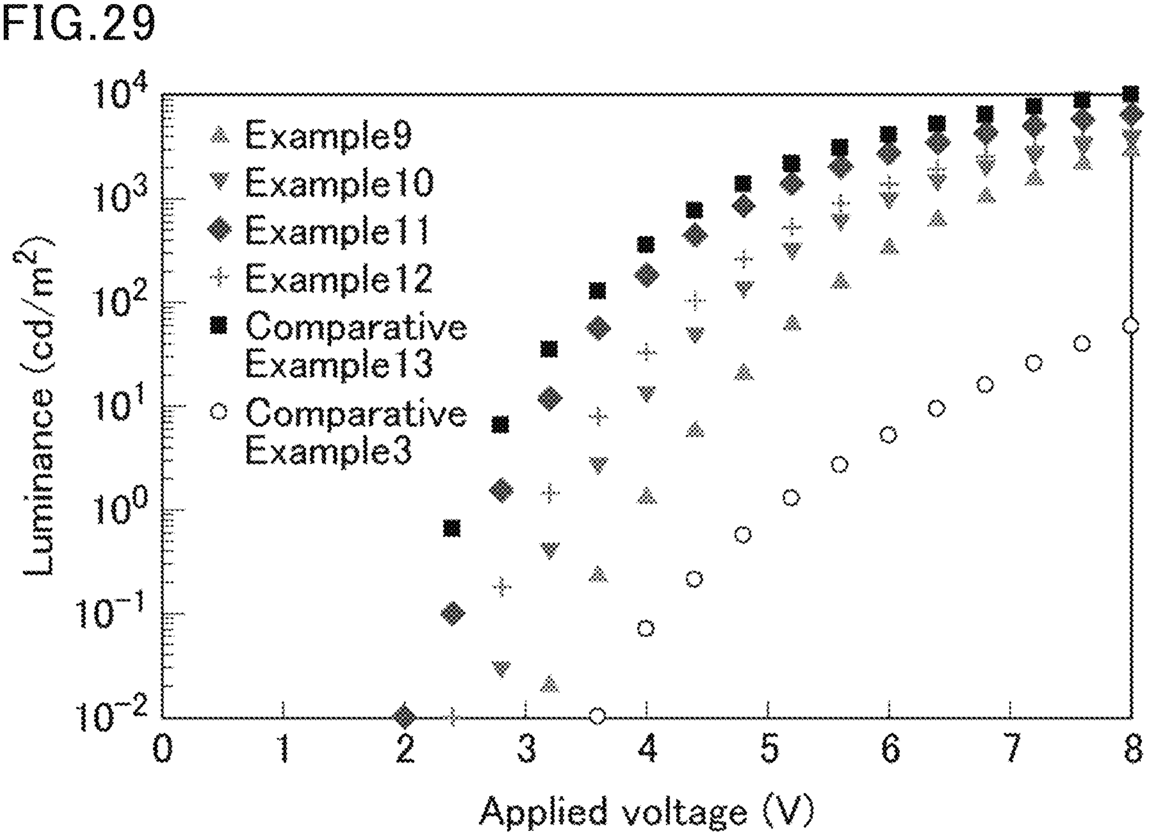
FIG. 29 is a graph of the relationship between the applied voltage and the luminance of organic EL devices produced in Examples 9 to 13 and Comparative Example 3.
Figure 30:
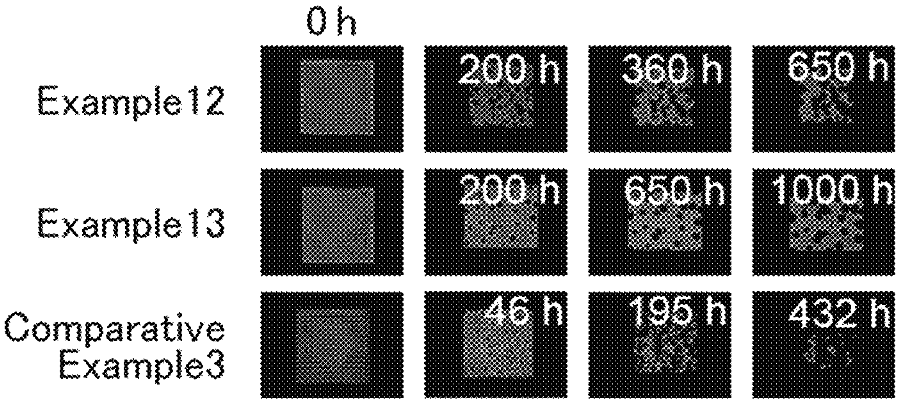
FIG. 30 shows microscopic images of light emitting surfaces of the organic EL devices of Examples 12 and 13 and Comparative Example 3 stored in the atmosphere without sealing.

To the thus obtained devices of Examples 9 to 13 and Comparative Example 13 was applied a voltage using "2400 series SourceMeter" available from Keithley Instruments, and the luminance was measured using "LS-100" available from Konica Minolta, Inc. Thus, the relationship between the applied voltage and the luminance was determined. The results are shown in FIG. 29. FIG. 30 shows microscopic images of light emitting surfaces of the devices of Examples 12 and 13 and Comparative Example 3 stored in the atmosphere without sealing.

The results shown in FIG. 29 demonstrate that the devices of Example 9 to 13 in which a phenanthroline derivative is used for the electron injection layer 5 achieve a higher luminance at a lower driving voltage than the device of Comparative Example 3 in which lithium fluoride and an electron transport material are used for the electron injection layer 5. This shows achievement of high electron injection properties even when a phenanthroline derivative alone is used for the electron injection layer. Comparison of the properties of the device of Example 12 and the properties of the device of Example 13 demonstrates that a better electron injection property can be obtained when the electron injection layer is formed by application. This is considered to result from that the oxide leaks out when the electron injection layer 5 is applied on the oxide, and the coordination number with phenanthroline increases as reported in Non-Patent Literature 12.

The results shown in FIG. 30 demonstrate that the devices of Examples 12 and 13 have a lower degradation rate of the light emitting surface in the presence of oxygen and moisture and a higher oxygen and moisture resistance than the device of Comparative Example 3 using lithium fluoride. This is considered to be owing to the advantage of an electron injection layer using a phenanthroline derivative that can inject electrons without using unstable alkali metals.

Examples 14 to 16 and Comparative Examples 4 to 6

A conventional organic EL device 2 illustrated in FIG. 5 was produced using the compound of the formula (15) and the commercially available compound 2 each as a phenanthroline derivative serving as the first material in the following way, and was evaluated.

(Step 1)

A commercially available transparent glass substrate having an average thickness of 0.7 mm with a 100-nm-thick electrode (anode 9) made of ITO with a pattern of 3 mm width was prepared as a substrate 2.

The substrate 2 with the anode 9 was ultrasonically cleaned in acetone and isopropanol each for 10 minutes and then boiled in isopropanol for five minutes. Thereafter, the substrate 2 with the anode 9 was taken out from isopropanol, dried by blowing nitrogen, and cleaned with UV ozone for 20 minutes.

(Step 2)

The substrate 2 with the anode 9 cleaned in (Step 1) was placed on a spin coater, and a 10-nm-thick film made of a hole injection material "Clevios HIL1.3N" available from Heraeus was formed as a hole injection layer 8. Thereafter, the substrate 2 was heated on an electric griddle at 180° C. for one hour.

(Step 3)

Next, the substrate 2 with the hole injection layer 8 and the previous layers was fixed to a substrate holder of a vacuum evaporation apparatus.

Also, 2,4-diphenyl-6-bis((12-phenylindolo) [2,3-a]carbazol-11-yl)-1,3,5-triazine (DIC-TRZ) of the following formula (26), fac-tris(3-methyl-2-phenylpyridinato-N,C2'-) iridium(III) ($Ir(mppy)_3$) of the following formula (27), N,N'-di(1-naphthyl)-N,N'-diphenyl-1,1'-biphenyl-4,4'-diamine (α-NPD) of the formula (22), N3,N3'''-bis(dibenzo[b,d]thiophen-4-yl)-N3,N3'''-diphenyl-[1,1':2',1'':2'',1'''-quaterphenyl]-3,3'''-diamine (4DBTP3Q) of the following formula (28), the compound of the formula (15) serving as the first material, the commercially available compound 2, any of the following various materials serving as the second material, and Al were separately put into alumina crucibles, which were set as evaporation sources.

[Chem. 26]

(26)

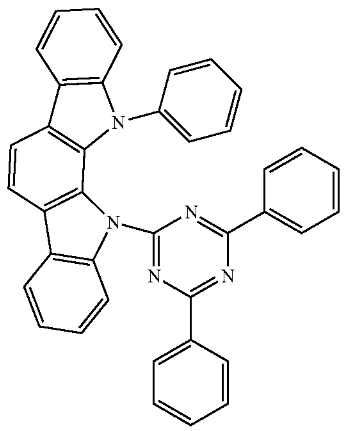

-continued (27)

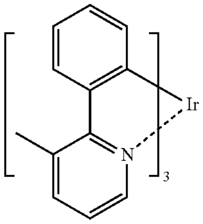

(28)

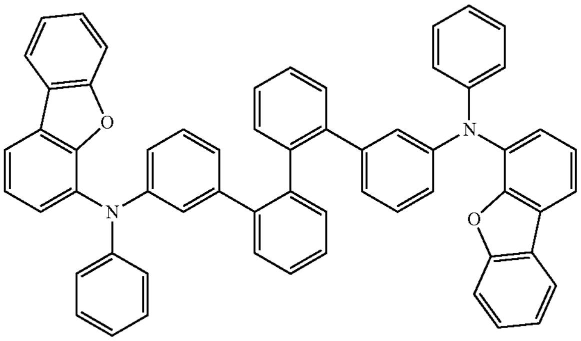

The compound of the following formula (14) as an exemplary boron-containing compound, a compound of the following formula (29) as an exemplary pyridine-containing compound, and a compound of the following formula (30) as an exemplary compound containing a carbonyl-containing heterocyclic ring (commercially available product) were each used as the second material.

[Chem. 27]

(29)

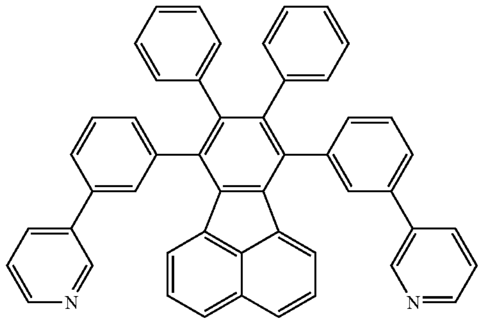

(30)

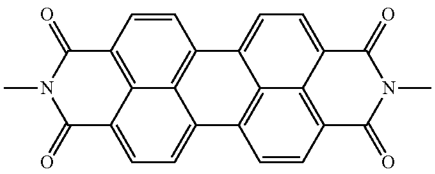

The pressure in the chamber of the vacuum evaporation apparatus was reduced to $1\times10^{-5}$ Pa. A hole transport layer 7, an emitting layer 6, an electron transport layer 10, an electron injection layer 5, and a cathode 3 were successively formed by a vacuum evaporation method involving resistance heating.

Specifically, first, the hole transport layer 7 with a thickness of 30 nm including 20-nm-thick α-NPD and 10-nm-thick 4DBTP3Q was formed.

Subsequently, the emitting layer 6 was formed by co-evaporating DIC-TRZ as a host and $Ir(mppy)_3$ as a dopant to a thickness of 25 nm. The doping concentration was controlled such that $Ir(mppy)_3$ would be 3% by mass relative to the entire emitting layer 6.

Next, the electron transport layer 10 with a thickness of 40 nm and the electron injection layer 5 with a thickness of 1 nm were formed on the substrate 2 with the emitting layer 6 and the previous layers.

Next, the cathode 3 with a thickness of 100 nm made of aluminum was formed by a vacuum evaporation method on the substrate 2 with the electron injection layer 5 and the previous layers. The cathode 3 was formed using a stainless steel evaporation mask to have a 3-mm-width-band-like evaporation area. The produced organic EL device had an emitting area of 9 $mm^2$.

The following describes the compounds used as the second material (electron transport layer) and the first material (electron injection layer) in the examples.

Example 14: the second material and the first material were respectively the compound of the formula (14) and the compound of the formula (15).

Example 15: the second material and the first material were respectively the compound of the formula (29) and the compound of the formula (15).

Example 16: the second material and the first material were respectively the compound of the formula (30) and the compound of the formula (15).

The following describes the compounds used as the second material (electron transport layer) and the first material (electron injection layer) in the comparative examples.

Comparative Example 4: the second material and the first material were respectively the compound of the formula (14) and lithium fluoride.

Comparative Example 5: the second material and the first material were respectively the compound of the formula (29) and lithium fluoride.

Comparative Example 6: the second material and the first material were respectively the compound of the formula (30) and lithium fluoride.

(Step 4)

Next, the substrate 2 with the cathode 3 and the previous layers was placed in a glass cap (sealing container) with a recessed space, and the container was filled with a sealing material made of an ultraviolet (UV) curable resin to seal the substrate. Thus, each organic EL device was obtained.

Figure 31:
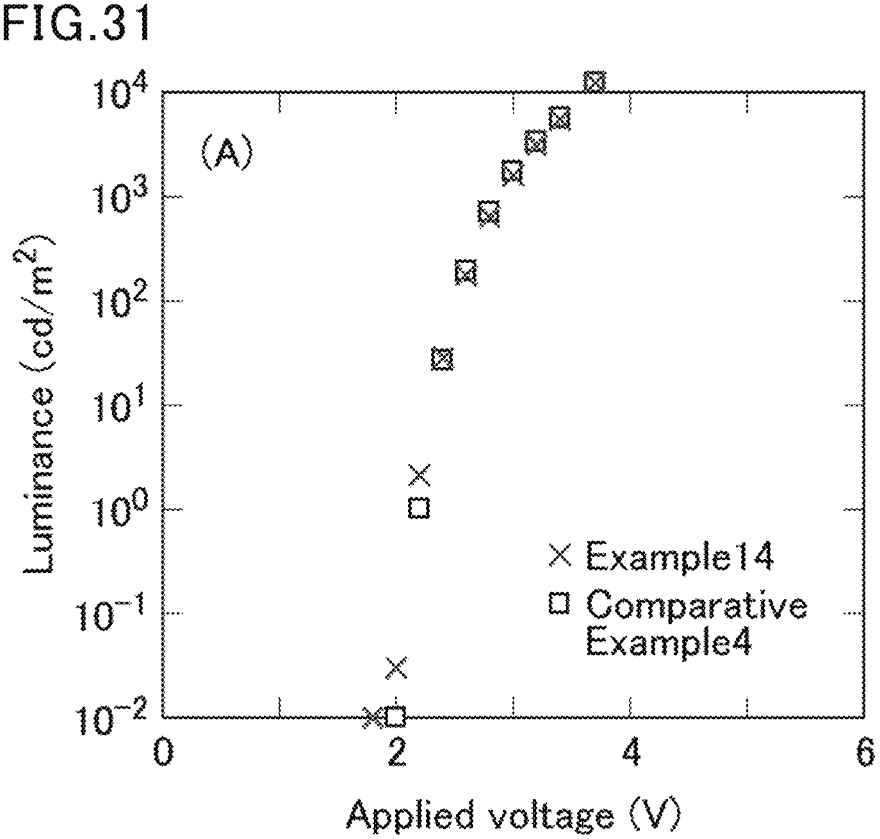
FIG. 31 is a graph of the relationship between the applied voltage and the luminance of organic EL devices produced in Example 14 and Comparative Example 4.
Figure 32:
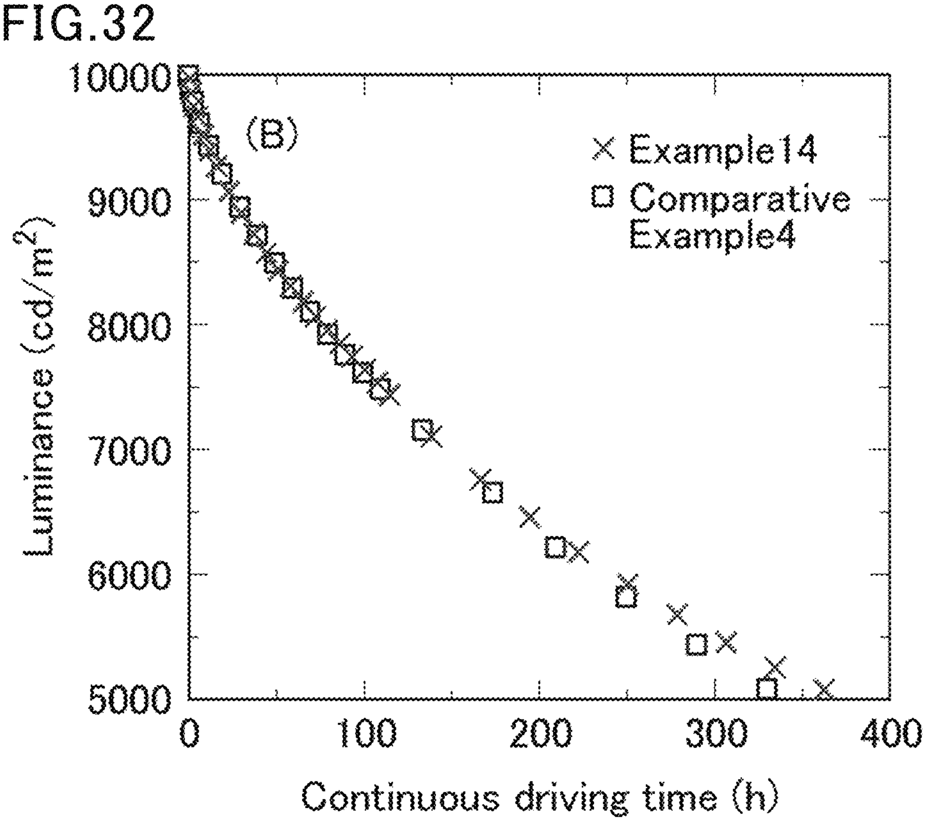
FIG. 32 is a graph of the relationship between the continuous driving time and the luminance of the organic EL devices produced in Example 14 and Comparative Example 4.
Figure 33:
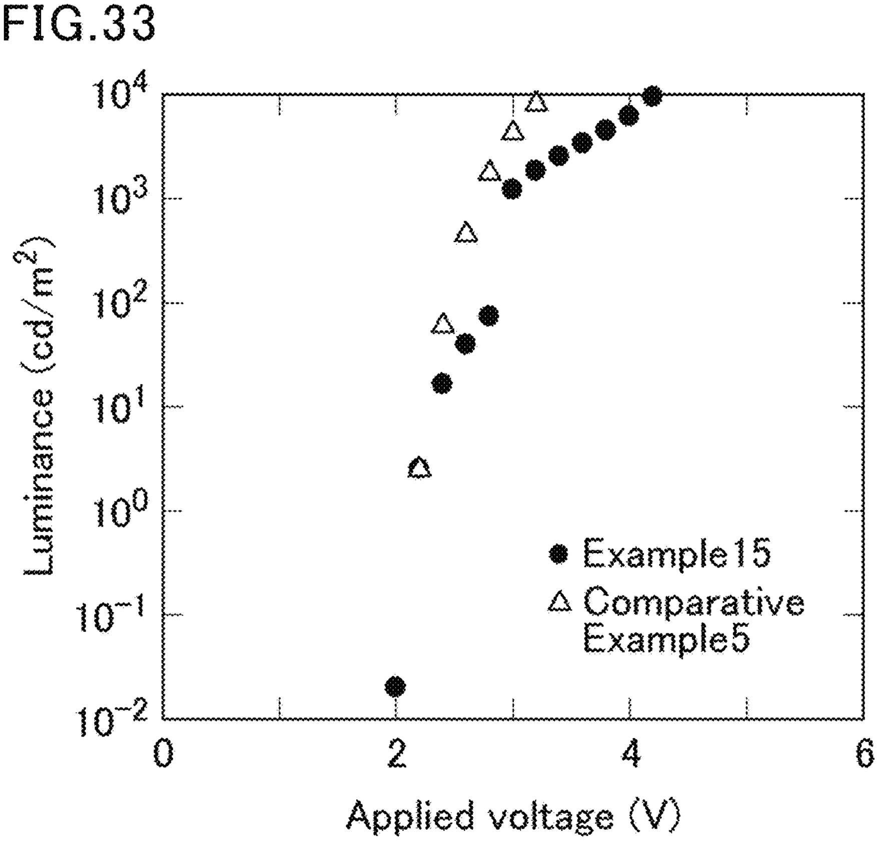
FIG. 33 is a graph of the relationship between the applied voltage and the luminance of organic EL devices produced in Example 15 and Comparative Example 5.
Figure 34:
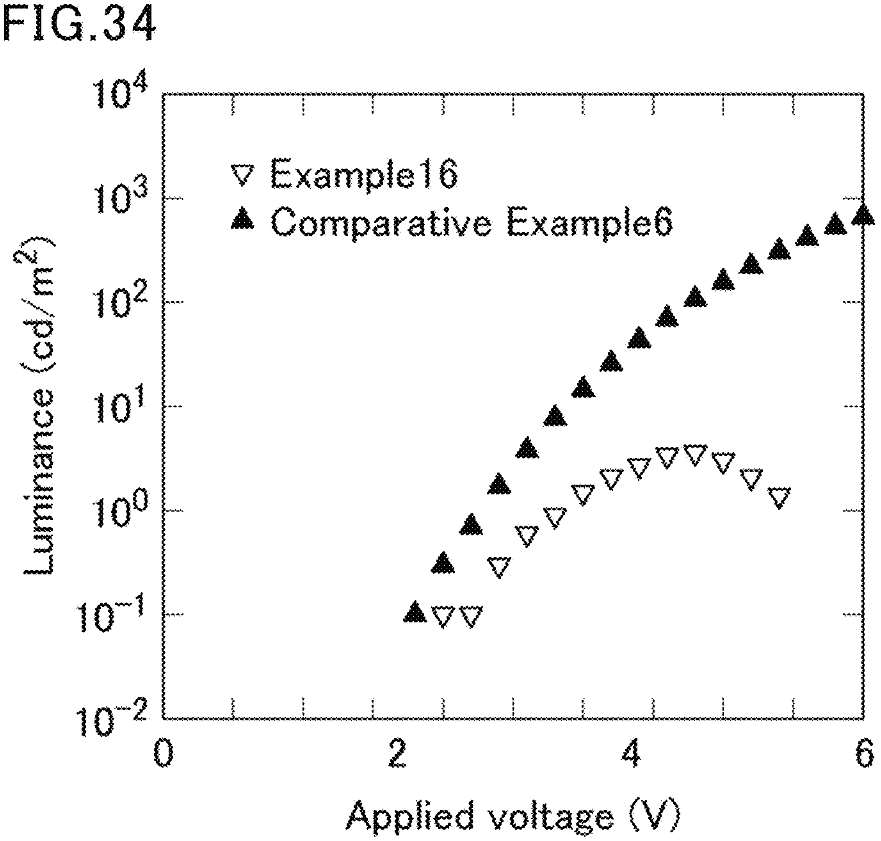
FIG. 34 is a graph of the relationship between the applied voltage and the luminance of organic EL devices produced in Example 16 and Comparative Example 6.

FIGS. 31, 33, and 34 show the results of the luminance-voltage characteristics of the devices of Examples 14 to 16 and Comparative Examples 4 to 6 measured by the same method as in the other examples and comparative examples. FIG. 32 shows the results of the luminance of the devices of Example 14 and Comparative Example 4 measured while the devices were continuously driven.

As for Example 14 in which the compound of the formula (14) is used, which exemplifies the case of using a boron-containing compound as the second material, FIG. 31 shows that the device of Example 14 in which the phenanthroline derivative of the formula (15) is used for the electron injection layer 8 has luminance-voltage characteristics equivalent to those of the device of Comparative Example 4 in which lithium fluoride is used for the electron injection layer 8. In a conventional organic EL device using the phenanthroline derivative of the formula (15), an electron injection property equivalent to that achieved by lithium fluoride can be obtained. FIG. 32 shows that the driving stability similar to the stability achieved by lithium fluoride can also be obtained. Thus, use of a phenanthroline derivative can achieve an organic EL device which can be driven with a low voltage and has excellent driving stability without using an alkali metal.

As for Example 15 in which the compound of the formula (29) is used, which exemplifies the case of using a pyridine-containing compound as the second material, FIG. 33 shows that the device of Example 15 in which the phenanthroline derivative of the formula (15) is used for the electron injection layer 8 has luminance-voltage characteristics equivalent to those of the device of Comparative Example 5 in which lithium fluoride is used for the electron injection layer 8.

Next, Example 16 in which the compound of the formula (30) is used is considered as an example of a compound containing a carbonyl-containing heterocyclic ring. Unlike FIGS. 31 and 33, FIG. 34 demonstrates that the device of Example 16 shows a higher luminance at a lower applied voltage than the device of Comparative Example 6 using LiF. This may reflect the excellent electron injection property of the phenanthroline derivative.

Examples 17 to 20 and Comparative Example 7

Conventional organic EL devices were produced and evaluated in the following way. The devices of Examples 17, 19, and 20 and Comparative Example 7 are organic EL devices each having the laminate structure illustrated in FIG. 6, and the device of Example 18 is an organic EL device having the laminate structure illustrated in FIG. 7.

(Step 1)

A commercially available transparent glass substrate having an average thickness of 0.7 mm with a 100-nm-thick electrode (anode 9) made of ITO with a pattern of 3 mm width was prepared as a substrate 2.

The substrate 2 with the anode 9 was ultrasonically cleaned in acetone and isopropanol each for 10 minutes and then boiled in isopropanol for five minutes. Thereafter, the substrate 2 with the anode 9 was taken out from isopropanol, dried by blowing nitrogen, and cleaned with UV ozone for 20 minutes.

(Step 2)

The substrate 2 with the anode 9 cleaned in (Step 1) was placed on a spin coater, and a 10-nm-thick film made of a hole injection material "Clevios HIL1.3N" available from Heraeus was formed as a hole injection layer 8. Thereafter, the substrate 2 was heated on an electric griddle at 180° C. for one hour.

(Step 3)

Next, the substrate 2 with the hole injection layer 8 and the previous layers was fixed to a substrate holder of a vacuum evaporation apparatus.

DIC-TRZ, $Ir(mppy)_3$, α-NPD, 4DBTP3Q, the compound of the formula (15) serving as the first material, lithium fluoride (LiF), and Al were separately put into alumina crucibles, which were set as evaporation sources.

The pressure in the chamber of the vacuum evaporation apparatus was reduced to $1\times10^{-5}$ Pa. A hole transport layer 7, an emitting layer 6, an electron transport layer 10, an electron injection layer 5, and a cathode 3 were successively formed by a vacuum evaporation method involving resistance heating.

Specifically, first, the hole transport layer 7 with a thickness of 30 nm including 20-nm-thick α-NPD and 10-nm-thick 4DBTP3Q was formed.

Subsequently, the emitting layer 6 was formed by co-evaporating DIC-TRZ as a host and $Ir(mppy)_3$ as a dopant to a thickness of 25 nm. The doping concentration was controlled such that $Ir(mppy)_3$ would be 3% by mass relative to the entire emitting layer 6.

Next, the electron transport layer 10 with a thickness of 40 nm made of DIC-TRZ and the electron injection layer 5 with a thickness of 1 nm were formed on the substrate 2 with the emitting layer 6 and the previous layers.

In Example 17, the electron injection layer 5 was made of the compound of the formula (15), and in Comparative Example 7, the electron injection layer 5 was made of LiF, which is a common electron injection material.

In Example 18, the hole transport layer 7 with a thickness of 30 nm was made of DIC-TRZ, and the other layers were made of the same materials as in Example 17.

In Example 19, the electron injection layer was made of the compound of the formula (19), and in Example 20, the electron injection layer was made of the compound of the formula (20), and the other layers were made of the same materials as in Example 17.

Figure 35:
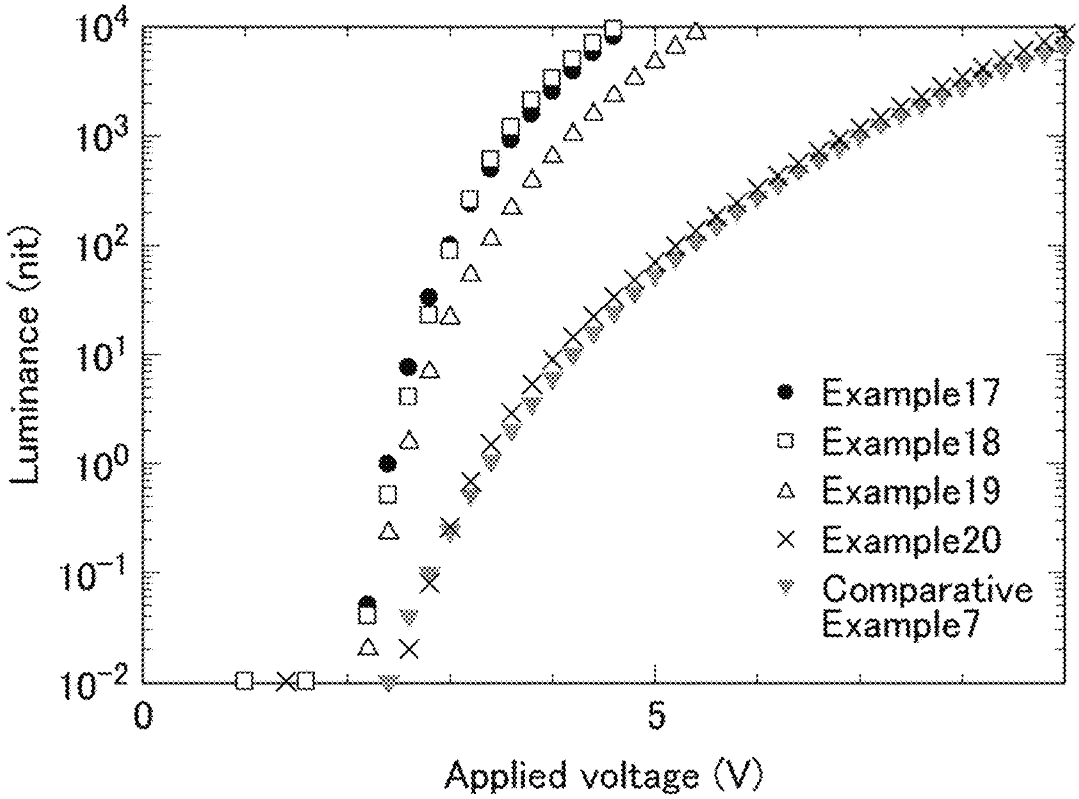
FIG. 35 is a graph of the relationship between the applied voltage and the luminance of organic EL devices produced in Examples 17 to 20 and Comparative Example 7.

FIG. 35 illustrates the results of the luminance-voltage characteristics of the devices of Examples 17 to 20 and Comparative Example 7 measured by the same method as in the other examples and comparative examples.

The devices of Examples 17, 19, and 20 in which a compound of the formula (1) in the present invention is used as an electron injection layer are driven with a driving voltage equal to or higher than the driving voltage for the device of Comparative Example 7 using LiF. This shows that the compound of the formula (1) in the present invention is effectively used as the electron injection layer. In the devices of Examples 17 and 19, electrons are particularly efficiently injected. This shows that the devices can be driven with a lower driving voltage than a device in which LiF is used for an electron injection layer. Also, the device of Example 18 in which the hole transport layer is made of DIC-TRZ which is the host of the emitting layer is driven with a voltage equivalent to that for the device of Example 17. Use of a material excellent in electron injection property enables simplification of the structure of the organic EL device and reduction of the number of materials to be used.

Example 21 and Comparative Example 8

The emitting layer of the device of Example 18 contains two materials, a host and a dopant. In order to demonstrate that even an organic EL device including an emitting layer consisting of a single material can achieve a simple structure illustrated in FIG. 7, devices of Example 21 and Comparative Example 8 were produced.

(Step 1)

A commercially available transparent glass substrate having an average thickness of 0.7 mm with a 100-nm-thick electrode (anode 9) made of ITO with a pattern of 3 mm width was prepared as a substrate 2.

The substrate 2 with the anode 9 was ultrasonically cleaned in acetone and isopropanol each for 10 minutes and then boiled in isopropanol for five minutes. Thereafter, the substrate 2 with the anode 9 was taken out from isopropanol, dried by blowing nitrogen, and cleaned with UV ozone for 20 minutes.

(Step 2)

Next, the substrate 2 was fixed to a substrate holder of a vacuum evaporation apparatus.

Fullerene for the hole injection layer 8, (9,10-bis(4-(9H-carbazol-9-yl)-2,6-dimethylphenyl)-9,10-diboraanthracene (CzDBA) of the following formula (31), the compound of the formula (15) serving as the first material, lithium quinoline, and Al were separately put into alumina crucibles, which were set as evaporation sources. Molybdenum trioxide for the hole injection layer 8 was put into a tungsten boat, which was set.

[Chem. 28]

(31)

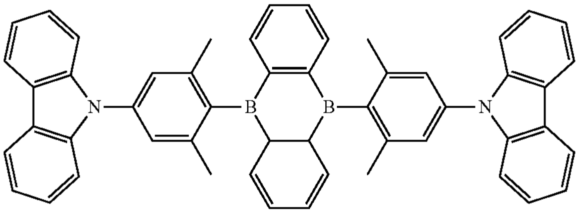

The pressure in the chamber of the vacuum evaporation apparatus was reduced to $1\times10^{-5}$ Pa, and each layer was evaporated by a vacuum evaporation method involving resistance heating. The hole injection layer 8 was formed by evaporating molybdenum trioxide and fullerene each to a thickness of 5 nm, a layer of a combination of a hole transport layer 7, an emitting layer 6, and an electron transport layer 10 was formed by evaporating only CzDBA to a thickness of 75 nm, followed by successive formation of a 1-nm-thick electron injection layer 5 and a cathode 3. In Example 21, the electron injection layer 5 was made of the compound of the formula (15), and in Comparative Example 8, the electron injection layer 5 was made of lithium quinoline, which is a common electron injection material.

Figure 36:
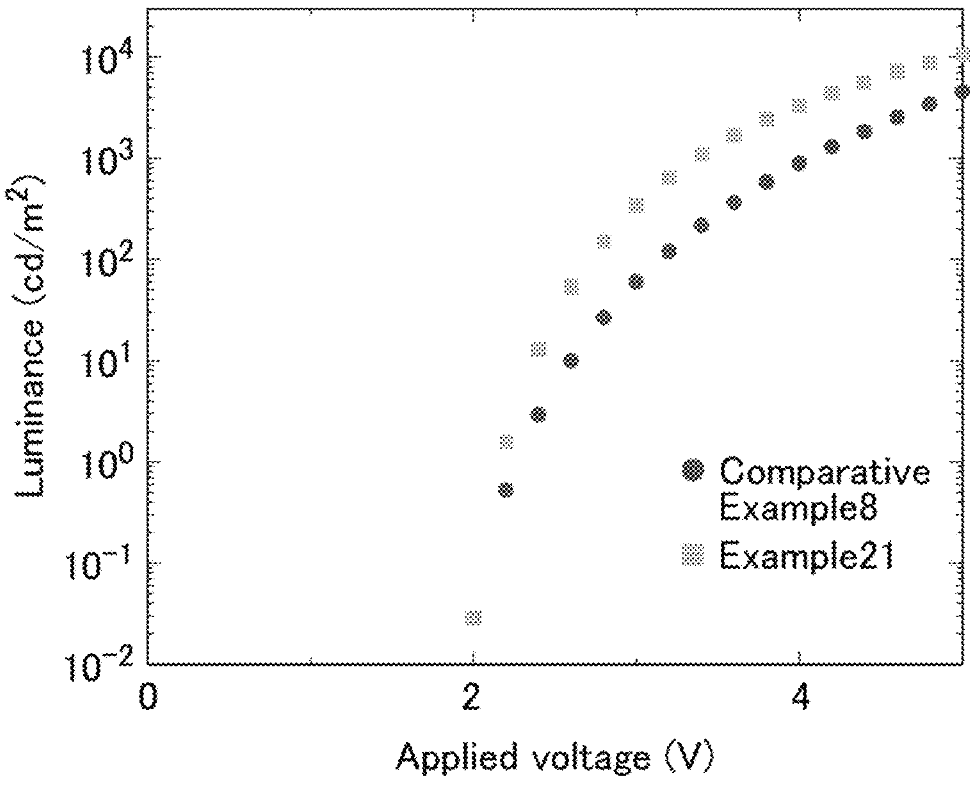
FIG. 36 is a graph of the relationship between the applied voltage and the luminance of organic EL devices produced in Example 21 and Comparative Example 8.

FIG. 36 illustrates the results of the luminance-voltage characteristics of the devices of Example 21 and Comparative Example 18 measured by the same method as in the other examples and comparative examples.

The device of Comparative Example 8 is driven with a high voltage because electrons are hardly injected from lithium quinoline to CzDBA, whereas the device of Example 21 can be driven with a low voltage because electrons can be injected efficiently. Use of a material excellent in electron injection property enables simplification of the structure of the organic EL device and reduction of the number of materials to be used.

REFERENCE SIGNS LIST

1: organic EL device, 2: substrate, 3: cathode, 4: oxide layer, 5: electron injection layer, 6: emitting layer, 7: hole transport layer, 8: hole injection layer, 9: anode, 10: electron transport layer.

The invention claimed is:

1. An organic thin film, which is a single film containing a first material that is a compound having a structure of the following formula and a second material that transports electrons

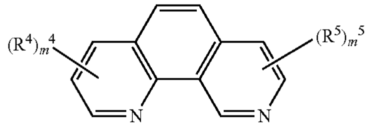

wherein $R^4$ and $R^5$ are the same as or different from each other and are each at least one selected from the group consisting of a dialkylamino group and an alkoxy group, and $m^4$ and $m^5$ are the same as or different from each other and are each a number of 1 or 2, or a laminate film including a film containing the first material and a film containing the second material.

2. A laminate film comprising:

an oxide layer; and a layer of the organic thin film according to claim 1 disposed on the oxide layer.

3. An organic electroluminescence device comprising:

a cathode;

an anode;

an emitting layer between the cathode and the anode; and the organic thin film according to claim 1 between the cathode and the emitting layer.

4. The organic electroluminescence device according to claim 3, further comprising:

an inorganic oxide layer between the cathode and the organic thin film.

5. The organic electroluminescence device according to claim 3, comprising:

a laminate film including the film containing the first material and the second material and the film containing the second material between the cathode and the emitting layer.

6. The organic electroluminescence device according to claim 5, wherein the layer containing the second material is present between the emitting layer and the film containing the first material and the second material.

7. The organic electroluminescence device according to claim 5, wherein the layer containing the second material is present between the cathode and the film containing the first material and the second material.

8. The organic electroluminescence device according to claim 3, wherein the layer containing the second material is present between the anode and the emitting layer.

9. The organic electroluminescence device according to claim 3, wherein the emitting layer contains the second material.

10. A display device, comprising:

the organic electroluminescence device according to claim 3.

11. A lighting system, comprising:

the organic electroluminescence device according to claim 3.

12. An organic thin film solar cell, comprising:

the organic thin film according to claim 1.

13. A photoelectric transducer, comprising:

the organic thin film according to claim 1.

14. A thin film transistor, comprising:

the organic thin film according to claim 1.

* * * * *